(12) United States Patent
Miyazaki et al.

(10) Patent No.: US 6,355,500 B2
(45) Date of Patent: Mar. 12, 2002

(54) SEMICONDUCTOR DEVICE AND MANUFACTURING METHOD THEREOF

(75) Inventors: Chuichi Miyazaki, Akishima; Yukiharu Akiyama, Koganei; Masanori Shibamoto, Urawa; Tomoaki Kudaishi, Kodaira; Ichiro Anjoh, Koganei; Kunihiko Nishi; Asao Nishimura, both of Kokubunji; Hideki Tanaka, Sagamihara; Ryosuke Kimoto, Hamura; Kunihiro Tsubosaki, Hino; Akio Hasebe, Higashimurayama, all of (JP)

(73) Assignee: Hitachi. Ltd., Tokyo (JP)

( * ) Notice: Subject to any disclaimer, the term of this patent is extended or adjusted under 35 U.S.C. 154(b) by 0 days.

(21) Appl. No.: 09/768,451

(22) Filed: Jan. 25, 2001

Related U.S. Application Data

(62) Division of application No. 09/449,834, filed on Nov. 26, 1999, which is a continuation of application No. 08/822,933, filed on Mar. 21, 1997, now abandoned.

(30) Foreign Application Priority Data

Mar. 22, 1996  (JP) ................................................ 8-66637

(51) Int. Cl.[7] ........................ H01L 21/44; H01L 21/50; H01L 21/48
(52) U.S. Cl. ........................ 438/106; 438/118
(58) Field of Search ................................ 438/106, 118

(56) References Cited

U.S. PATENT DOCUMENTS

| | | | |
|---|---|---|---|
| 4,246,595 A | 1/1981 | Noyori et al. ............... 257/723 |
| 5,148,265 A | 9/1992 | Khandros et al. ............. 357/80 |
| 5,148,266 A | 9/1992 | Khandros et al. ............. 357/80 |
| 5,258,330 A | 11/1993 | Khandros et al. ........... 437/209 |
| 5,346,861 A | 9/1994 | Khandros et al. ........... 437/209 |
| 5,347,159 A | 9/1994 | Khandros et al. ........... 257/692 |
| 5,398,863 A | 3/1995 | Grube et al. ................. 228/106 |
| 5,448,114 A | 9/1995 | Kondoh et al. ............... 257/778 |
| 5,602,059 A | 2/1997 | Horiuchi et al. ............ 437/209 |
| 5,679,977 A | 10/1997 | Khandros et al. ........... 257/692 |
| 5,682,061 A | 10/1997 | Khandros et al. ........... 257/666 |
| 5,685,885 A | 11/1997 | Khandros et al. ............. 29/841 |
| 5,706,174 A | 1/1998 | DiStefano et al. .......... 361/749 |
| 5,757,078 A | 5/1998 | Matsuda et al. ............. 257/737 |
| 5,777,391 A | 7/1998 | Nakamura et al. .......... 257/778 |
| 5,801,446 A | 9/1998 | DiStefano et al. .......... 257/778 |
| 6,114,192 A * | 9/2000 | Tsunoda et al. | |

FOREIGN PATENT DOCUMENTS

| | | |
|---|---|---|
| JP | 6-181236 | 12/1992 |
| JP | 6-504408 | 5/1994 |
| JP | 7-321244 | 12/1995 |
| JP | 8-78574 | 3/1996 |
| JP | 8-070082 | 3/1996 |
| JP | 9-181209 | 7/1997 |
| JP | 9-246417 | 9/1997 |

OTHER PUBLICATIONS

"Electronic Material", Apr. 1, 1995 (Heisei 7), Susumu Honda, pp. 28–28.
"Nikkei Microdevice", Feb. 1, 1995, by Nikkei BPCO, pp. 96–97.
"Nikkei Microdevice", May 1, 1994, pp. 98–102.

* cited by examiner

Primary Examiner—John F. Niebling
Assistant Examiner—Josetta I. Jones
(74) Attorney, Agent, or Firm—Antonelli, Terry, Stout & Kraus, LLP

(57) ABSTRACT

A ball grid array type semiconductor package includes a semiconductor chip formed with bonding pads, an elastomer bonded to the semiconductor chip, a flexible wiring substrate bonded to the elastomer and formed with wirings connected at one end of the bonding pads of the semiconductor chip, a solder resist formed on the main surface of the flexible wiring substrate and solder bump electrodes connected to the other ends of the wirings. The elastomer is bonded to the flexible wiring substrate on the side of the tape, the solder resist is formed on the side of the wirings, and the solder bump electrodes are connected with the wirings by way of through holes formed in the solder resist.

15 Claims, 43 Drawing Sheets

PORTION A

FIG. 53

| LEAD SIZE SYMBOL | | L1 | L2 | b1 | b2 | h | α |
|---|---|---|---|---|---|---|---|
| MEANING OF SYMBOL | | TAPER LENGTH | WIRING LENGTH | TAPER WIDTH | LEAD WIDTH | LEAD THICKNESS | BENDING STRESS RATIO |
| UNIT | | μm | μm | μm | μm | μm | |
| TECHNIQUE STUDIED | ① | 100 | 280 | 60 | 38 | 18 | 1 |
| | ② | 80 | 280 | 60 | 38 | 18 | 1.02 |
| EMBODIMENT | ① | 100 | 380 | 65 | 38 | 18 | 1.13 |
| | ② | 80 | 380 | 60 | 38 | 18 | 1.26 |
| | ③ | 100 | 380 | 65 | 38 | 18 | 1.25 |
| | ④ | 100 | 430 | 65 | 38 | 18 | 1.26 |
| | ⑤ | 100 | 480 | 70 | 38 | 18 | 1.31 |
| | | | | | | | 1.46 |

SEMICONDUCTOR DEVICE AND MANUFACTURING METHOD THEREOF

This is a division of U.S. Ser. No. 09/449,834, filed Nov. 26, 1999, which, in turn, is a continuation of U.S. Ser. No. 08/822,933, filed Mar. 21, 1997 now abn., and the disclosures of which are incorporated herein by reference.

BACKGROUND OF THE INVENTION

The present invention concerns a semiconductor integrated circuit device technique and, more in particular, it relates to a useful technique to be applied to portable equipment, such as portable telephones and handy type personal computers, for which there is a strong trend toward reducing the size, the weight and the thickness of the product.

Recently, a trend toward reducing the size, the weight and the thickness of the product has become vigorous for electronic equipment along with an improved function and performance. This is largely due to a rapid increase in the use of personal equipment, such as personal telephones or handy type personal computers in recent years. Further, man-machine interface functions have been increased in personally manipulated equipment, for which easy handlability and operability have been considered increasingly important. It is considered that the trend will become more and more conspicuous in expected regular multimedia areas.

Under such circumstances, development for increasing the density and the degree of integration of semiconductor chips has progressed continuously, however the size and the number of electrodes of the semiconductor chips have increased, while the size of the packages have also increased rapidly. Accordingly, narrowing of the pitch of terminal leads has been promoted for facilitating the size reduction of the packages, which makes mounting of the package more difficult.

In view of the above, it has been proposed in recent years to provide high density packages with super-multiple pins having the same area as that of the semiconductor chips, and such packaging techniques are mentioned, for example, in various publications, such as "Nikkei Microdevice" p 98–p 102, issued on May 1, 1994, "Nikkei Microdevice" p 96–p 97, issued on Feb. 1, 1995 by Nikkei BPCO and "Electronic Material", p 22–p 28, issued on Apr. 1, 1995 (Heisei 7) by Kogyo Chosakai. One example of the structures produced with such packaging techniques, for example, as described in FIG. 6 of the "Electronic Material" publication, has a package structure in which a flexible wiring substrate is disposed by way of an elastomer (elastic material) on the surface of a semiconductor chip, leads on one end of wirings of the flexible wiring substrate are electrically connected with bonding pads on the surface of the semiconductor chip, and bump lands on the other end of the wirings of the flexible wiring substrate are electrically connected with the solder bumps.

The package structure has an outer size about equal to or greater than that of a semiconductor chip by the size of a protection frame optionally attached to the periphery of the chip, for which a flexible wiring substrate formed with solder bumps is used. The wiring pattern of the wiring substrate is made of a Cu foil having a Au plating on one side, the top ends of which to be connected with the pad of the chip constitute a lead pattern which is only composed of Au as a result of etching the Cu foil. In this structure, the flexible wiring substrate is bonded by an elastomer on the surface of the semiconductor chip and then the Au leads are connected with the bonding pads of the semiconductor chip.

SUMMARY OF THE INVENTION

In a study made by the present inventor of the package structure as described above, the following problems were recognized. For example, since the flexible wiring substrate in the package structure described above has a structure typically represented by a TCP (Tape Carrier Package) in which a Cu wiring pattern is formed on the surface of a polyimide tape, and an elastomer is formed to the wiring substrate on the side of the wiring surface, it is difficult to mount the elastomer uniformly and stably because of unevenness of the wiring pattern on the flexible wiring substrate. That is, there exist such problems that voids not filled with the elastomer are formed near both sides of the protrusions of the wiring pattern upon coating or appending the elastomer on the flexible wiring substrate, and the step of bonding the semiconductor chip can not be conducted stably since the size and the shape of the elastomer are not stable.

Further, bump electrodes are formed on the wiring substrate on the side of the tape. That is, a bump electrode is connected with the wirings by way of a through hole formed in the tape. Since the thickness of the tape is relatively large, for example, as much as 50 $\mu$m, if the pitch between the bump electrodes is smaller than the thickness of the tape, the aspect ratio of the through hole is increased to bring about a concern that the bump electrode and the wiring will not be connected. Accordingly, there is a concern that an increase in the number of pins of the package may be restricted.

In view of the above, an object of the present invention is to provide a semiconductor integrated circuit device capable of mounting an elastic structural material to a wiring substrate stably with a high accuracy and making the bonding step of a semiconductor chip stable, thereby enabling assembling with a high yield.

Another object of the present invention is to provide a technique for promoting an increase in the number of pins in a package.

An object of the present invention is to provide a semiconductor integrated circuit device capable of obtaining excellent electrical properties in view of noise resistance by the adoption of a multiple wiring layer structure.

An object of the present invention is to prevent wiring from becoming contaminated ingredients of an elastic structural material.

An object of the present invention is to prevent a semiconductor chip from being damaged, improve the reliability of the semiconductor chip, as well as prevent connection failure between an elastic structural material and the semiconductor chip, worsening of the flatness of the wiring substrate and lowering of reliability.

An object of the present invention is to eliminate a requirement for a soft-modified special wire bonder and to effect a shortening of the contact time upon bonding by further simplifying the trace of the bonding tool.

An object of the present invention is to solve a problem concerning disconnection of wirings.

An object of the present invention is to reduce any damage to a passivation layer or a semiconductor chip therebelow and further improve the bondability by preventing contamination of the wirings.

An object of the present invention is to increase the bonding strength between wirings and a substrate material and obtain a stable notch cutting performance.

An object of the present invention is to suppress warp of a wiring substrate and improve bondability with a bonding material, so as to constitute a package of excellent moisture proofness and reliability.

An object of the present invention is to improve the groove-fillage capability of an elastic structural material, capable of increasing the strength of a metal mask, by using a plurality of one side bridging portions, and further improving the groove-fillage capability by the formation of a stopping dam for sealant flow.

An object of the present invention is to improve the bondability and prevent damage to a semiconductor chip in an inner lead bonding technique.

An object of the present invention is to form a suitable S-shaped configuration with no return of a bonding tool but by merely driving the bonding tool vertically using a wiring design which takes into consideration a bending stress ratio.

An object of the present invention is to reduce the occurrence of cracks in wirings per se and moderate bonding damage to a semiconductor chip.

An object of the present invention is to suppress bleeding of low molecular weight ingredients of an elastic structural material and further avoid a disadvantage involving the creation of voids upon forming the elastic structural material by surface flattening.

An object of the present invention is to improve the fabrication accuracy for hole diameter for connection of a bump electrode in a method of manufacturing a semiconductor integrated circuit.

An object of the present invention is to provide a technique for forming a semiconductor package which is capable of bonding bump electrodes more satisfactorily, reducing the pitch of the bump electrodes and which provides output terminals at a higher density in a method of manufacturing a semiconductor integrated circuit device.

These and other objects, as well as novel features of the present invention will become apparent by consideration of the descriptions in the specification with reference to the accompanying drawings.

Among the features disclosed in the present application, a summary of typical examples will be explained simply as follows.

That is, one of the semiconductor integrated circuit devices according to the present invention provides a package structure applied to a semiconductor integrated circuit device in which a wiring substrate is disposed by way of an elastic structural material on a main surface of a semiconductor chip, lead portions on one end of the wirings of the wiring substrate are electrically connected with external terminals on the main surface of the semiconductor chip, and land portions on the other end of the wirings of the wiring substrate are electrically connected with bump electrodes, wherein the wiring substrate has wirings formed on the main surface of a substrate base material (tape), and an elastic structural material is disposed opposite to the main surface of the substrate base material.

Further, the bump electrodes are formed on the side of the wirings.

Further, the bump electrodes are connected with the wirings each by way of a through hole disposed in an insulation film formed on the wirings and having a thickness smaller than that of the wiring base material.

Further, the external terminals of the semiconductor chip are disposed at a central portion or at an outer circumferential portion of the semiconductor chip, and the bump electrodes connected to the external terminals of the semiconductor chip by way of the wirings of the wiring substrate are disposed to the inside, outside or in both regions inside and outside with respect to the outer circumference of the semiconductor chip.

Further, in a semiconductor integrated circuit device of the present invention, the size of the end of the elastic structural member of the semiconductor chip on the side of the externals terminal and the end of the substrate base material of the wiring substrate is determined based on the ingredients of the elastic structural material.

Further, in a semiconductor integrated circuit device of the present invention, a distance M2 between the end of the substrate base material of the wiring substrate and the end of the elastic structural material on the outer circumferential side of the semiconductor integrated circuit device, and a distance M1 between the end of the semiconductor chip and the end of the substrate base material are determined within a range capable of satisfying the relationship:

$$M1 > M2 > 0$$

Further, in a semiconductor integrated circuit device of the present invention, the wirings of the wiring substrate are formed to such a shape that a portion fixed with the substrate base material of the wiring substrate and a top end portion connected to the external terminals of the semiconductor chip are displaced at least by more than the width of the wirings.

Further, in a semiconductor integrated circuit device of the present invention, the wirings of the wiring substrate are formed as a cantilever structure fixed at one side to the substrate base material of the wiring substrate.

Further, in a semiconductor integrated circuit device of the present invention, the size of the end of an opening in a surface protection film on the semiconductor chip is determined within such a range that the wirings do not interfere with the surface protection film at least on the side thereof on which a bonding tool is driven down.

Further, in a semiconductor integrated circuit device of the present invention, the wirings of the wiring substrate are formed such that an effective area of a wiring portion of the wiring on the side of the notch terminal end is made larger. Particularly, the wiring portion on the side of the notch terminal end is connected with an opposed land portion of the wirings, or is extended longitudinally or laterally in a vacant region of the wirings, or adjacent wirings are connected with each other.

Further, in a semiconductor integrated circuit device of the present invention, the elastic structural material is formed within a range greater over the entire circumference at least by more than the width of a protrusion at the outer circumferential portion formed in the elastic structural material.

Further, in a semiconductor integrated circuit device of the present invention, when the elastic structural material is formed in two parts so as not to be bonded on the external terminals of the semiconductor chip, each of the ends of spaces to which the divided elastic structural materials are opposed is formed in a groove-shape. Particularly, a plurality of grooves are formed at each of the ends of the elastic structural material, or a stepping dam for sealant flow is previously formed during a sealing step.

Further, in a semiconductor integrated circuit device of the present invention, the connection structure between the external terminals of the semiconductor chip and the wirings of the wiring substrate are formed by previously forming stud bumps on the external terminals of the semiconductor chip, and the external terminals of the semiconductor chip and the wirings of the wiring substrate are connected by way of the stud bumps.

Further, in a semiconductor integrated circuit device of the present invention, the connection structure between the external terminals of the semiconductor chip and the wiring substrate is formed by previously supplying solder so as to surround the wirings of the wiring substrate and the external terminals of the semiconductor chip, and the external terminals of the semiconductor chip are connected by way of the solder.

Further, in a semiconductor integrated circuit device of the present invention, the connection structure between the external terminal of the semiconductor chip and the wirings of the semiconductor substrate are formed by connecting the wirings of the wiring substrate and the external terminals of the semiconductor chip by way of stud bumps by using stud bumps of solder or Au ball so as to surround the wirings of the wiring substrate from above.

Further, in a semiconductor integrated circuit device of the present invention, the connection structure between the external terminals of the semiconductor chip and the wirings of the wiring substrate are formed by connecting the wirings of the wiring substrate and the external terminals of the semiconductor chip by using Al, solder or Au wire.

Further, in a semiconductor integrated circuit device of the present invention, the wiring structure of the wiring substrate is formed by narrowing the lateral size of the wirings from the end of the substrate base material of the wiring substrate to the top end of the wirings, such that the bending stress ratio a is represented by:

$$\alpha = \sigma1/\sigma0$$

where $\sigma0$ is bending strength caused at the end of the substrate base material and $\sigma1$ is maximum stress caused at an intermediate portion between the end of the substrate base material and the top end of the wirings, and wherein the lateral size is made constant particularly from a predetermined position, and the size and the shape of the wirings are determined such that the bending stress ratio a is from 1.2 to 1.5 in a case where the bending stress ratio α is represented by the following formula:

$$\alpha = b1 \times (L2-L1)/(b2 \times L2)$$

in which L1 is a taper length, L2 is a wiring length, b1 is a taper width and b2 is a wiring width.

Further, in a semiconductor integrated circuit device of the present invention, the wiring structure of the wiring substrate is formed by using an electroconductive material as a core material and applying Au plating on the surface.

Further, the wiring structure of the wiring substrate is formed by using Cu as a core material, applying Au plating on the surface and making at least one end connected with the external electrodes of the chip into a S-shaped configuration.

Further, in a semiconductor integrated circuit device of the present invention, a flattening insulation film is formed on the wiring substrate on the side of the wirings and an elastic structural material is disposed on the insulation film.

Further, a method of manufacturing a semiconductor integrated circuit device according to the present invention comprises a step of forming an elastic structural material on the rear face of a wiring substrate (tape side) in which wirings are formed on the substrate base material (tape), a step of bonding a semiconductor chip to the surface of the elastic structural material so as to oppose the wiring substrate, a step of connecting one end of the wirings to the external terminals of the semiconductor chip, a step of forming an insulation film thinner than the substrate base material on a main surface of the wirings, a step of forming openings to the insulation film each at a position corresponding to the other end of the wirings to be joined with the bump electrodes, and a step of forming the bump electrodes being joined to the other end of the wirings by way of the wirings.

BRIEF DESCRIPTION OF THE DRAWINGS

FIG. 53 is chart illustrating a relationship between a lead size and a bending stress ratio, of a semiconductor integrated circuit device in the Embodiment 1 according to the present invention;

DESCRIPTION OF THE PREFERRED EMBODIMENTS

The present invention will be described more specifically by way of preferred embodiments with reference to the drawings.

Embodiment 1

Figure 1:
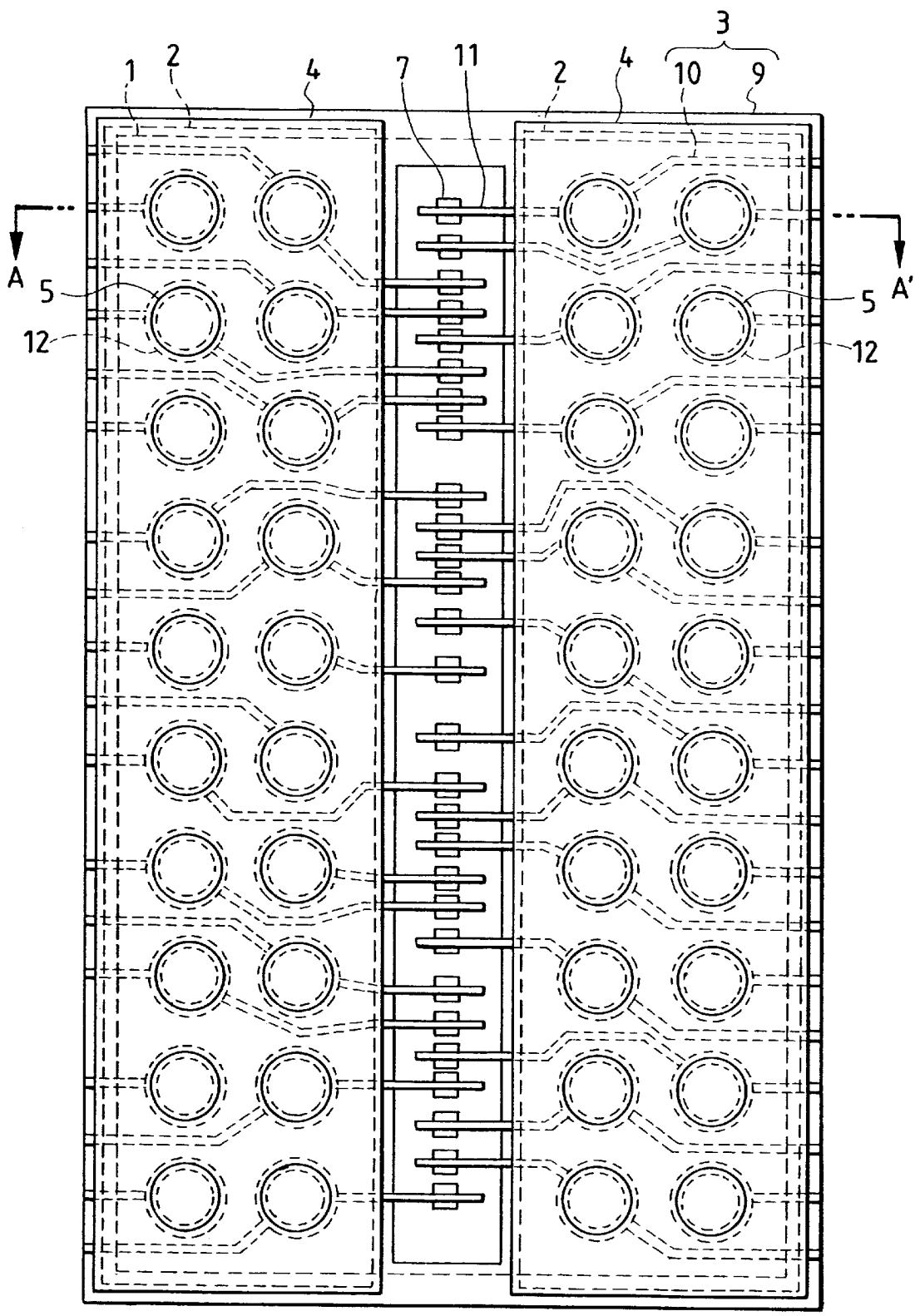
FIG. 1 is a plan view illustrating a semiconductor integrated circuit device which represents an Embodiment 1 of the present invention.
Figure 2:
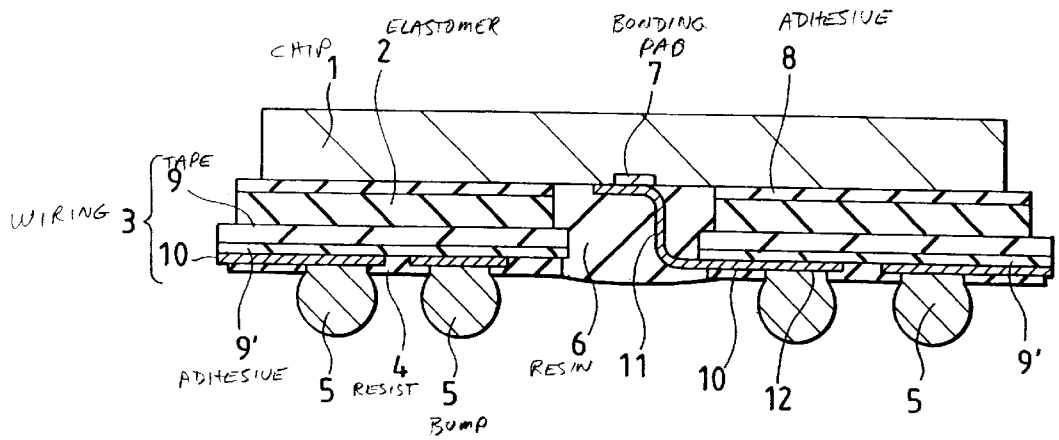
FIG. 2 is a cross sectional view taken along line A–A' in FIG. 1 of the Embodiment 1 according to the present invention.
Figure 3:
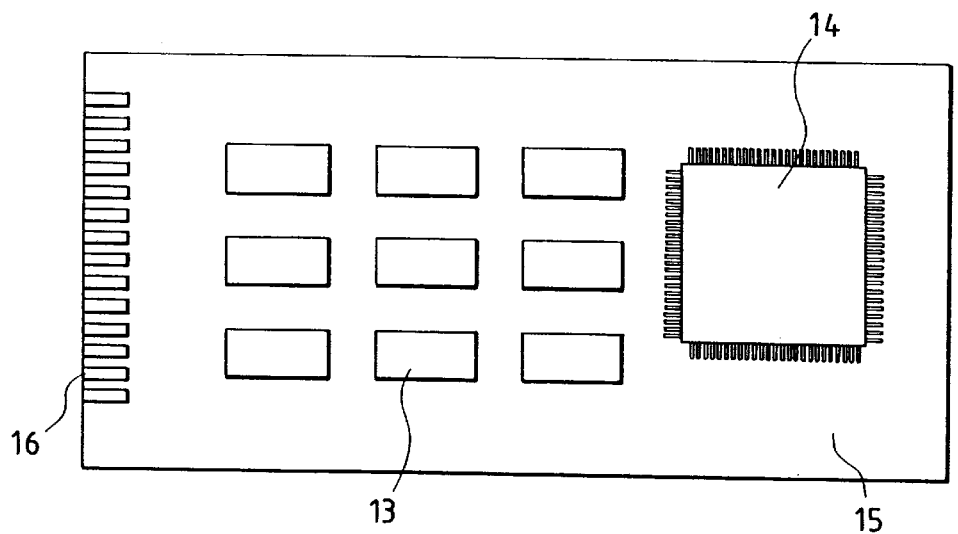
FIG. 3 is a plan view illustrating the state of mounting the semiconductor integrated circuit device in the Embodiment 1 according to the present invention to a mounting substrate.
Figure 4:
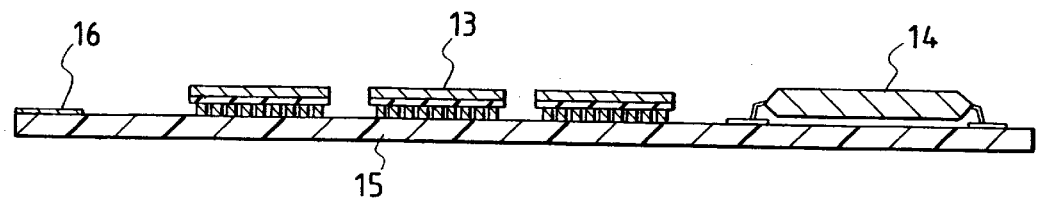
FIG. 4 is a cross sectional view illustrating the state of mounting the semiconductor integrated circuit device in the Embodiment 1 according to the present invention to a mounting substrate.
Figure 5:
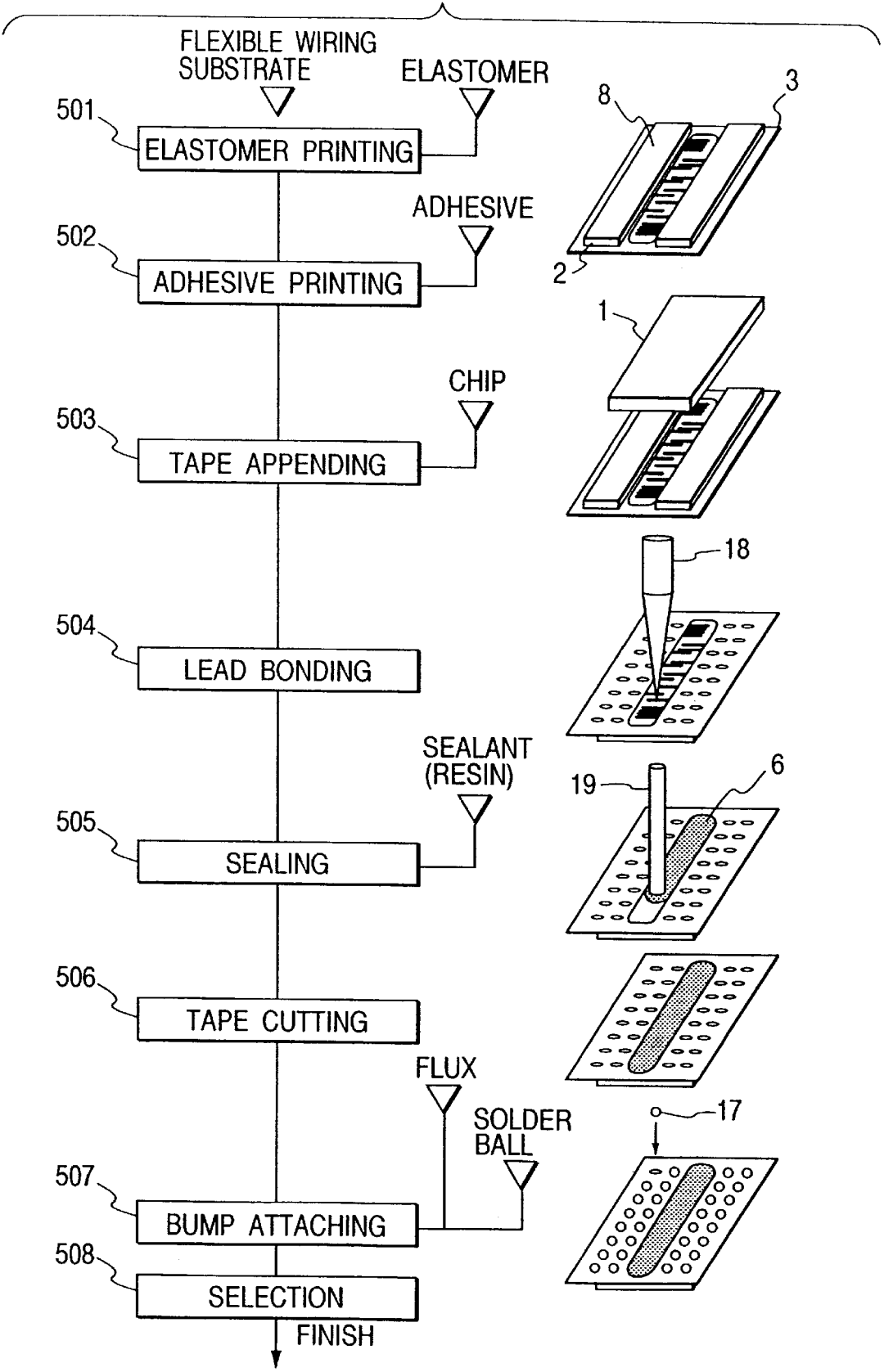
FIG. 5 is a flow chart illustrating the steps of assembling the semiconductor integrated circuit device in the Embodiment 1 according to the present invention.

FIG. 1 is a plan view illustrating a semiconductor integrated circuit device representing an Embodiment 1 according to the present invention, FIG. 2 is a cross sectional view taken along line A–A' in FIG. 1, FIG. 3 and FIG. 4 are a plan view and a cross sectional view illustrating a state of mounting a semiconductor integrated circuit device to a mounting substrate, FIG. 5 is a flow chart illustrating a step of assembling a semiconductor integrated circuit device, and FIG. 6 to FIG. 58 and FIG. 76 to FIG. 81 are views for comparative explanation between the feature of the semiconductor integrated circuit device representing the Embodiment 1 of the present invention and a semiconductor integrated circuit device representing a comparative example studied by the present inventor. At first, an explanation will be given as to the constitution of a semiconductor integrated circuit device of an Embodiment 1 with reference to FIG. 1 and FIG. 2.

The semiconductor integrated circuit device representing Embodiment 1 of the present invention is in the form of a 40 pin ball grid array type semiconductor package, comprising a semiconductor chip 1 having a plurality of semiconductor elements and a plurality of bonding pads formed on a main surface, and an elastomer 2 (elastic structural material) bonded on the main surface of the semiconductor chip excepting for the portions forming the bonding pads, a flexible wiring substrate 3 (wiring substrate) formed with wirings connected at one end to the bonding pads of the semiconductor chip 1, a solder resist 4 (insulation film) formed on a main surface of the flexible wiring substrate 3, and bumps 5 (bump electrodes) formed on a main surface of the solder resist 4 and connected to the other end of the wirings by way of openings in the solder resist 4, to constitute a package structure in which the bonding portion of the semiconductor chip 1 is covered by a sealant 6, such as a resin.

The semiconductor chip 1 has, for example, a center pad structure as shown in FIG. 1 in which a plurality of bonding pads 7 (external terminals) are formed in one row at a central portion in the longitudinal direction, and the bonding pads are arranged at non-uniform intervals. Predetermined integrated circuits, such as memory circuits and logic circuits, are formed in the semiconductor chip 1, for example, on a semiconductor substrate, such as made of silicon, and the bonding pads 7 made of a material such as Al are disposed as the external terminals for such circuits.

The elastomer 2 is made of an elastic material, for example, a silicone resin, which is formed on the main surface of the semiconductor chip 1, being bisected longitudinally of the chip 1 to provide the portion formed with the bonding pads 7, and is bonded to the main surface of the chip 1 by way of the adhesive 8. The elastomer 2 is provided for moderating stress concentration on the soldering bumps 5 mainly caused by the difference in the heat expansion coefficients of the semiconductor chip 1 and the package mounting substrate.

The flexible wiring substrate 3 comprises, for example, as shown in FIG. 2, a tape 9 as a basic material of the flexible wiring substrate 3 (substrate base material) and wirings 10 bonded on the main surface of the tape 9 by an adhesive 9', in which leads 11 on one end of the wirings 10 are connected to the bonding pads 7 of the semiconductor chip 1, and bump lands 12 on the other end are connected with the soldering bumps 5. In the flexible wiring substrate 3, the rear face of the tape 9 (on the side opposite to the surface formed with the wirings 10) is bonded to the elastomer 2, and the solder resist 4 is formed on the main surface of the wirings 10.

The tape 9 constituting the flexible wiring substrate 3 is made of a material, for example, a polyimide resin, and a material such as Cu is used as the core material for the wiring 10. A portion of the lead 11 serving as one end of the wiring 10 is formed with an Ni plating layer so as to cover the surface of the core material, and an Au plating layer is formed further so as to cover the surface of the Ni plating layer.

The solder resist 4 is made of an insulation material, such as a light sensitive epoxy resin, and the solder bumps 5 are formed on the main surface of the wirings 10 of the flexible wiring substrate 3 by way of the openings in the solder resist 4 for a predetermined range of the wirings 10, except for the connection portion connected to the bump lands.

The soldering bumps 5 are made of a material, for example, a Pb(60%)—Sn(40%) solder or an alloyed solder mainly composed of Pb—Sn, and is connected to the bump lands 12 of the wirings 10 constituting the flexible wiring substrate 3. The solder bumps 5 are arranged in two rows in the regions on both side of the bonding pads 7 of the semiconductor chip 1.

The thus constituted semiconductor integrated circuit device is mounted, for example, as shown in FIG. 3 and FIG. 4, as a semiconductor integrated circuit device of a chip size package 13, for example, a DRAM, together with a semiconductor integrated circuit device of QFP type package 14, onto a mounting substrate 15, which is made, for example, of glass or epoxy, on a memory card and can be retractably mounted with respect to portable equipment, such as a portable telephone or a handy type personal computer by way of external connection terminals 16.

For the function of the Embodiment 1 of the present invention, an outline of the steps of assembling the semiconductor package will be explained on the basis of the process flow shown in FIG. 5.

At first, before assembling the semiconductor package, wirings 10 are formed on the tape 9, the flexible wiring substrates having the leads 11 formed by etching a portion of the wirings 10. Further, the elastomer 2, the semiconductor chip 1 formed with predetermined integrated circuits and provided with the bonding pads 7 as external terminals, the sealant 6, and flux and solder forming the solder balls 17 are provided.

The flexible wiring substrate 3 can be prepared, for example, as typically represented by the technique of a TAB (Tape Automatic Bonding) tape, by bonding a thin metal foil such as Cu on a tape 9 made of a polyimide resin by means of an adhesive, forming a required pattern by photoresist on the metal foil using a photographic technique, then forming a desired wiring pattern 10 by etching (including also leads 11) and, further, applying Ni—Au plating treatment to the surface thereof, for example, by an electric field plating method.

Then, for example, the elastomer 2 is formed by printing to a thickness of 50 to 150 μm on the tape 9 of the flexible wiring substrate 3, and a silicone type adhesive 8 is coated and printed on the surface of the elastomer 2 (steps 501, 502). The elastomer 2 is not always printed, but an elastomer previously formed into a film-shape may be cut into a predetermined shape and bonded to the rear face of the tape 9 by means of the adhesive 8.

Further, the leads 11 at one end of the wirings 10 of the flexible wiring substrate 3 and the bonding pads 7 of the semiconductor chip 1 are aligned such that their relative positions coincide with each other, and the semiconductor chip 1 is appended by adhesion to the elastomer 2 printed on the tape 9 of the flexible wiring substrate 3 (step 503).

Then, the semiconductor chip 1 and the tape 9 of the flexible wiring substrate 3 in a state appended by way of the elastomer 2 are turned upside down in the lead bonding step, the lead 11 is driven down on the bonding pad 7 of the semiconductor chip 1 while being deformed into a S-shaped configuration by a bonding tool 18, as shown by the cross section in FIG. 2, and the lead 11 and the bonding pad 7 are connected, for example, by a method of supersonic thermal press bonding (step 504).

Successively, in the sealing step, the lead bonding portion of the bonding pad 7 of the semiconductor chip 1 and the lead 11 of the flexible wiring substrate 3 are resin encapsulated, for example, by coating a sealant 6, such as an epoxy resin, from a dispenser 19 to thereby enhance the reliability at the junction portion between the semiconductor chip 1 and the flexible wiring substrate 3 (step 505).

Subsequently, in the cutting step for the flexible wiring substrate 3, the outer edge portion of the tape 9 is cut along a position somewhat outside the edge of the semiconductor chip 1, to form a package outer shape of CSP (Chip Size Package or Chip Scale Package) (step 506).

Then, in the bump attaching step of the solder bump 5, the bump 5 is formed by joining a solder ball 17 to the corresponding bump land 12 of the wirings 10 of the flexible wiring substrate 3 to form the bump 5 and, finally, by way of the selection and marking, the step of assembling the semiconductor package in the Embodiment 1 according to the present invention is finished (step 507, 508).

In the step of assembling the semiconductor package, the order of the tape cutting step (step 506) and the bump attaching step (step 507) may be reversed.

Thus, the Embodiment 1 has a semiconductor package structure in which bonding pads 7 are arranged concentrically in one row along a central portion of the semiconductor chip 1, and the solder bumps 5 are disposed at the inside of the outer circumference of the semiconductor chip 1 connected by way of the wirings 10 of the flexible wiring substrate from the bonding pads 7.

Now, the feature of the package structure for the semiconductor integrated circuit device of the Embodiment 1 will be explained by comparison with a package structure formed by a technique studied by the present inventor including the structure and the process with reference to FIG. 6 to FIG. 58 successively.

1. Surface Wiring Structure (a structure in which the elastomer is formed on the wiring substrate on the side of the tape and the bump electrodes are formed on the side of the wirings)

Figure 6:
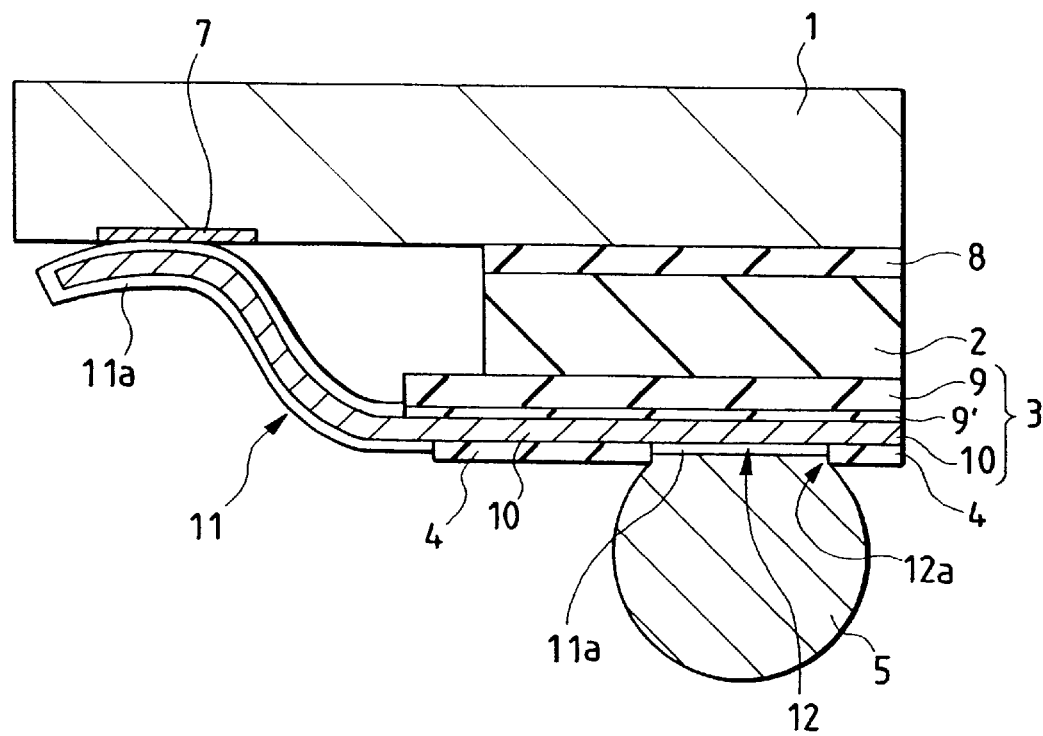
FIG. 6 is a cross sectional view of a main portion of the semiconductor integrated circuit device in the Embodiment 1 according to the present invention.
Figure 7:
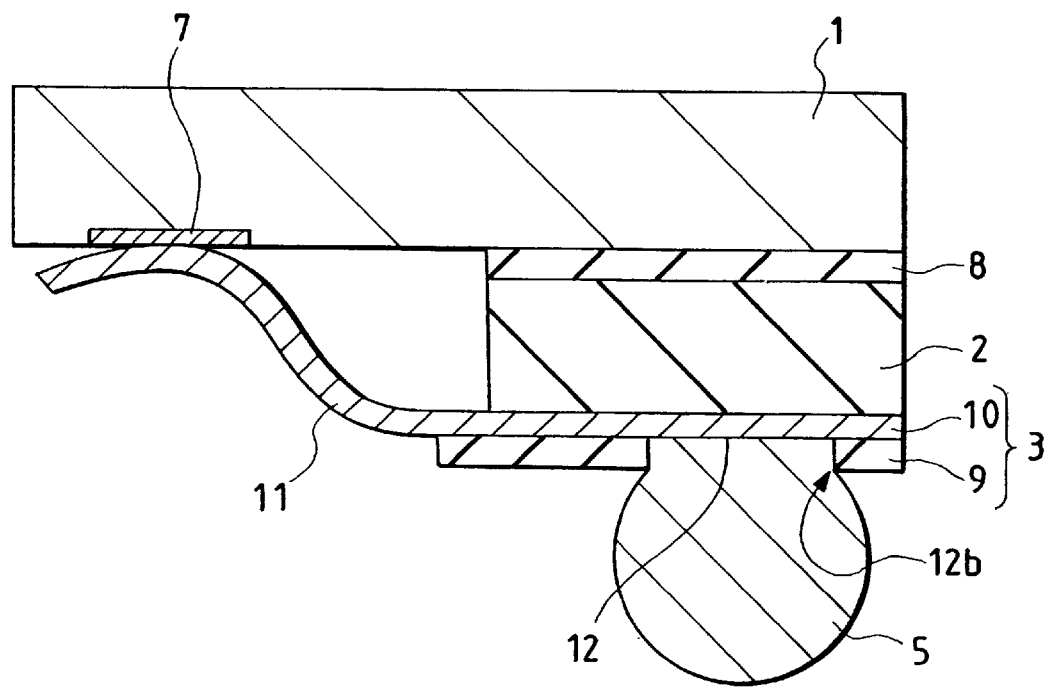
FIG. 7 is a cross sectional view of a main portion for comparative explanation of the semiconductor integrated circuit device of the Embodiment 1 according to the present invention and a semiconductor integrated circuit device studied by the present inventor.
Figure 8:
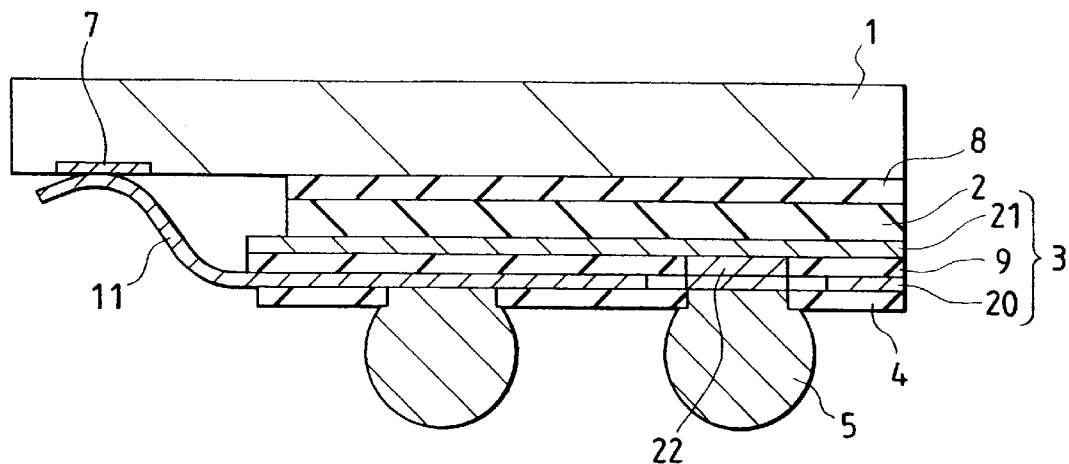
FIG. 8 is a cross sectional view of a main portion illustrating both face wirings as a modified embodiment of a semiconductor integrated circuit device in the Embodiment 1 according to the present invention.

To assist in providing technical explanation of the surface wiring structure, FIG. 6 is a cross sectional view of a main portion illustrating the surface wiring structure, FIG. 7 is a cross sectional view of a main portion illustrating the rear face wiring structure (a structure in which bump electrodes are formed to the wiring substrate on the side of the tape and the elastomer is formed on the side of the wirings) and FIG. 8 is a cross sectional view of a main portion illustrating wirings on both surfaces.

The package structure of the Embodiment 1 is a so-called "surface wiring structure" as shown in an enlarged scale in FIG. 6, in which an elastomer 2 is bonded to a flexible wiring substrate 3 on one side of a tape 9 (on the side facing the semiconductor chip 1) and a solder resist 4 and a bump electrode 5 are formed on the other side of the wirings 10. On the other hand, there is a technique studied by the present inventor which may be referred to as a so-called "rear face wiring structure", as shown in FIG. 7, in which an elastomer 2 is bonded on one side of the wiring 10 and a solder bump 5 is formed on the other side of the tape 9. In FIG. 6, an Au plating 11a is formed, for example, by an electric field plating on the surface of a lead 11 on one end and on the surface of a land 12 on the other end of the wiring 10.

In the rear face wiring structure described above with reference to FIG. 7, a through hole 12b for joining the bump 5 is formed, for example, by punching out an opening in the tape 9, which is made of a material such as a polyimide resin, whereas in the surface wiring structure of the Embodiment 1, as seen in FIG. 6, a solder resist 4 made of a material such as a light sensitive epoxy resin is coated on the main surface of the wiring 10, and a connection hole 12a of a desired size is formed at a desired position by a photographic process, such as exposure and development, so that the following advantages can be expected.

(1) Since the opening for the solder bump 5 is formed by exposure and development of the solder resist 4, the fabrication accuracy for the hole diameter can be improved compared with a case of puncturing an opening in the tape 9 of the flexible wiring substrate 3 in the rear face wiring structure by machining.

(2) While the minimum thickness of the tape 9, in practice, is about 50 $\mu$m, the solder resist 4 can be coated to a thickness of about 10 to 20 $\mu$m stably depending on the coating condition, so that a smaller solder ball 17 can be joined satisfactorily.

For example, in a case of forming a solder bump of about 30 $\mu$m diameter, which is less than the thickness of the tape 9, the aspect ratio of the through hole is excessively large in the rear face wiring structure, thereby possibly resulting in a connection failure. On the other hand, the aspect ratio can be lowered to cope with such a problem in the surface wiring structure.

(3) Since the pitch of the solder bumps 5 can be made smaller in the surface wiring structure as compared with the rear face wiring structure, a semiconductor package having output terminals for the solder bumps arranged with a higher density can be obtained.

(4) Since an elastomer 2 is disposed on the flat surface at the back of the tape 9, the elastomer 2 can be mounted (coated or appended) in a voidless manner stably with a high accuracy. Further, since the size and the shape of the elastomer 2 are stabilized, the step of bonding the semiconductor chip 1 is also stable, thereby making it possible to conduct assembling at a higher yield.

As described above, the technique of forming the rear face wiring structure results in problems, such as in the formation of the opening in the tape 9 of the flexible wiring substrate 3 and in the bondability between the wirings 10 of the flexible wiring substrate 3 and the elastomer 2, whereas such problems can be solved by adopting the surface wiring structure as provided in the Embodiment 1.

Further, in the wiring structure of the flexible wiring substrate 3, it is possible to use a flexible wiring substrate 3 having a double face wiring structure, for example, as shown in FIG. 8, that is, having layered wirings on both surfaces of the tape 9, in addition to the single face wiring structure as shown in FIG. 6, and it can be applied further to three or more layered wiring structures.

In the example of FIG. 8, a first wiring 20 is used as a signal wiring while the second wiring 21 is used as a ground plane, in which the second wiring 21 and the bump 5 or the first wiring 20 are electrically connected by way of a via hole 22. Such a structure has the advantage of obtaining an excellent electric characteristic, for example, from the point of view of noise resistance.

2. Optimization of Tape Edge Position Relative to Elastomer

Figure 9:
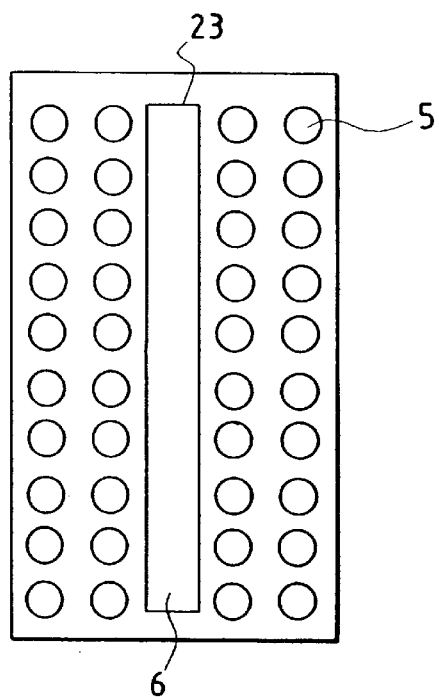
FIG. 9 is a plan view illustrating a window opening portion of a semiconductor integrated circuit device in the Embodiment 1 according to the present invention.
Figure 10:
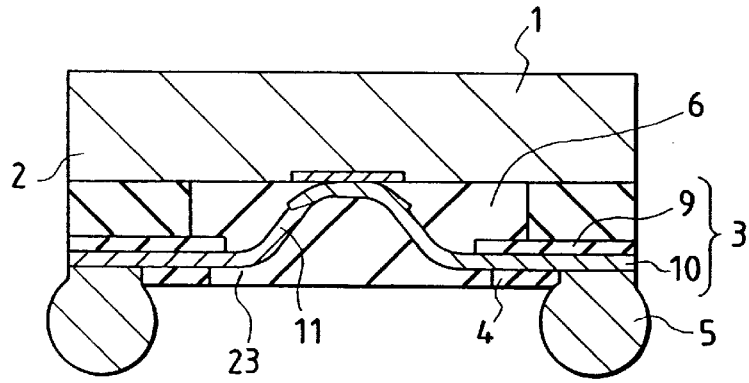
FIG. 10 is a cross sectional view corresponding to the window opening in FIG. 9.
Figure 11:
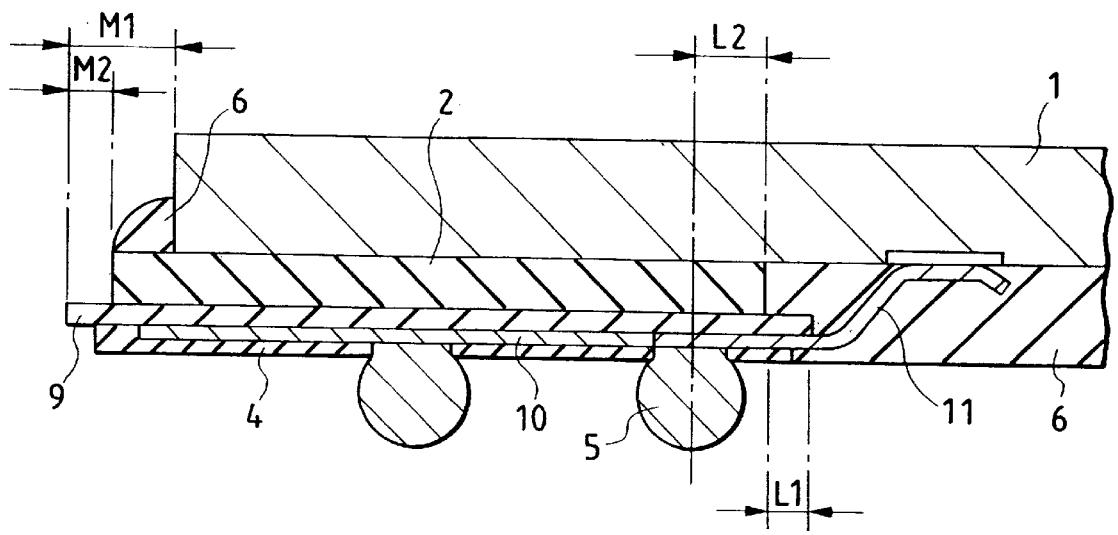
FIG. 11 is a cross sectional view for explaining the size of a window opening and an edge portion of the semiconductor chip in a semiconductor integrated circuit device in the Embodiment 1 according to the present invention.

To assist in providing a technical explanation of the optimization of tape edge position relative to the elastomer, FIG. 9 is a plane view illustrating window openings, FIG. 10 is a cross sectional view illustrating a window opening in FIG. 9 and FIG. 11 is a cross sectional view for assisting in the explanation of the size of the window opening portion and the edge portion of the semiconductor chip.

The package structure of the Embodiment 1, as shown in FIG. 9, has a BGA (Ball Grid Array) structure in which the solder bumps 5 are arranged in a matrix on the main surface of the flexible wiring substrate 3. In this example, as shown in FIG. 10, the semiconductor 1 has a center pad arrangement in which a window opening portion 23 is disposed longitudinally at a central portion, and the portion and the peripheral edge of the semiconductor chip 1 are resin capsulated by the sealant 6 to attain a structure of high moisture proofness and reliability in the final structure.

By the way, in the technique studied by the present inventor, when the end of the elastomer 2 (on the side of the window opening 23) is brought closer to the edge of the tape 9, that is, if the length L1 between the end of the elastomer 2 of the semiconductor chip 1 on the side of the bonding pad 7 and the end of the tape 9 is reduced, contamination to the lead 11 results due to a bleeding ingredient and volatile ingredient of the elastomer 2.

On the other hand, if the length L1 is made larger, that is, if the elastomer is excessively retracted from the edge of the tape 9, the length L2 between the end of the elastomer 2 and the solder bump 5 is reduced, and since the elastomer 2 is not present below the innermost portion of the solder bump 5, this may possibly increase the variation in the height of the solder bump 5 or widen the encapsulation region for the window opening 23, making it difficult to fill in the sealant 6.

On the other hand, in the Embodiment 1, these problems can be solved simultaneously by selecting an appropriate length for L1 so as to set the end of the elastomer 2 at an optimal position between the end of the tape 9 and the solder bump 5.

That is, in order to eliminate the foregoing problems related to the window opening 23, the length L1 is defined as indicated below. For example, in this embodiment, the printing accuracy of the elastomer 2 is defined as about ±100 $\mu$m. Accordingly, if the length L1 is less than 100 $\mu$m, since it may extend outside of the tape 9 due to a printing deviation, it must be greater than the printing accuracy (100 $\mu$m) at the least.

Further, since there is no problem from contamination to the lead 11 by a bleeding ingredient or volatile ingredient of the elastomer 2 if it is actually spaced by about 300 $\mu$m from the actual edge, the length L2 is set, for example, at 300 $\mu$m as a minimum. However, a design with a minimum value of about 100 $\mu$m is possible if an elastomer 2 of less contamination and bleeding is used or a countermeasure, for example, cleaning of the contamination, is adopted.

As described above, contamination to the lead 11 caused by bleeding ingredients or volatile ingredients of the elastomer 2 can be prevented, the variation in the height of the solder bumps 5 can be made stable and the sealing region of the window opening 23 can be filled with ease by selecting an appropriate length L1 as provided in the Embodiment 1.

3. Optimization of the Outer Size of the Package

Figure 12:
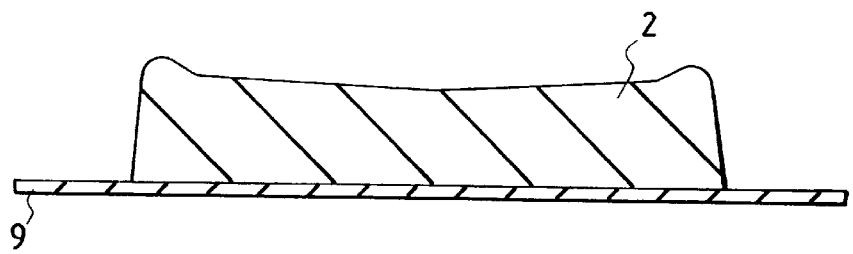
FIG. 12 is a cross sectional view illustrating a concave shape of an elastomer after printing of a semiconductor integrated circuit device in the Embodiment 1 according to the present invention.
Figure 13:
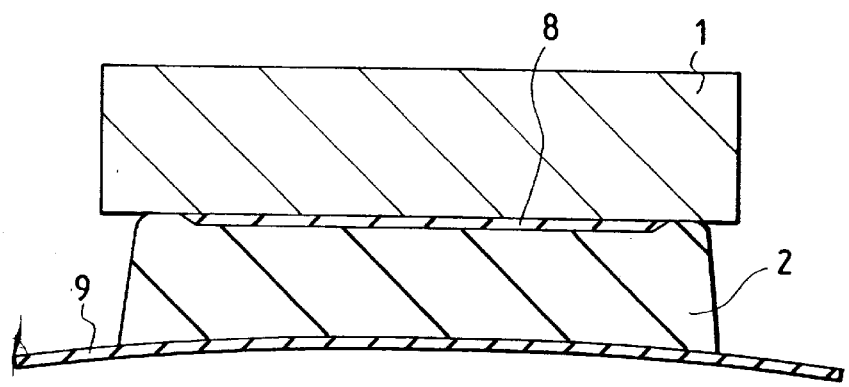
FIG. 13 is a cross sectional view illustrating a tape warping after appending a semiconductor chip in a semiconductor integrated circuit device of the Embodiment 1 according to the present invention.

To assist in providing a technical explanation of the optimization of the outer size of the package, FIG. 11 is a cross sectional view for explaining the size of the window opening and the edge portion of the semiconductor chip, FIG. 12 is a cross sectional view illustrating a concave portion of the elastomer after printing and FIG. 13 is a cross sectional view illustrating warp in the tape after appending a semiconductor chip.

For example, in the technique studied by the present inventor, looking to FIG. 11 and assuming that the distance between the end of the semiconductor chip 1 on the outer circumference of the package and the end of the tape 9 of the flexible wiring substrate 3 is M1 and the distance between the end of the elastomer 2 and the end of the tape 9 is M2, the following problems are present:

(1) If M1<0, since the outermost circumference of the package is represented by the wall of the semiconductor chip 1, there is a great possibility of inducing cracks in the semiconductor chip 1 during the assembling step, particularly upon insertion and withdrawal of the chip from a receptacle, during tray transportation and the like.

(2) If M1<0, M2>0, since the circuit surface of the semiconductor chip 1 will be exposed to the outside, a problem may be caused which affects the reliability and the sealing for preventing this, although this possibly leads to an increase of the fabrication steps.

(3) If M1−M2<0, peripheral protrusions of the elastomer 2 after printing, as shown in FIG. 12, interferes with the bonding portion of the semiconductor chip 1, as shown in FIG. 13, so as to cause bonding failure upon appending, reducing the flatness of the flexible wiring substrate 3 and causing a reduction of the reliability.

(4) If M2=0, it is necessary to cut the elastomer 2, which causes a problem due to the difficulty of the cutting.

On the other hand, in the Embodiment 1, the foregoing problems can be overcome by determining the relationship for the distance between the end of the semiconductor chip 1 or the end of the elastomer 2 and end of the tape 9 as: M1>M2>0. That is, in the explanatory view illustrating the edge portion of the package in FIG. 11, since the cutting error in the tape cutting step for determining the final outer shape is about 100 $\mu$m, it is desirable to ensure that M2 is more than 100 $\mu$m in order that the cutting jig does not reach the elastomer 2.

By the way, the cross sectional shape after forming the elastomer 2 by printing and hardening the same by baking is as shown in FIG. 12, which shows that a peripheral portion tends to be higher as a result of being pulled by the mask upon leaving the plate after printing in a case of a material having a thixotropic property which is higher to some extent. For example, if the semiconductor chip 1 is appended to the elastomer 2 under the condition that M1<M2 so that the end of the semiconductor chip extends past the end of the elastomer 2, a problem occurs in that the surface of the tape 9 warps to conform to the cross sectional shape of the elastomer 2, as shown in FIG. 13.

In order to prevent this, it is effective to eliminate the high peripheral portion of the elastomer 2 at the outside of the semiconductor chip 1 by setting M1>M2. For instance, since the width of the protrusion is about 200 $\mu$m, it is desirable for (M1−M2) to be 240 $\mu$m and the distance M1 to be about 360 $\mu$m in view of the distance M2=100 $\mu$m being provided for the cutting property.

Cutting the tape 9 at the outer circumference as described above provides advantages in that the outer shape error is reduced, and peripheral jigs such as a receptacle or a tray need not be changed to change the size to some extent of the semiconductor chip 1.

As described above, in the Embodiment 1, it is possible to avoid cracking and chipping of the semiconductor chip 1 to improve the cutting margin during the cutting step. Further, the circuit surface of the semiconductor chip 1 can be entirely disposed below the elastomer 2 to provide the advantage of improving the moisture proofness and eliminating the requirement for sealing the outer circumferential portion.

4. Planar S-Shaped Lead

Figure 14:
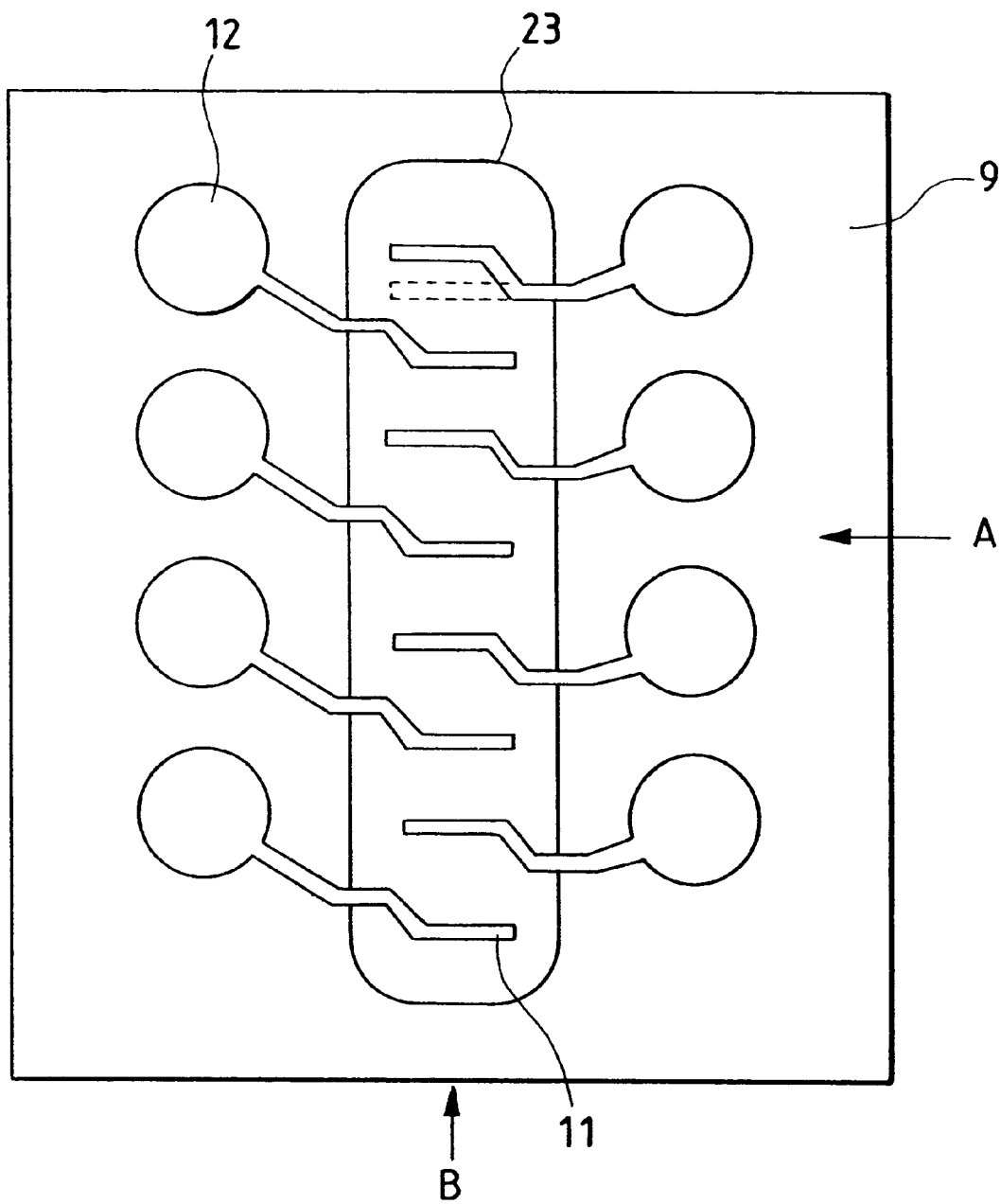
FIG. 14 is a plan view illustrating a planar S-shaped lead of a semiconductor integrated circuit device in the Embodiment 1 according to the present invention.
Figure 15:
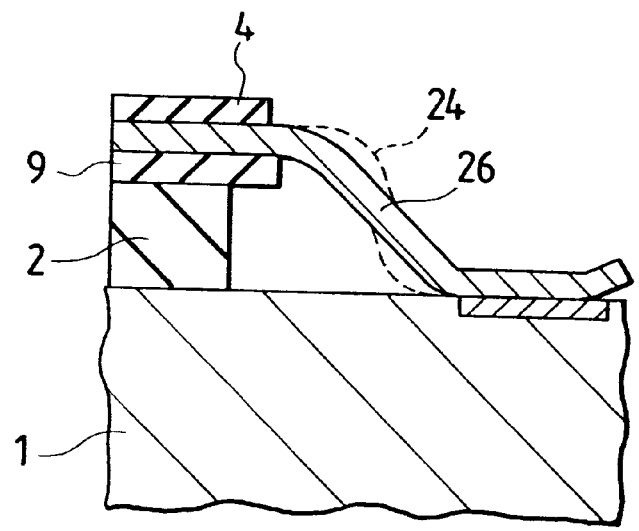
FIG. 15 is a cross sectional view as seen in the direction of arrow B in FIG. 14 of a semiconductor integrated circuit device in the Embodiment 1 according to the present invention.
Figure 16:
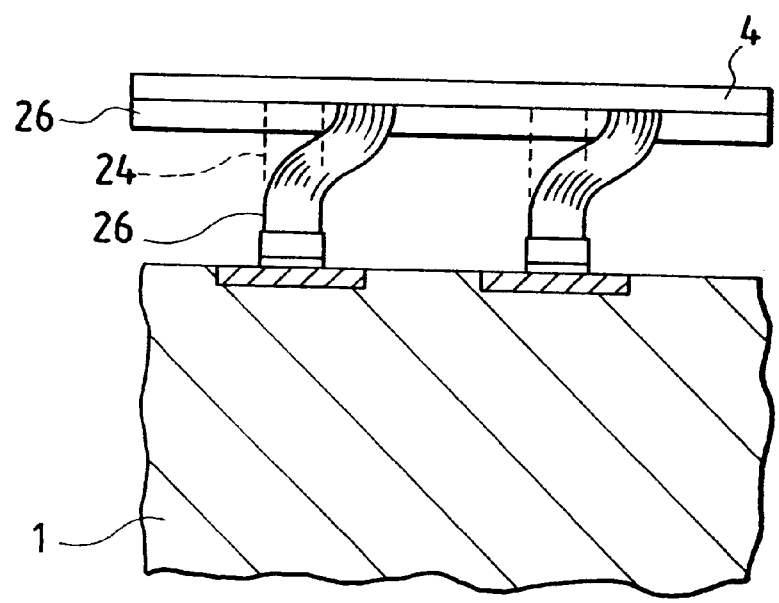
FIG. 16 is a cross sectional view as seen in the direction of arrow A in FIG. 14 in a semiconductor integrated circuit device in the Embodiment 1 according to the present invention.
Figure 17:
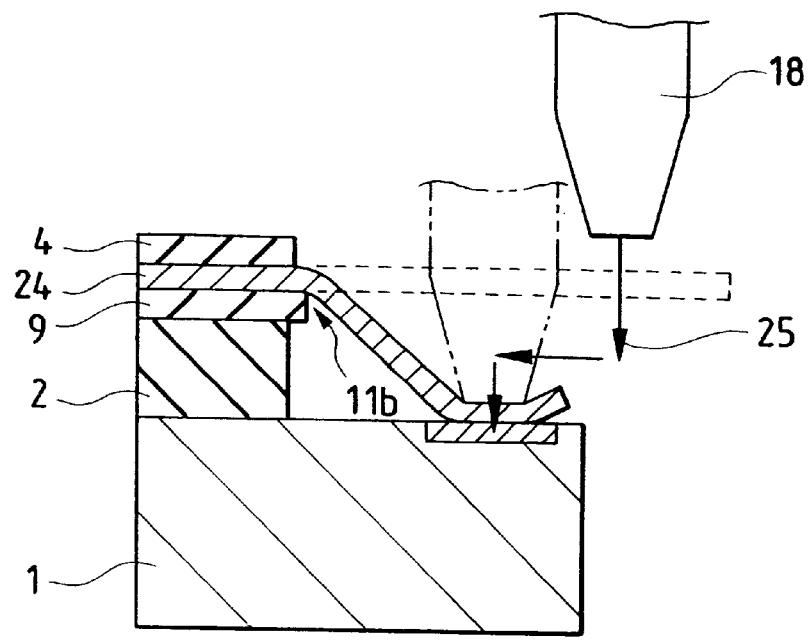
FIG. 17 is a cross sectional view illustrating a trace of a bonding tool upon forming a standard S-shaped lead in a semiconductor integrated circuit device in the Embodiment 1 according to the present invention.
Figure 18:
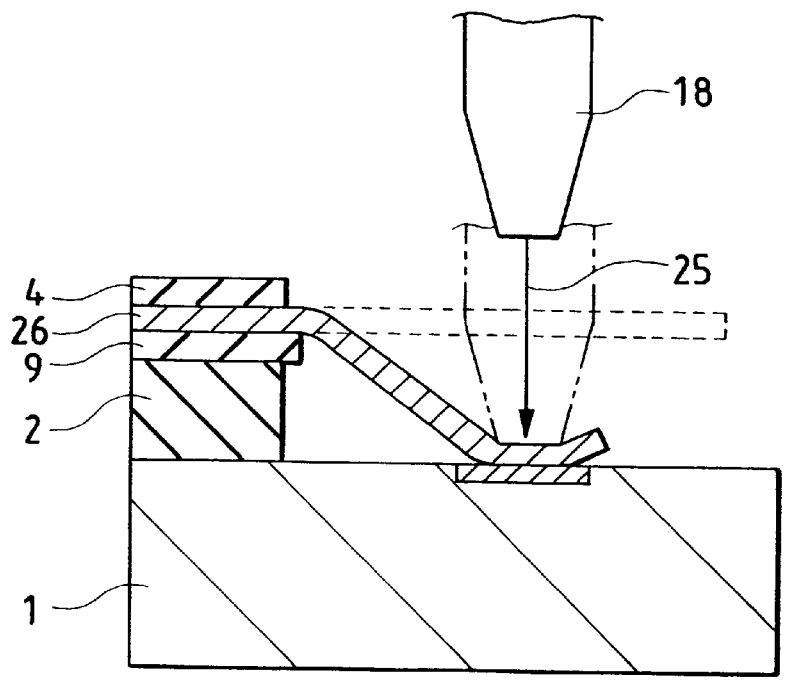
FIG. 18 is a cross sectional view illustrating a trace of a bonding tool upon forming a planar S-shaped lead in a semiconductor integrated circuit device in the Embodiment 1 according to the present invention.

To assist in providing a technical explanation of the planar S-shaped lead, FIG. 14 is a plan view illustrating a planar S-shaped lead, FIG. 15 is a cross sectional view as seen in the direction of arrow B in FIG. 14, FIG. 16 is a cross sectional view as seen in the direction of arrow A in FIG. 14, FIG. 17 is a cross sectional view illustrating the trace of a bonding tool upon forming a standard S-shaped lead and FIG. 18 is a cross sectional view illustrating the trace of a bonding tool upon forming a planar S-shaped lead.

The S-shaped configuration is such that the length of a lead 11 at one end of a wiring 10 is substantially longer than the linear distance between a pad 7 of a chip 1 and the edge portion 11b of the tape 9, so that stresses on the lead 11 can be reduced.

For example, in the technique of forming a standard S-shaped lead 24 as studied by the present inventor, the lead which is employed is a linear notch lead or a beam lead, as shown by the dotted line in FIG. 14, and in order to form a sag (S-shaped configuration) sufficient to withstand thermal deformation during bonding, as shown by a fine line in FIG. 15, it is necessary to employ a motion along a special bonding tool trace 25 which involves first driving down the lead 11 just above the semiconductor chip 1, then laterally displacing the lead and then again driving it down onto the bonding pad 7, which operation may require a special wire bonder.

On the other hand, in the Embodiment 1, the foregoing problem can be solved by preparing the lead 11 of the wiring 10 so that it does not have a linear shape, but is a planar lead 26 of a S-shaped configuration in which the base portion of the wiring 10 and the bonding portion at the top end are previously displaced at least by more than the width of the lead 11, as shown in FIG. 14, upon forming the wiring 10 on the tape 9 of the flexible wiring substrate 3.

As described above, by such forming of the planar S-shaped lead 26, a lead having a stable and suitable S-shaped configuration can be formed by a bonding tool trace 25 by simply driving down a typical wire bonder, as shown in FIG. 18, since a sag due to the original planar S-shaped configuration is formed as shown in FIG. 16, although a straightened shape as shown in FIG. 15 is formed.

Thus, a planar S-shaped lead 26 of stable S-shaped configuration can be found with no requirement for a soft-modified special wire bonder and, further, an effect for shortening the contact time upon bonding can also be expected since the bonding tool trace 25 can also be simplified.

5. Beam Lead

Figure 19:
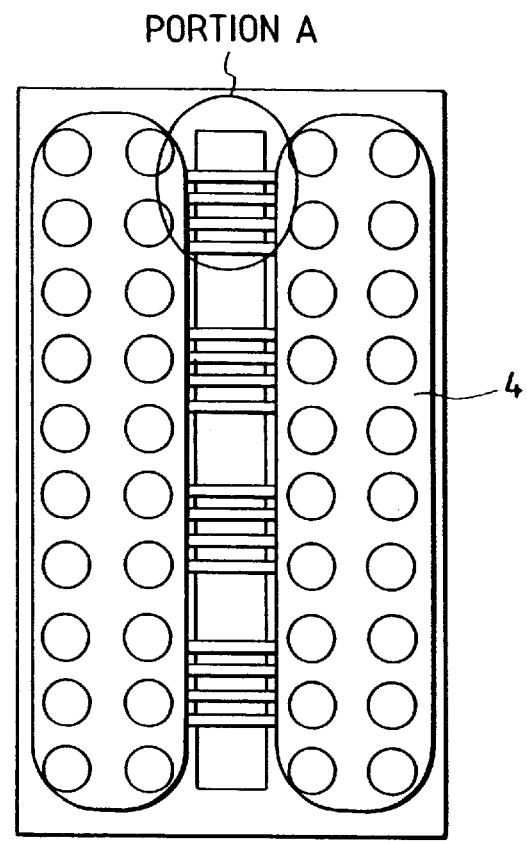
FIG. 19 is a plan view for explaining a notch lead and a beam lead of a semiconductor integrated circuit device in the Embodiment 1 according to the present invention.
Figure 20:
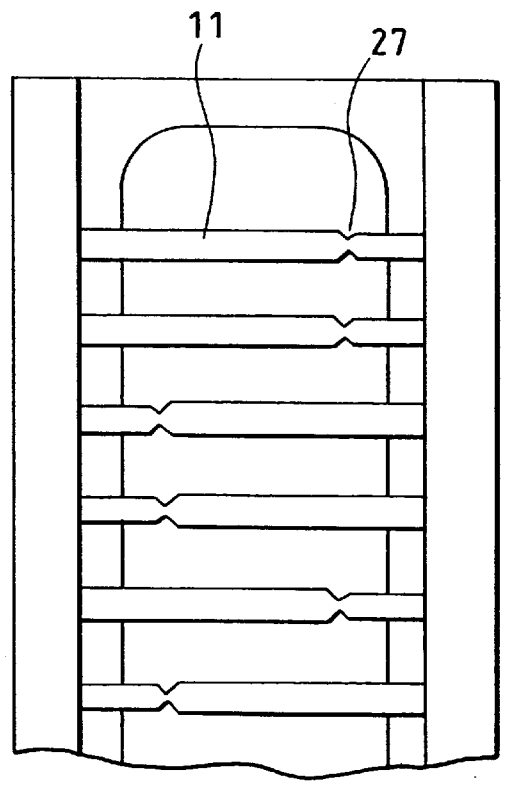
FIG. 20 is a plan view illustrating a notch lead at the portion A in FIG. 19 of a semiconductor integrated circuit device in the Embodiment 1 according to the present invention.
Figure 21:
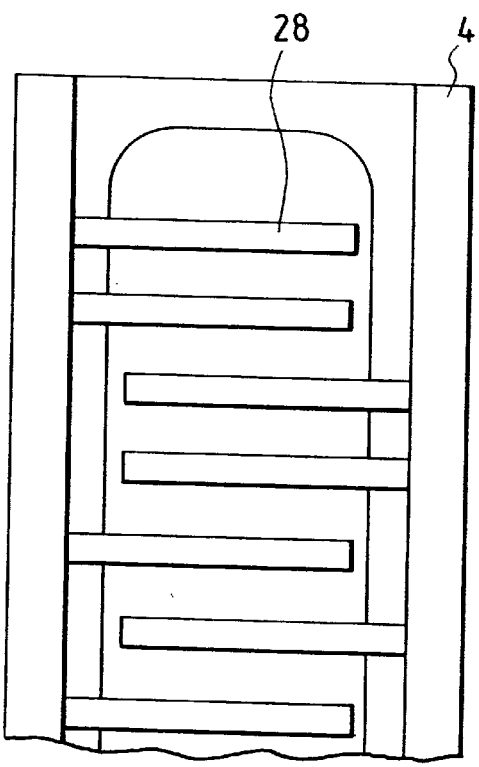
FIG. 21 is a plan view illustrating a beam lead of a semiconductor integrated circuit device in the Embodiment 1 according to the present invention.

To assist in providing a technical explanation of the beam lead, FIG. 19 is a plan view for explaining a notch lead and a beam lead, FIG. 20 is a plan view illustrating a notch lead in a portion A of FIG. 19 and FIG. 21 is a plan view illustrating a beam lead.

For example, in the technique studied by the present inventor, as shown in FIG. 20, which is an enlarged view of the lead 11 in FIG. 19, the lead 11 is formed with a notch 27, for example, of a V-shaped cut at a cutting portion. A portion slightly inside of the notch 27 is driven downwardly by a bonding tool 18 upon bonding, to cut the lead 11 at the portion of the notch 27. However, the width of the notch 27 changes due to varied etching for the wiring 10 in the manufacturing step for producing the flexible wiring substrate 3, leading to the possibility that the lead will not be cut upon bonding.

Further, even if it is cut, there still may be a problem in that the lead may be cut at a portion different from the desired notch 27, or the notch may be too narrow resulting in the lead being disconnected before the plating step of the flexible wiring substrate 3, so that the plating can not be accomplished.

On the other hand, in the Embodiment 1, as shown in FIG. 21, the problem upon cutting the lead 11 as described above can be overcome by forming the lead with a cantilever beam structure, namely, a so-called beam lead 28 in which one end is fixed to the tape 9 of the flexible wiring substrate 3 and the other end as the cutting side formed with the notch 27 is left open.

6. Passivation Size for the Periphery of the Bonding Pad

Figure 22:
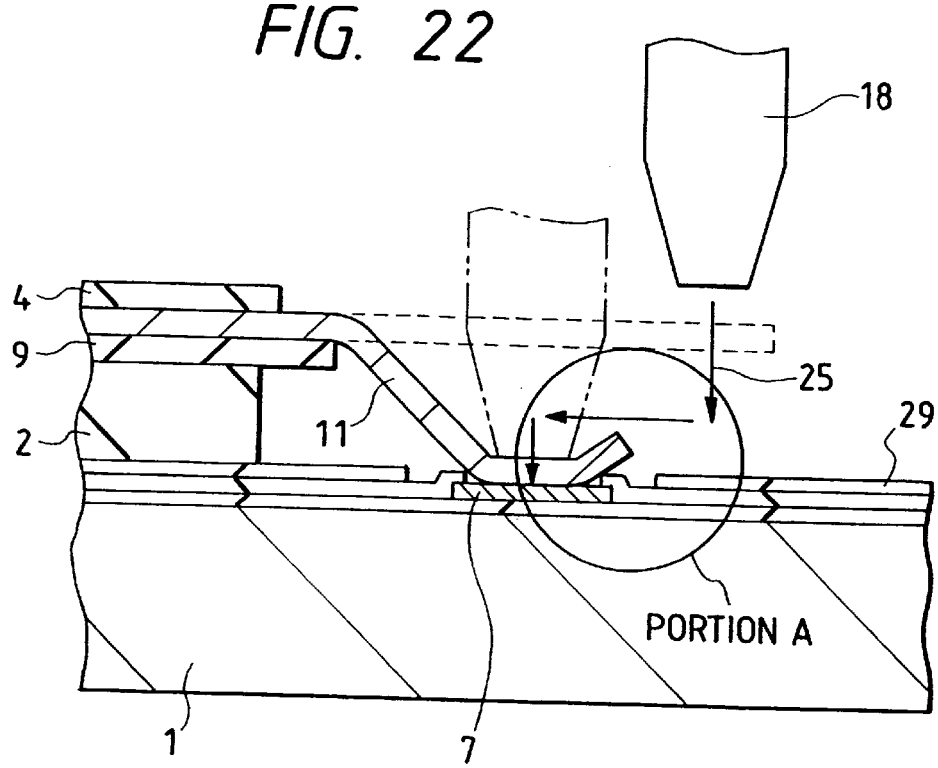
FIG. 22 is a cross sectional view illustrating a lead bonding portion of a semiconductor integrated circuit device in the Embodiment 1 according to the present invention.
Figure 23:
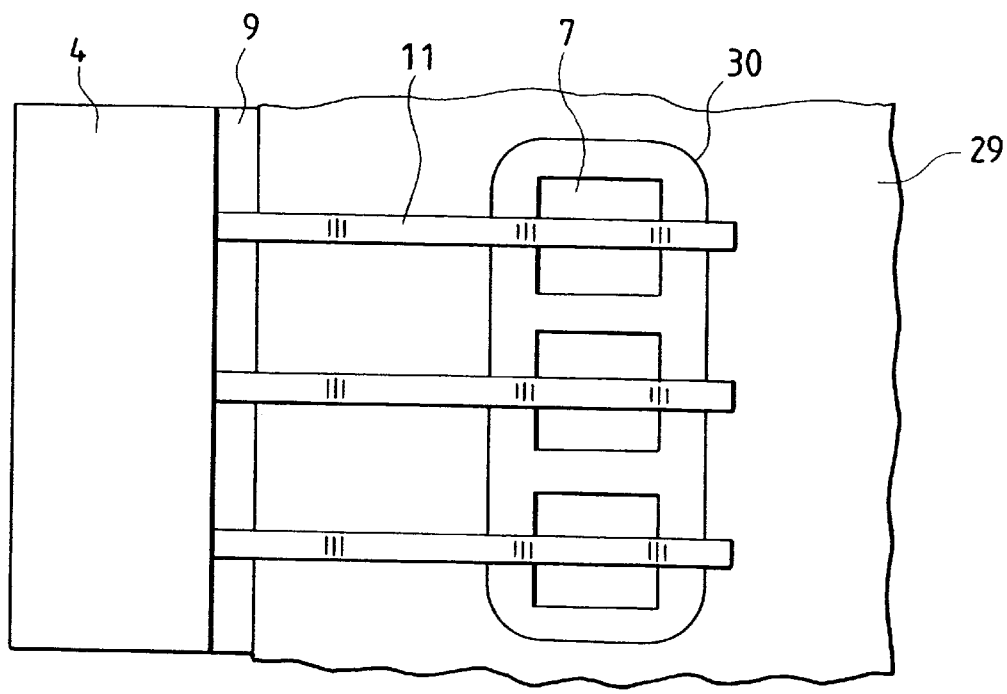
FIG. 23 is a plan view illustrating a lead bonding portion of a semiconductor integrated circuit device in the Embodiment 1 according to the present invention.
Figure 24:
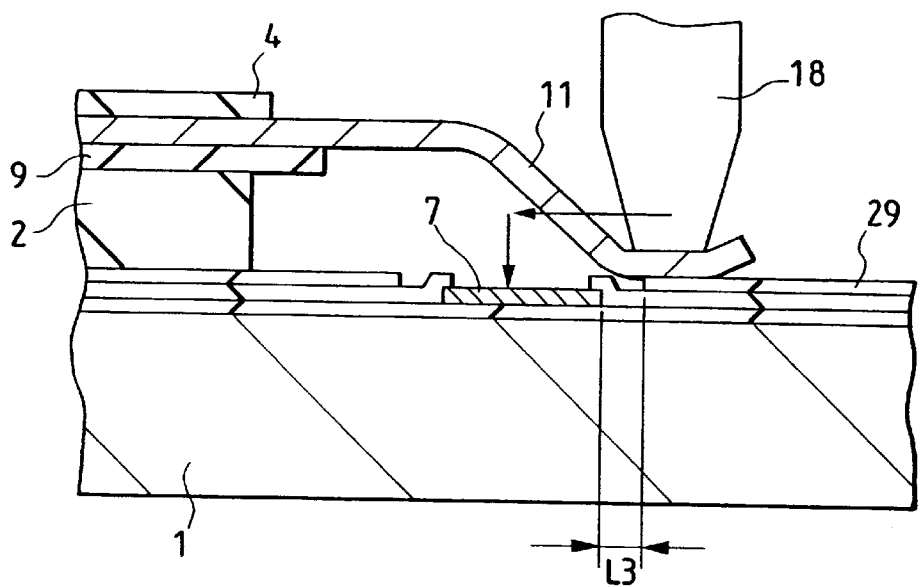
FIG. 24 is a cross sectional view illustrating, in an enlarged scale, a landing position of a tool in the portion A in FIG. 22, of a semiconductor integrated circuit device in the Embodiment 1 according to the present invention.
Figure 25:
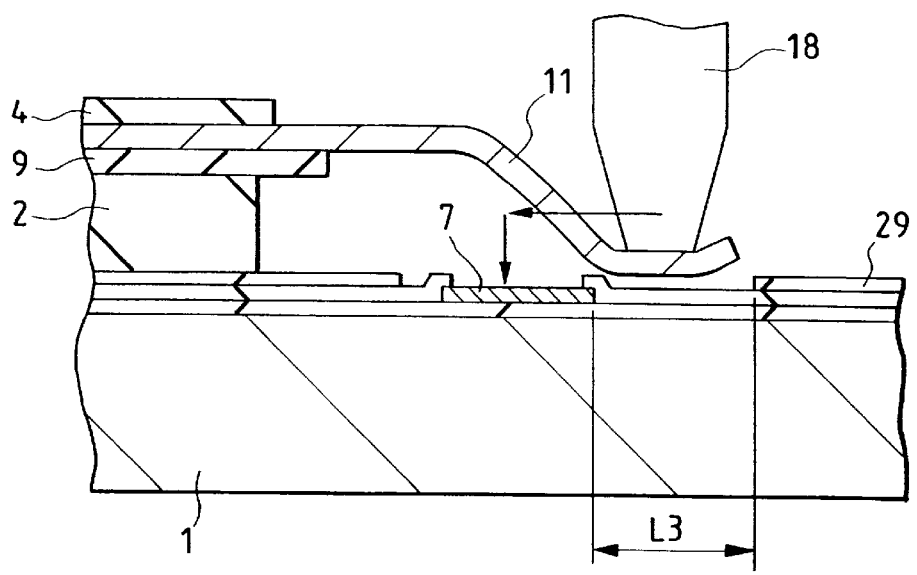
FIG. 25 is a cross sectional view illustrating a bonding portion improved for the size of a passivation opening, of a semiconductor integrated circuit device in the Embodiment 1 according to the present invention.
Figure 26:
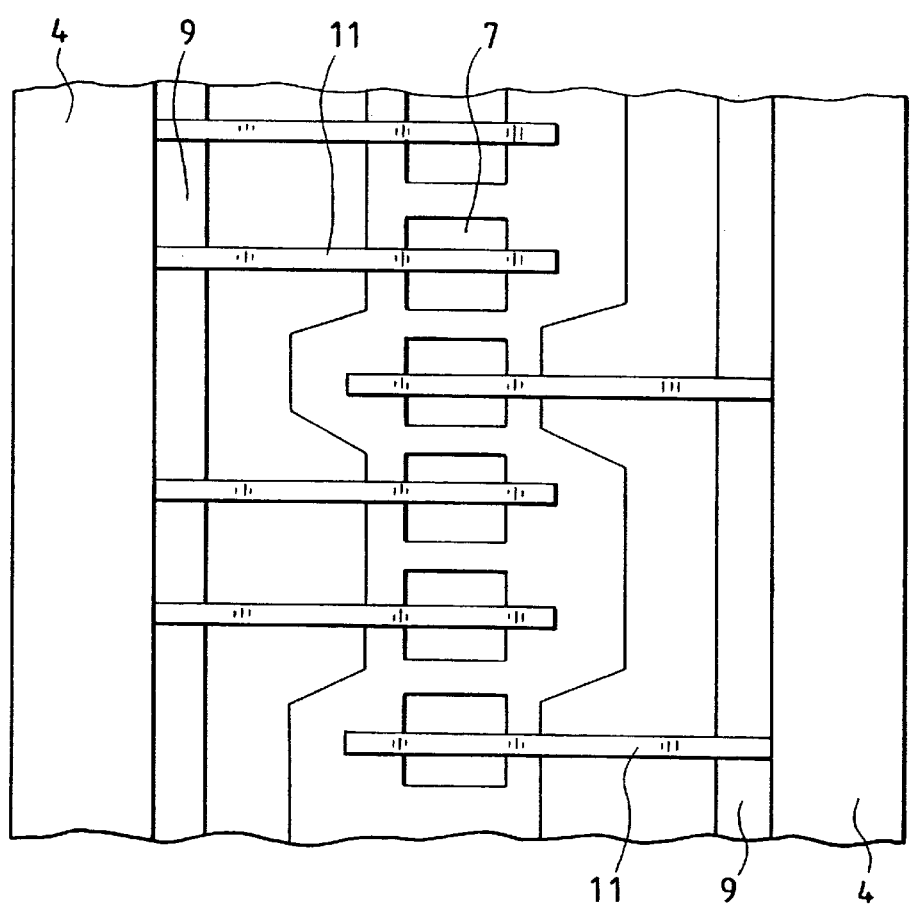
FIG. 26 is a plan view illustrating a bonding portion for leads extending in both directions of a semiconductor integrated circuit device in the Embodiment 1 according to the present invention.

To assist in providing a technical explanation of the size of the passivation film at the periphery of the bonding pad, FIG. 22 is a cross sectional view illustrating a lead bonding portion, FIG. 23 is a plan view illustrating a lead bonding portion, FIG. 24 is a cross sectional view illustrating a tool landing point at the portion in FIG. 22 in an enlarged scale, FIG. 25 is a cross sectional view illustrating a bonding portion improved for the size of the passivation opening and FIG. 26 is a plan view illustrating a bonding portion of a two way lead.

In a memory chip typically represented by a DRAM or the like, a passivation film 29 made of a polyimide type resin is formed on the chip for preventing soft errors caused by α-rays.

For example, in the technique studied by the present inventor, since the lead 11 is first driven downwardly just above the semiconductor chip 1, then displaced laterally and again driven downwardly on the bonding pad 7 of the semiconductor chip 1, as shown by the bonding tool trace 25 in the bonding sequence in FIG. 22, FIG. 23 and FIG. 24, there is the possibility of a problem in that the passivation film 29 on the semiconductor chip 1 or the semiconductor chip 1 therebelow may undergo damage during the first driving down operation, or ingredients of the passivation film 29 may be deposited to contaminate the bonding portion on the lower surface of the lead 11 to degrade the bondability.

On the other hand, in the Embodiment 1, the foregoing problems can be solved by setting the distance L3 from the edge of the bonding pad 7 to the edge of the passivation film 29 on the side of the bonding pad 7, as seen in FIG. 22, FIG. 23, and FIG. 24, such that the passivation opening 30 is extended and enlarged, whereby the lead 11 does not interfere with the passivation film 29 at least on the side thereof where the bonding tool 18 is driven down, resulting in an improvement, as shown in FIG. 25.

That is, in FIG. 24, the size L3 is about 25 μm in an example of a semiconductor chip 1, for example, a memory device. In this regard, since the size of the bonding pad 7 is 100 μm square and the size of the top end of the bonding tool 18 is equal to or less than that, the distance L3 of the passivation film 29 from the pad 7, as seen in FIG. 25, is desirably, for example, more than 125 μm.

As described above, a suitable bonding property can be attained without the risk of damage to the passivation film 29 on the semiconductor chip 1 or to the semiconductor chip 1 or without deposition of ingredients of the passivation film 29 onto the bonding portion at the lower surface of the lead 11 which could result in contamination.

Further, in a case where the leads 11 extend in both directions, the problem can also be coped with similarly by enlarging the distance from the opening edge of the bonding pad 7 to the edge of the passivation film 29 on the side of the bonding pad 7 at least on the side where the bonding tool is driven down. Enlargement of the space between the edges causes no problem even if applied to the opposite side to such an extent as to avoid exposing the circuit surface of the semiconductor chip 1.

7. Improvement of the Anchor Wiring

Figure 27:
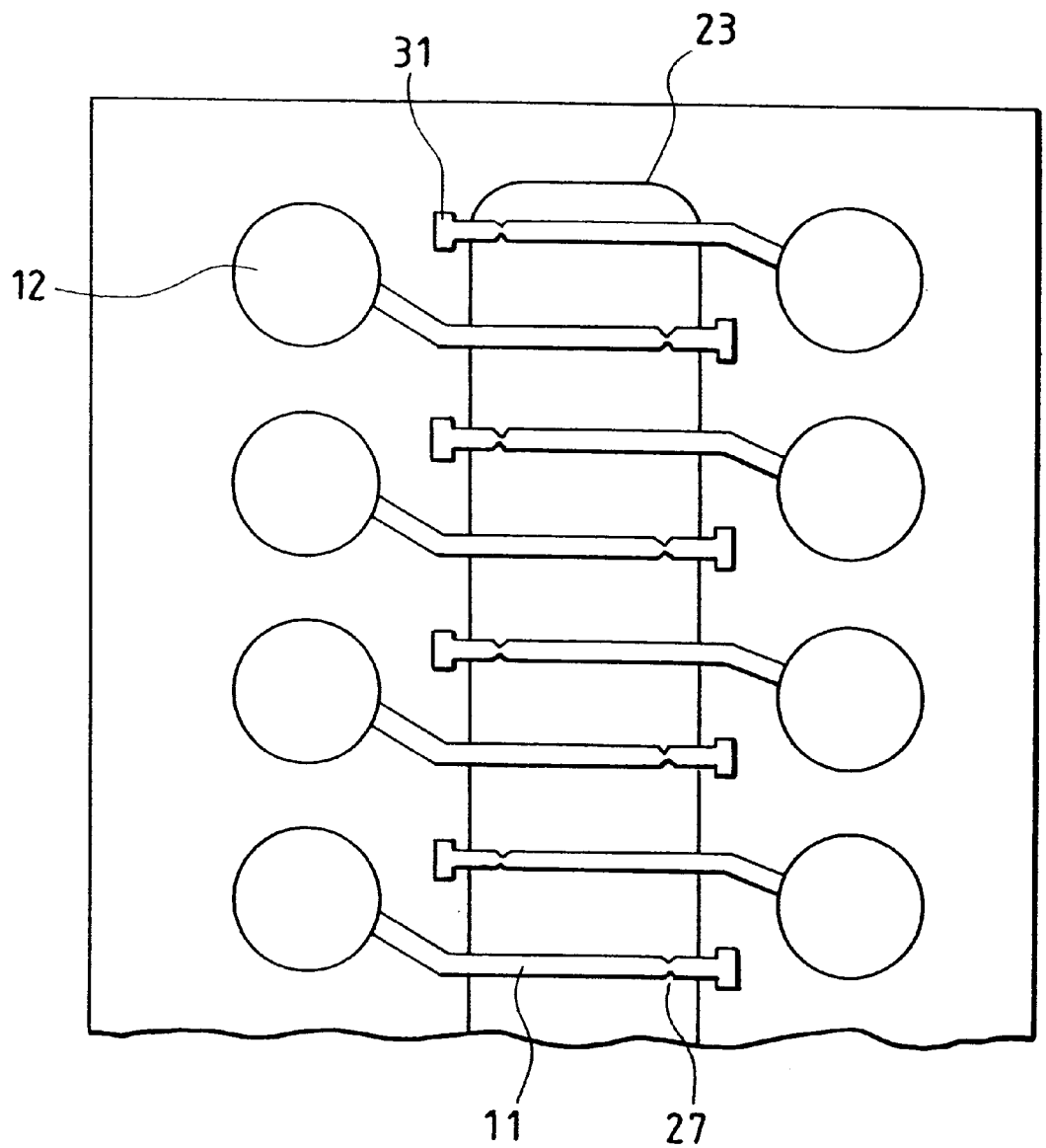
FIG. 27 is a plan view illustrating standard anchor wirings, of a semiconductor integrated circuit device in the Embodiment 1 according to the present invention.
Figure 28:
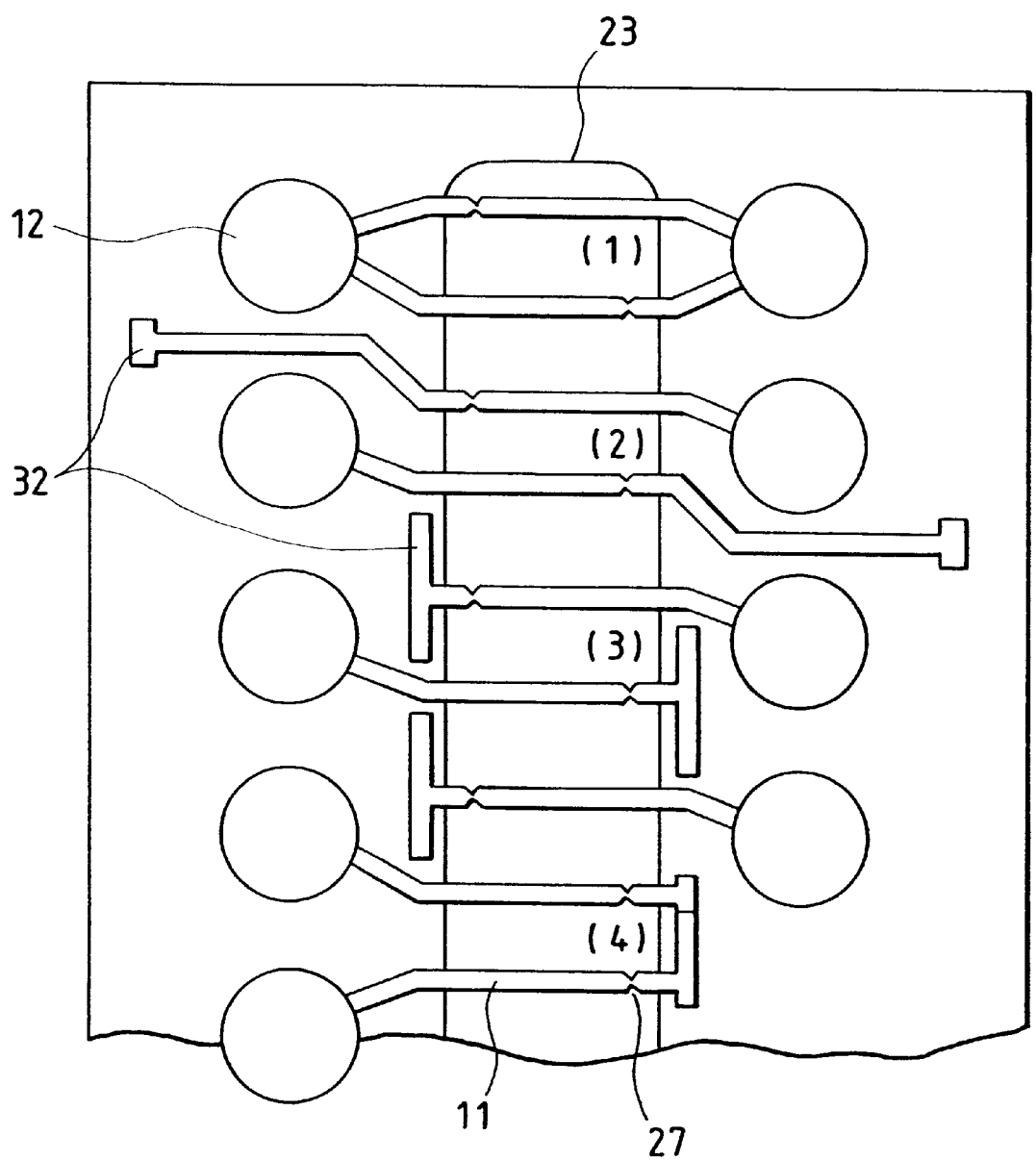
FIG. 28 is a plan view illustrating improved anchor wirings, of a semiconductor integrated circuit device in the Embodiment 1 according to the present invention.

To assist in providing a technical explanation of the improvement of the anchor wiring, FIG. 27 is a plan view illustrating a standard anchor wiring and FIG. 28 is a plan view illustrating an improved anchor wiring.

For example, in the-technique studied by the present inventors, in a pattern of a standard anchor wiring 31 on the terminal end of a notch, as shown in FIG. 27, if the notch 27 is formed to be smaller than a designed value, there is a possibility that the lead will not be cut at the portion of the notch 27, but the bonding strength between the wiring 10 and the tape 9 ahead of the notch in the standard anchor wiring 31 may not be sufficient to prevent a portion of the standard anchor wiring 31 to be peeled from the tape 9.

On the other hand, in this Embodiment 1, the bonding strength between the wiring 10 and the tape 9 can be increased to obtain a stable cutting performance of the notch 27 by providing an enlarged anchor wiring 32 for enlarging the effective area in the portion for the anchor wiring at the terminal end as shown in FIG. 28.

That is, the following improved examples of enlarged anchor wirings 32 are shown in FIG. 28.

(1) An enlarged anchor wiring 32 is connected to a bump land 12 to an opposing wiring 11.

(2) Enlarged anchor wiring 32 is extended longitudinally in a vacant space in the wirings 11.

(3) Enlarged anchor wiring 32 is extended laterally in a vacant space in the wirings 11.

(4) Adjacent extended anchor wirings 32 are connected with each other. In each of the examples, the cutting performance of the notch 27 can be stabilized by the increase of the adhesion strength between the wiring 10 and the tape 9 by increasing the effective area of the portion of the enlarged anchor wirings 32.

8. Wide Elastomer Structure

Figure 29:
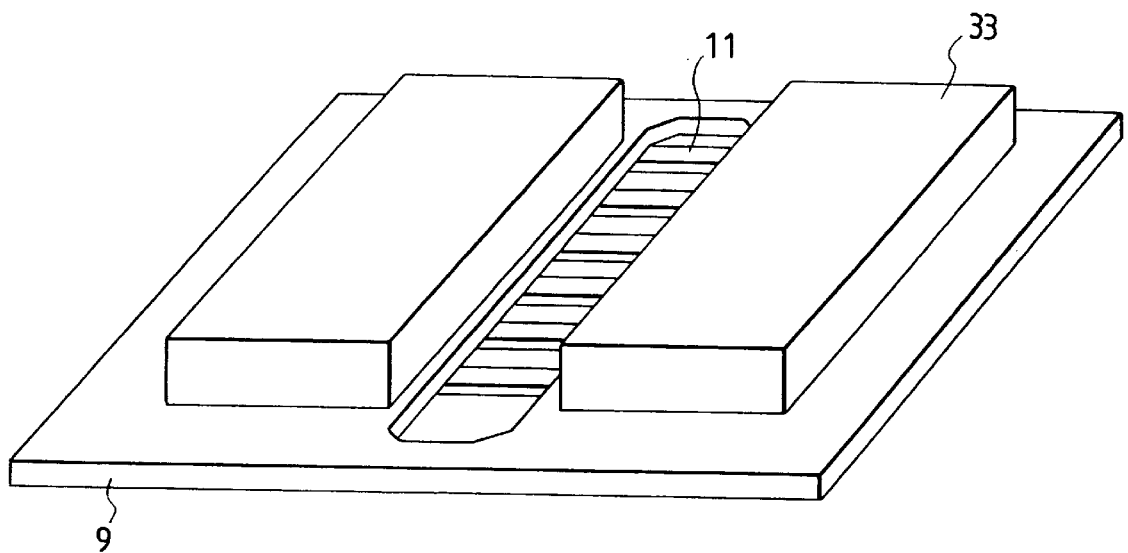
FIG. 29 is a perspective view illustrating a structure of a standard elastomer, of a semiconductor integrated circuit device in the Embodiment 1 according to the present invention.
Figure 30:
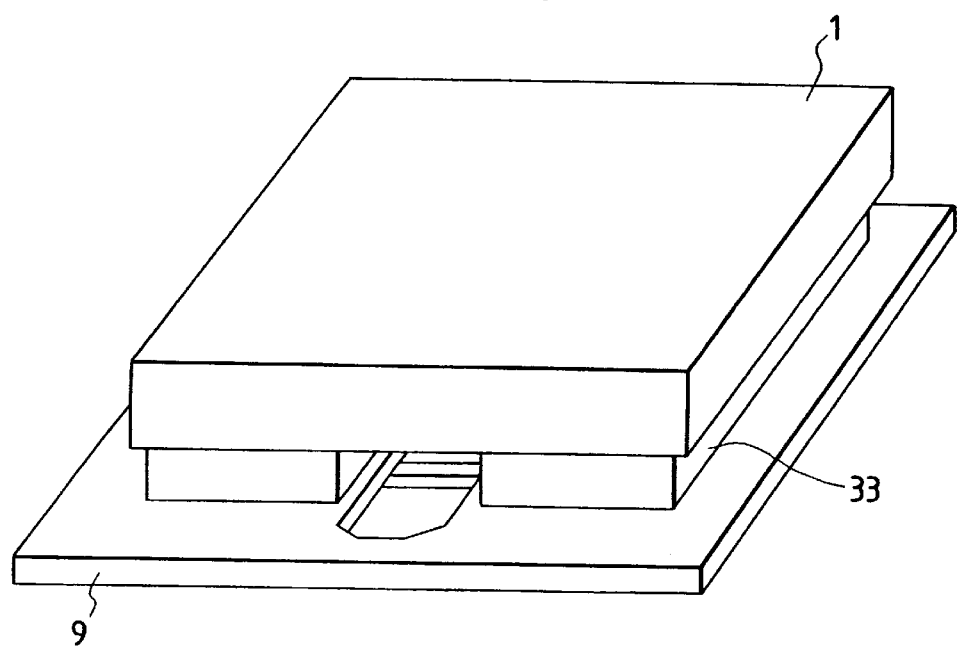
FIG. 30 is a perspective view illustrating a state of appending a semiconductor chip at a standard elastomer, of a semiconductor integrated circuit device in the Embodiment 1 according to the present invention.
Figure 31:
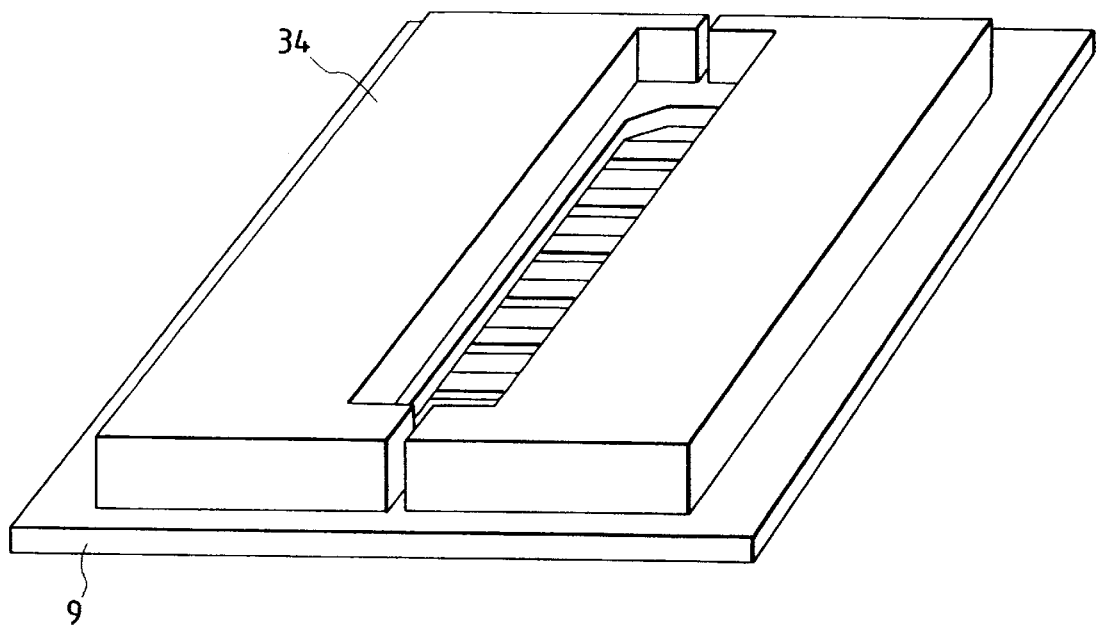
FIG. 31 is a perspective view illustrating a structure of a wide elastomer, of a semiconductor integrated circuit device in the Embodiment 1 according to the present invention.
Figure 32:
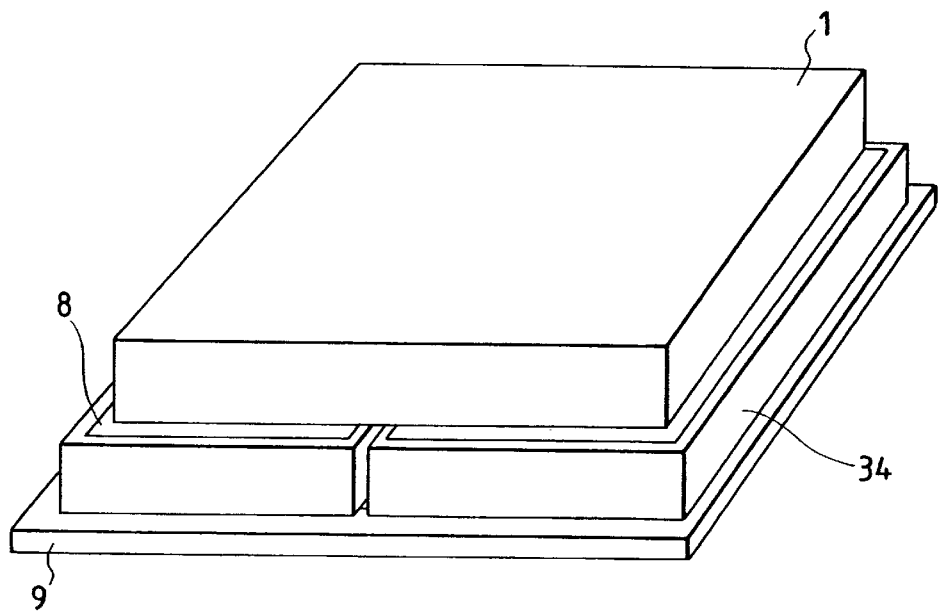
FIG. 32 is a perspective view illustrating a state of appending a semiconductor chip at a wide elastomer, of a semiconductor integrated circuit device in the Embodiment 1 according to the present invention.
Figure 33:
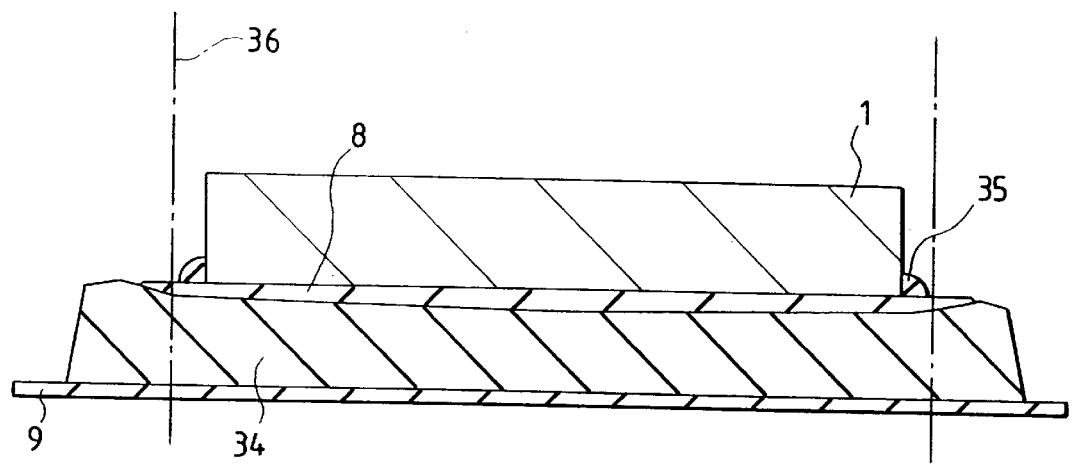
FIG. 33 is a cross sectional view illustrating a state of appending a semiconductor chip at a wide elastomer, of a semiconductor integrated circuit device in the Embodiment 1 according to the present invention.

To assist in providing technical explanation of the wide elastomer structure, FIG. 29 is a perspective view illustrating a structure of a standard elastomer, FIG. 30 is a perspective view illustrating the state of appending a semiconductor chip to a standard elastomer, FIG. 31 is a perspective view illustrating the structure of a wide elastomer, FIG. 32 is a perspective view illustrating the state of appending a semiconductor chip to the wide elastomer and FIG. 33 is a cross sectional view illustrating the state of appending a semiconductor chip to the wide elastomer.

In the technique studied by the present inventor, the elastomer is bonded on both sides of a bonding pad 7 of a semiconductor chip 1 and, in a structure using a standard elastomer 33, as shown in FIG. 29 and FIG. 30, there is a possibility that warping will occur in the flexible wiring substrate due to the effect of peripheral protrusions in a structure in which the surface of the elastomer 2 is smaller than that of the semiconductor chip 1, as shown in FIG. 13, and that the warping brings about a problem, for example, during the forming of the solder bumps 5 and the mounting of the substrate.

On the other hand, in the structure of a wide elastomer 34 which is larger than the outer size of the semiconductor chip 1 in the embodiment as shown in FIG. 31, the peripheral protrusions of the wide elastomer 34 are outside of the edges of the semiconductor chip, as shown in FIG. 32 and FIG. 33, after appending the semiconductor chip 1, and since the semiconductor chip 1 is bonded substantially to a flat portion of the wide elastomer 34, warping of the flexible wiring substrate 3 can be avoided.

Further, as shown in FIG. 33, since a wide coating area of an adhesive 8 can be employed, the portion in which the adhesive 8 is not provided and which is left unbonded is reduced in size, and since the adhesive will extrude uniformly at the periphery of the semiconductor chip 1 to form an adhesive bead 35, it is possible to constitute a package of excellent moisture proofness and reliability without applying peripheral sealing.

More particularly, the width of the protrusions at the periphery of the wide elastomer 34 is, for example, about 200 to 300 μm depending on the physical property of the material and, accordingly, the wide elastomer 34 extends over a larger range at the entire circumference at least by more than the protrusion width afforded by the chip size of the semiconductor chip 1, as shown in FIG. 33 in the Embodiment 1.

Further, while the flatness is improved by forming the wide elastomer 34 sufficiently large, if the tape 9 is to be cut just at the outer circumference of the semiconductor chip 1, the tape 9 will be cut together with the wide elastomer 34 along a cutting line 36, which is necessary to define the package outer shape.

As described above, by using the wide elastomer 34 which is larger than the outer size of the semiconductor chip 1, warping of the flexible wiring substrate 3 can be suppressed, and the bondability of the semiconductor chip 1 can be made stable to improve the moisture proofness and the reliability of the package.

9. Groove-Filling Technique of the Elastomer

Figure 34:
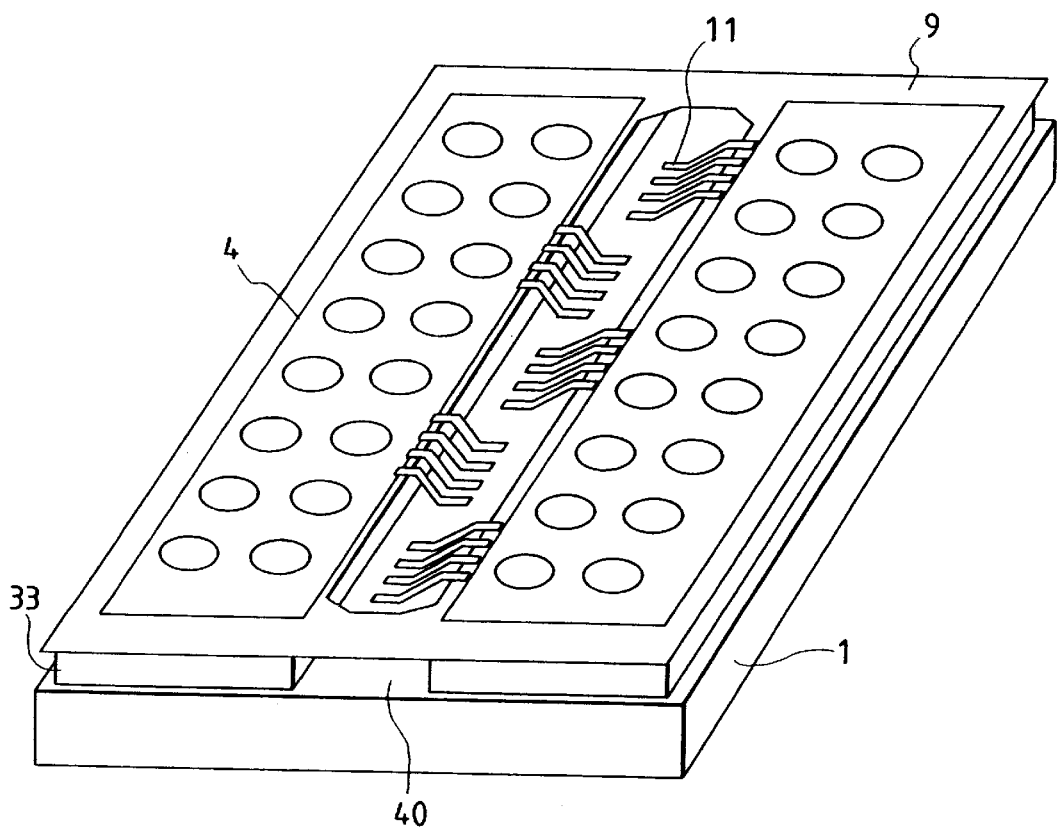
FIG. 34 is a perspective view illustrating a structure of the standard elastomer after appending a semiconductor chip, of a semiconductor integrated circuit device in the Embodiment 1 according to the present invention.
Figure 35:
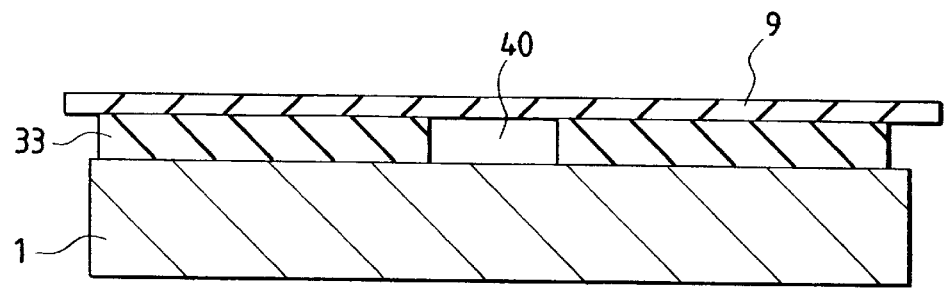
FIG. 35 is a cross sectional view illustrating a structure of a standard elastomer after appending the semiconductor chip, of a semiconductor integrated circuit device in the Embodiment 1 according to the present invention.
Figure 36:
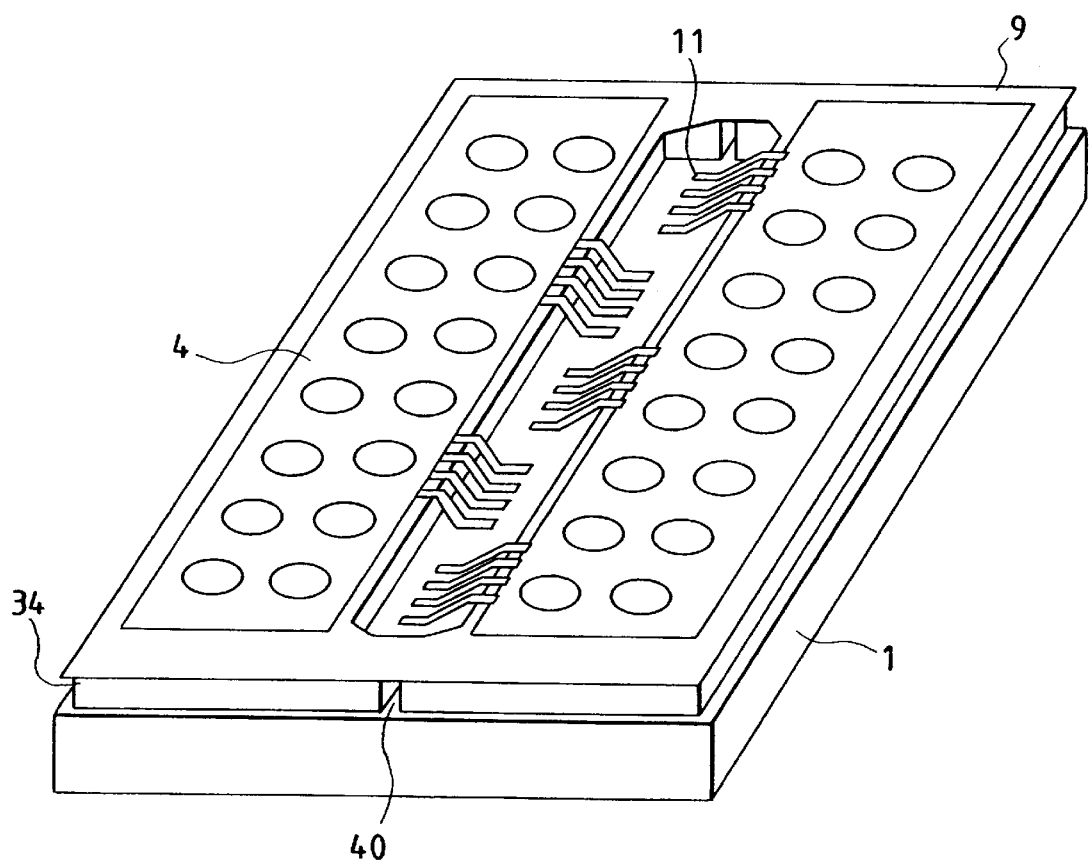
FIG. 36 is a perspective view illustrating a structure of a wide elastomer after appending the semiconductor chip, of a semiconductor integrated circuit device in the Embodiment 1 according to the present invention.
Figure 37:
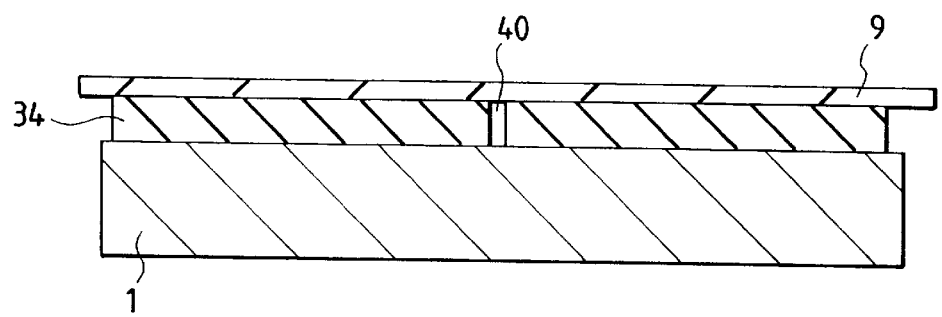
FIG. 37 is a cross sectional view illustrating a structure of a wide elastomer after appending the semiconductor chip, of a semiconductor integrated circuit device in the Embodiment 1 according to the present invention.
Figure 38:
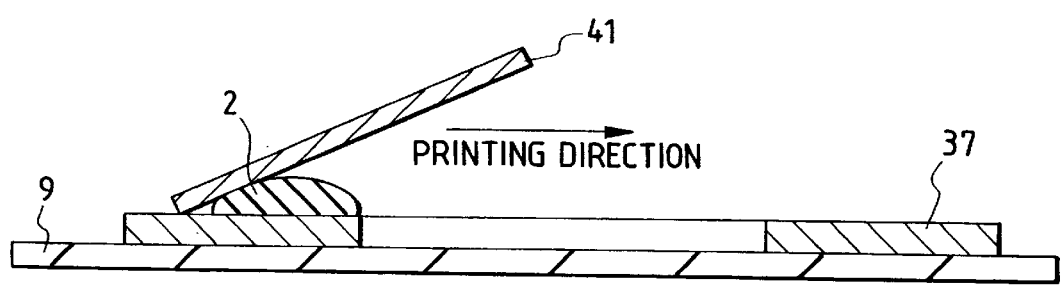
FIG. 38 is a cross sectional view illustrating a concept of metal mask printing, of a semiconductor integrated circuit device in the Embodiment 1 according to the present invention.
Figure 39:
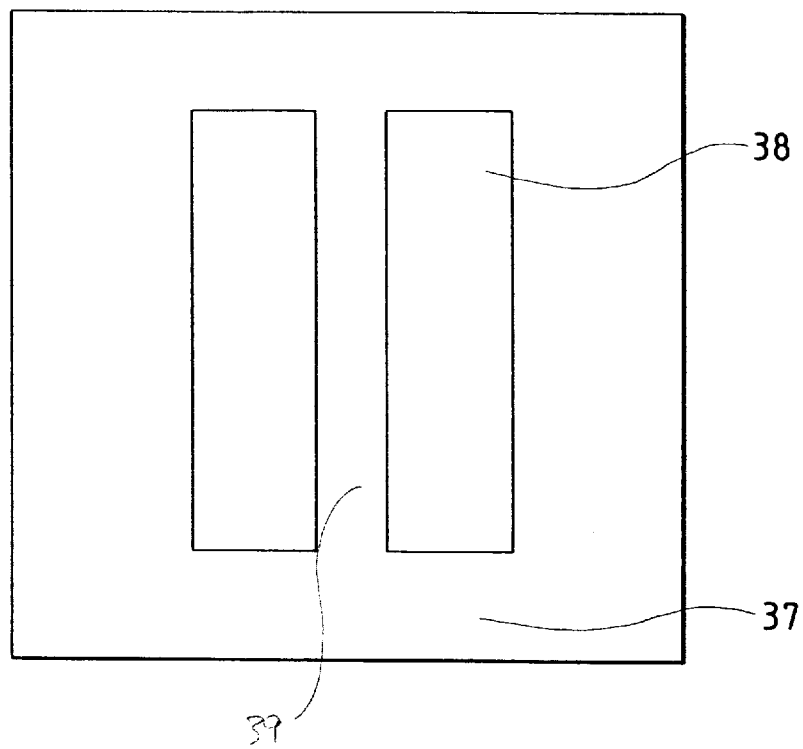
FIG. 39 is a plan view illustrating a metal mask of a standard elastomer, of a semiconductor integrated circuit device in the Embodiment 1 according to the present invention.
Figure 40:
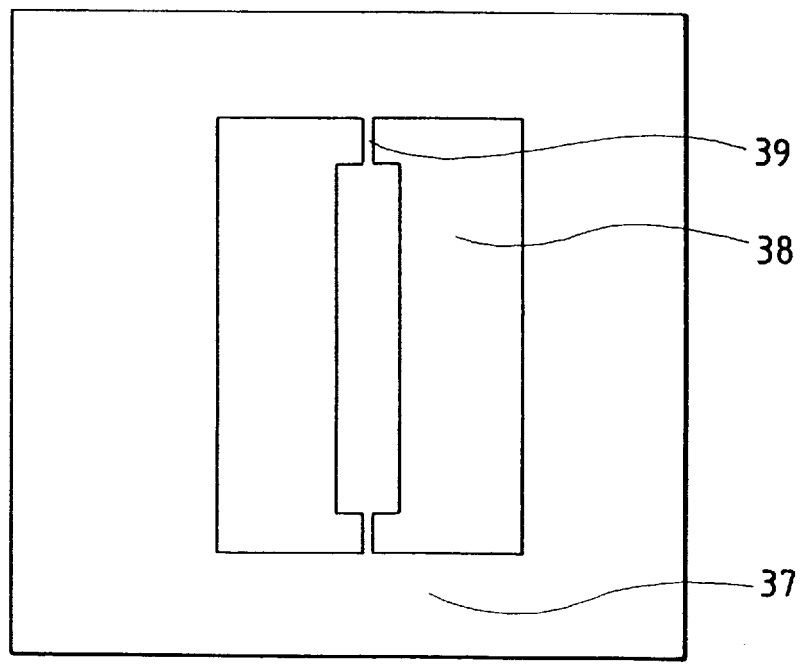
FIG. 40 is a plan view illustrating a metal mask of a wide elastomer, of a semiconductor integrated circuit device in the Embodiment 1 according to the present invention.
Figure 41:
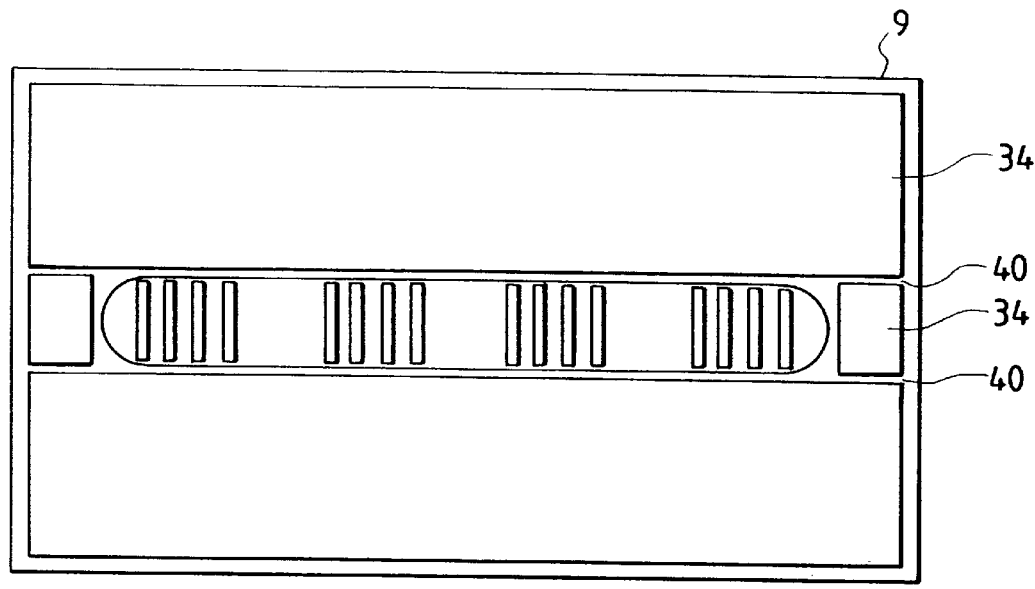
FIG. 41 is a plan view illustrating a printed shape for a plurality of suspended wide elastomers, of a semiconductor integrated circuit device in the Embodiment 1 according to the present invention.
Figure 42:
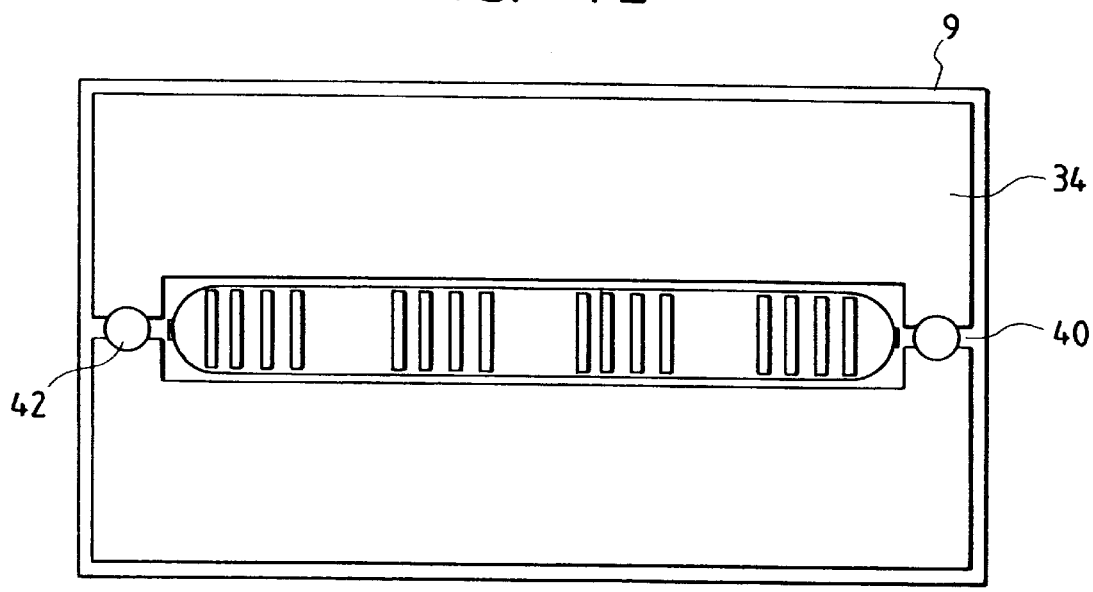
FIG. 42 is a plan view illustrating a potting position for groove-fillage of a wide elastomer, of a semiconductor integrated circuit device in the Embodiment 1 according to the present invention.

To assist in providing a technical explanation of the groove-filling technique of the elastomer, FIG. 31 and FIG. 32 are perspective views illustrating the structure of the wide elastomer and the state of appending the semiconductor chip as described above, FIG. 34 is a perspective view illustrating the structure after appending a semiconductor chip to a standard elastomer, FIG. 35 is a cross sectional view thereof, FIG. 36 is a perspective view illustrating a structure after appending a semiconductor chip to a wide elastomer, FIG. 37 is a cross sectional view thereof, FIG. 38 is a cross sectional view illustrating the concept of metal mask printing, FIG. 39 is a plan view illustrating a metal mask of a standard elastomer, FIG. 40 is a plan view illustrating a metal mask of a wide elastomer, FIG. 41 is a plan view illustrating a printed shape of a wide elastomer having plural bridge portions and FIG. 42 is a plan view illustrating a potting position for groove-filling of the wide elastomer.

For example, in the structure of a standard elastomer 33 as shown in FIG. 34 and FIG. 35, in the technique studied by the present inventor, when an elastomer is formed by printing using a metal mask 37, as shown in FIG. 39, in the structure of the standard elastomer 33 shown in FIG. 34 and FIG. 35, since a bridge portion 39 is always present across the printing area opening 38 of the metal mask 37 shown in FIG. 39, a groove 40 (space) surrounded by walls of the semiconductor chip 1 and the elastomer is present below the tape suspended portion.

Accordingly, when the window opening 23 (FIG. 9) is resin-encapsulated in a structure in which the groove 40 remains at the ends of the space defined by the semiconductor chip 1 and the elastomer, the sealant 6 will leak through the groove 40, and so it is necessary to previously seal the open end portions by a method such as separate potting and then seal the window opening 23.

As described above, the concept of printing by use of a metal mask 37 is designed to form the elastomer for a desired range to a desired thickness, by positioning and disposing a metal mask 37 having a printing area opening 38 at a predetermined position with respect to a flexible wiring substrate 3, only for the printed portion as shown in FIG. 39 in the case of the standard elastomer 33 and as shown in FIG. 40 in the case of the wide elastomer 34.

Accordingly, in the Embodiment 1, the wide elastomer 34 described above and shown in FIG. 31 is printed by a metal mask 37 as shown in FIG. 40, in which a groove 40 surrounded by the walls of the semiconductor chip 1 and the elastomer 2 can be narrowed by printing the elastomer having a restricted bridge portion 39 for the printing area opening 38 of the metal mask 37. For example, the minimum value for the width of the groove 40 determined by the strength of the bridge portion 39 of the metal mask 37 is about 200 μm.

Further, in a case of a structure in which the semiconductor chip is appended to the elastomer by coating the adhesive 8 on the main surface of the elastomer 2, if the adhesive 8 is coated in a sufficient amount, excessive adhesive 8 will fill the groove 40 in response to the pressure created upon appending to make the window opening 23 a closed space, so that the window opening 23 can be sealed without applying sealing.

Further, the groove-fillage can be improved by restricting the bridge portion 39 of the metal mask 37 thereby narrowing the groove 40, but this results in a side effect of lowering the strength of the metal mask 37. However, by providing a plurality of bridge positions on one side to produce the construction as shown in FIG. 41, the strength of the metal mask 37 can be improved without changing the width of the groove 40 although the number of the grooves 40 is increased.

Further, with an aim toward improving the groove-fillage, as shown in FIG. 42, when resin, adhesive or the like is potted, for example, at the potting position 42 of the groove 40 of the elastomer to form a stopping dam for the sealant flow just before appending the semiconductor chip 1, the groove-fillage can be improved still further.

Further, in a case of filling by potting before sealing the window opening 23 after appending and bonding of the semiconductor chip as in the technique studied above, the sealing performance can be improved outstandingly by restricting the width of the groove 40.

As described above, the groove-fillage can be improved, particularly, by restricting the bridge portion 39 of the metal mask 37 thereby narrowing the groove 40 of the elastomer and, further, the groove-fillage can be improved even more by previously forming a stopping dam for the sealant flow to the potting position 42.

10. Inner Lead Bonding Technique

Figure 43:
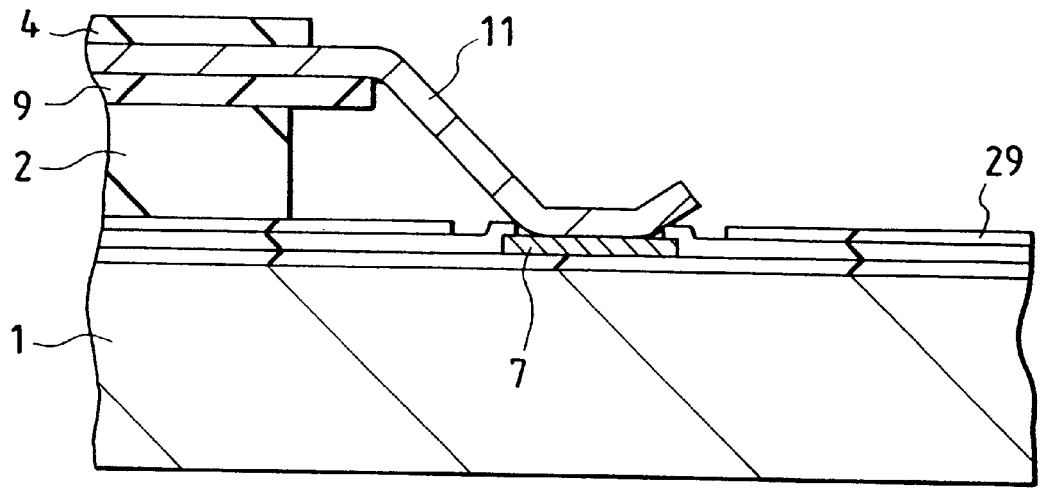
FIG. 43 is a cross sectional view illustrating a bonding portion by a standard lead bonding, of a semiconductor integrated circuit device in the Embodiment 1 according to the present invention.
Figure 44:
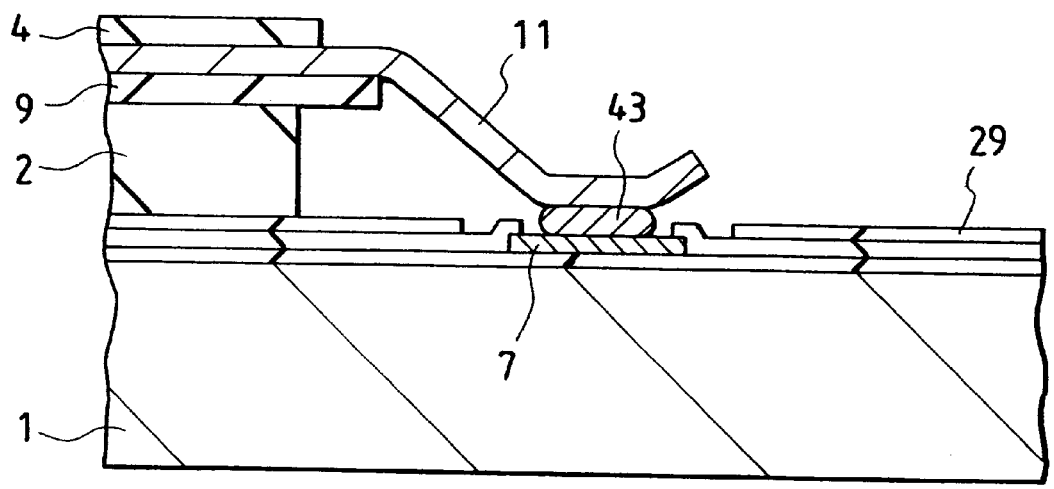
FIG. 44 is a cross sectional view illustrating a bonding portion by using stud bumps, of a semiconductor integrated circuit device in the Embodiment 1 according to the present invention.
Figure 45:
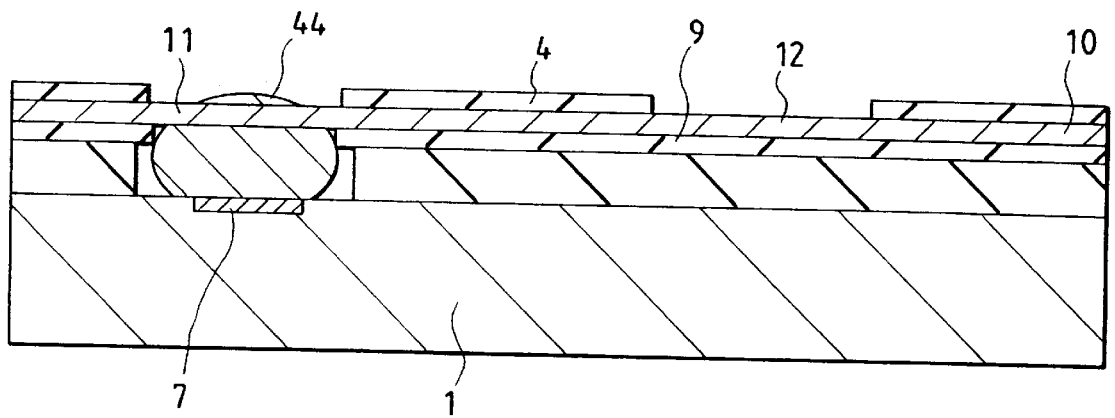
FIG. 45 is a cross sectional view illustrating a lead connection by using solder, of a semiconductor integrated circuit device in the Embodiment 1 according to the present invention.
Figure 46:
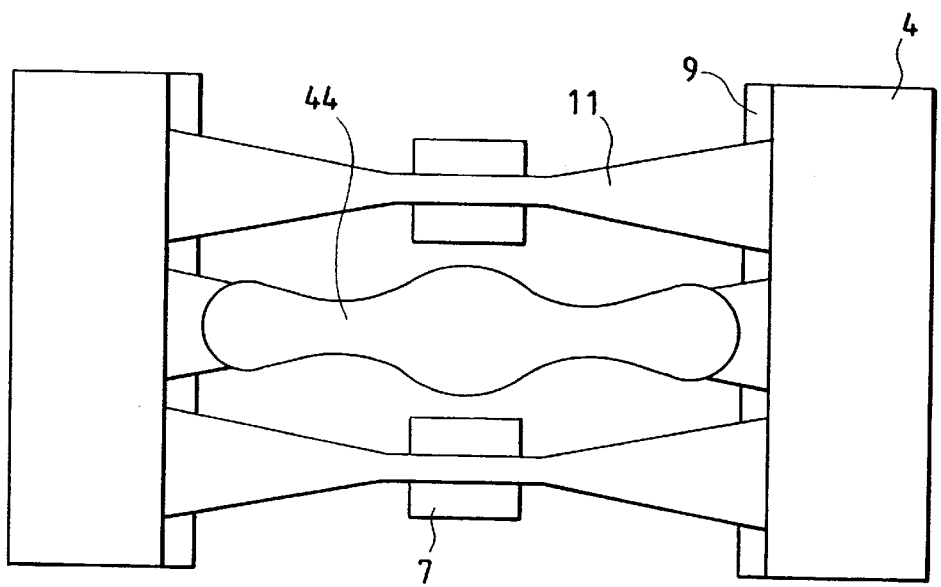
FIG. 46 is a plan view illustrating a lead connection using solder, of a semiconductor integrated circuit device in the Embodiment 1 according to the present invention.
Figure 47:
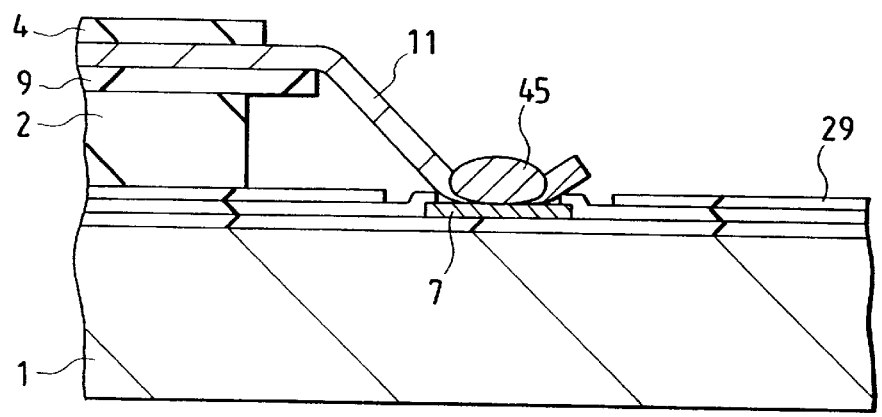
FIG. 47 is a cross sectional view illustrating a lead connection by using solder or Au ball, of a semiconductor integrated circuit device in the Embodiment 1 according to the present invention.
Figure 48:
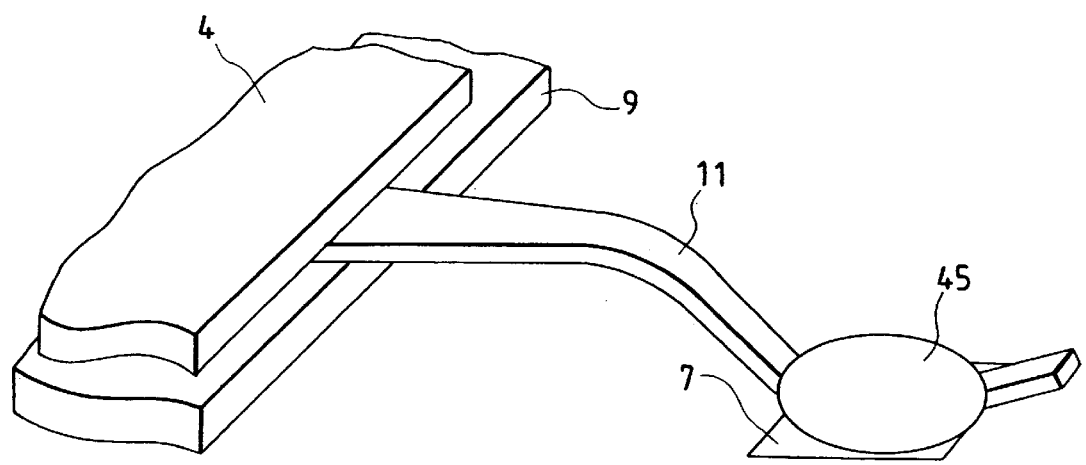
FIG. 48 is a perspective view illustrating a lead connection by using solder or Au ball, of a semiconductor integrated circuit device in the Embodiment 1 according to the present invention.
Figure 49:
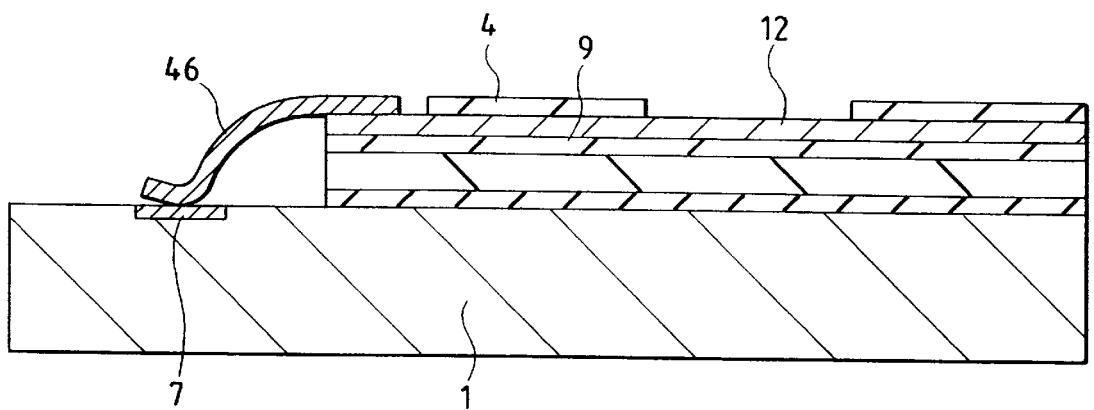
FIG. 49 is a cross sectional view illustrating a lead connection by using Al or soldering wire, of a semiconductor integrated circuit device in the Embodiment 1 according to the present invention.
Figure 50:
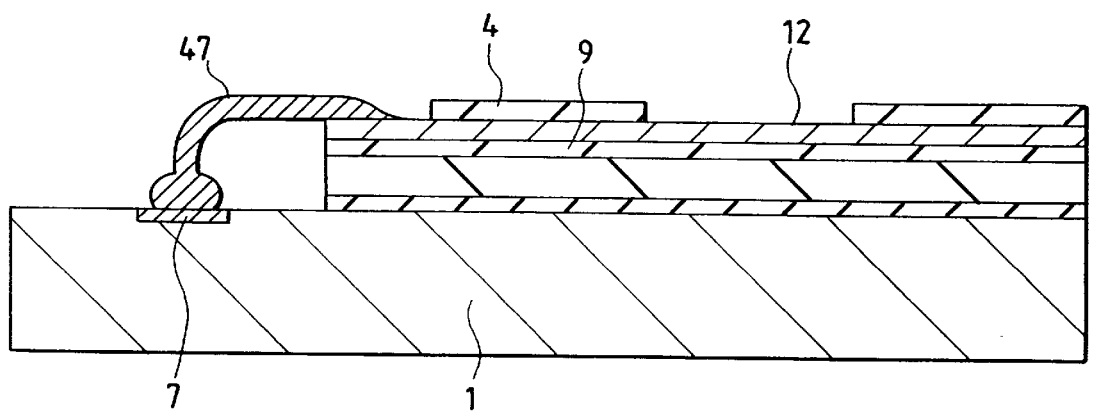
FIG. 50 is a cross sectional view illustrating a lead connection by using an Au wire, of a semiconductor integrated circuit device in the Embodiment 1 according to the present invention.

To assist in providing an explanation of the inner lead bonding technique, FIG. 43 is a cross sectional view illustrating a bonding portion produced by a standard lead bonding, FIG. 44 is a cross sectional view illustrating a bonding portion produced by using a stud bump, FIG. 45 and FIG. 46 are a cross sectional view and a plan view, respectively, illustrating a lead connection using soldering, FIG. 47 and FIG. 48 are a cross sectional view and a perspective view, respectively, illustrating a lead connection using a solder or Au ball, FIG. 49 is a cross sectional view illustrating a connection using an Al or solder wire and FIG. 50 is a cross sectional view illustrating a connection using an Au wire.

For example, in the technique studied by the present inventor, a lead 11 on which Au plating is provided is directly driven onto a bonding pad 7 and thermally press bonded using supersonic waves. In this case, if the bonding condition is poor or the shape of the bonding tool 18 is inadequate, there is the possibility of a problem in that the bonding strength is low or the bonding pad for a portion therebelow is subject to damage.

On the contrary, in the Embodiment 1, the problems, for example, of bondability or damage caused by the bonding condition and the shape of the bonding tool 18 as described above can be overcome by adopting the following feature for the bonding state.

That is, FIG. 44 shows an example of using a stud bump 43. This example has a feature of using a semiconductor chip 1 having the stud bump 43 formed previously by a plating method or a ball bonding method onto a bonding pad 7 of the semiconductor chip 1, causing the bondability to be improved and, further, preventing damage to the bonding pad.

Further, FIG. 45 and FIG. 46 are examples of a connection for the lead 11 using solder and showing a connection state in which the lead 11 is surrounded with solder 44. This example concerns a technique for connecting a bonding pad 7 comprising Al or the like of the semiconductor chip 1 and an electrode of the tape 9 such as TAB as a CSP substrate. A method of feeding the solder in this example includes a method of connecting the solder 44 with the bonding pad 7 of the semiconductor chip 1 using the tape 9 on which the solder 44 is already present so as to surround the lead 11.

For the connection method, it is desirable for the shape of the solder 44 provided on the tape 9, such as a TAB, to be made as flat as possible at the surface in contact with the bonding pad 7 of the semiconductor chip 1 in the connection method by pressurizing and heating using a bonder. Further, in a connection method using a reflow furnace, solder paste or flux is provided at the surface of the bonding pad 7 of the semiconductor chip 1 so as to be in contact with the solder 44 of the tape 9, such as a TAB.

Then, in the case of feeding the solder 44 using solder paste, the solder paste may be provided at the surface of the bonding pad 7 of the semiconductor chip 1 by printing or by using a syringe. In this case, the tape 9, such as a TAB, may be bonded previously or subsequently providing that the lead 11 of the tape 9 is in contact with the solder 44 when the tape 9 is bonded to the semiconductor chip 1.

Further, FIG. 47, FIG. 48 show a connection technique having a feature of connecting a lead 11 of a tape 9, such as a TAB, onto a bonding pad 7 of a semiconductor chip 1 by using a stud bump, such as a solder or Au ball 45.

Further, FIG. 49 shows an example of connecting a wiring 10 of a flexible wiring substrate 3 and a bonding pad 7 of a semiconductor chip 1 by using an Al or solder wire 46. Further, FIG. 50 shows an example of connecting a wiring 10 of a flexible wiring substrate 3 and a bonding pad 7 of a semiconductor chip 1 by using an Au wire 47. In the connection examples, the connection is enabled not by way of the inner lead bonding, such as a TAB, but under the concept of a typical wire bonding.

11. Lead Design Technique Capable of Forming an S-Shape with No Tool Return

Figure 51:
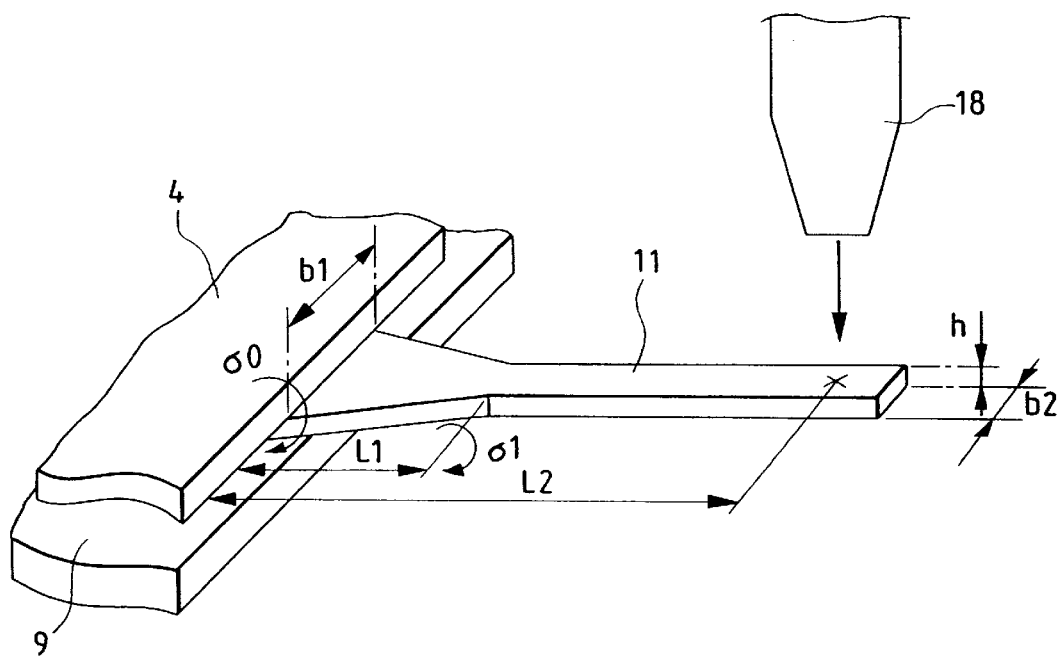
FIG. 51 is a perspective view for explaining a lead design, of a semiconductor integrated circuit device in the Embodiment 1 according to the present invention.
Figure 52:
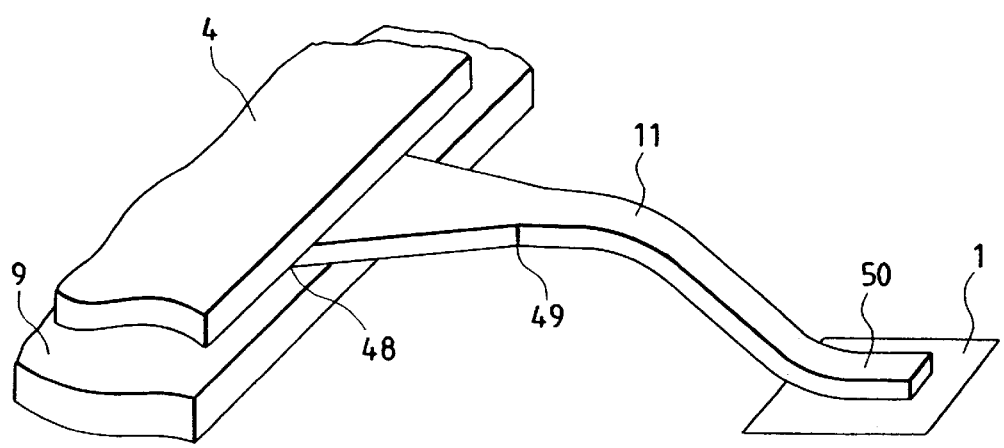
FIG. 52 is a perspective view illustrating modification of a lead after bonding, of a semiconductor integrated circuit device in the Embodiment 1 according to the present invention.

To assist in providing an explanation of the lead design technique capable of forming an S-shape with no tool return, FIG. 17 is a cross sectional view illustrating a trace of a bonding tool upon forming a standard S-shaped lead as explained previously, FIG. 51 is a perspective view for explaining the lead design, FIG. 52 is a perspective view illustrating deformation of a lead after bonding, FIG. 53 is a chart illustrating a relationship between a lead size and a bending stress ratio and FIG. 76 to FIG. 80 are cross sectional views illustrating the deformed shape of a lead in accordance with the bending stress ratio.

More particularly, as explained also in connection with the technique for the planar S-shaped lead 26 in the technique studied by the present inventor, it is necessary for forming the S-shaped configuration of the lead 11 shown in FIG. 17, to laterally displace the bonding tool 18, namely, a special bonding tool trace 25 including a tool return is required.

On the contrary, in the Embodiment 1, if the size of a lead 11 shown in FIG. 51 is defined, for example, as shown in FIG. 53, the bending stress ratio α will fall within a desired range of from 1.2 to 1.5 and a suitable S-shaped configuration for the lead 11 as shown in FIG. 52 can be formed by merely driving down the bonding tool 18 vertically with no tool return. In FIG. 52, there are shown a tape end 48, an end 49 on the side of the tape and an end 50 on the side of the chip.

For example, in the example of embodiment (1), the bending stress ratio α=1.26 at the size: taper length L1=100 μm, wiring length L2=380 μm, taper width b1=65 μm, lead width b2=38 μm and lead thickness h=18 μm. In the same manner, the ratio is 1.25 in the embodiment (2), 1.26 in the embodiment (3), 1.31 in the embodiment (4) and 1.46 in the embodiment (5).

On the contrary, in the studied technique, at the size: taper length L1=100 μm, wiring length L2=280 μm, taper width b1=60 μm, lead width b2=38 μm and lead thickness h=18 μm, the bending stress ratio α is 1.02, for example, in the example (1) and 1.13 in the example (2) which is out of the range of 1.2 to 1.5.

As described above, since the bending stress is concentrated to an intermediate portion of the lead 11 in the wiring operation within the range of the bending stress ratio α from 1.2 to 1.5, a moderately distorted satisfactory wiring state is attained. On the other hand, if the bending stress ratio α is less than 1.2 as in the studied technique, since the bending stress is concentrated at the tape end 48 of the lead 11, it results in a stiffened state. Further, if the ratio exceeds 1.5, the bending stress is concentrated only at the intermediate portion of the lead 11 resulting in a state of a small radius of curvature which can not be said to be a satisfactory wiring state.

Figure 77:
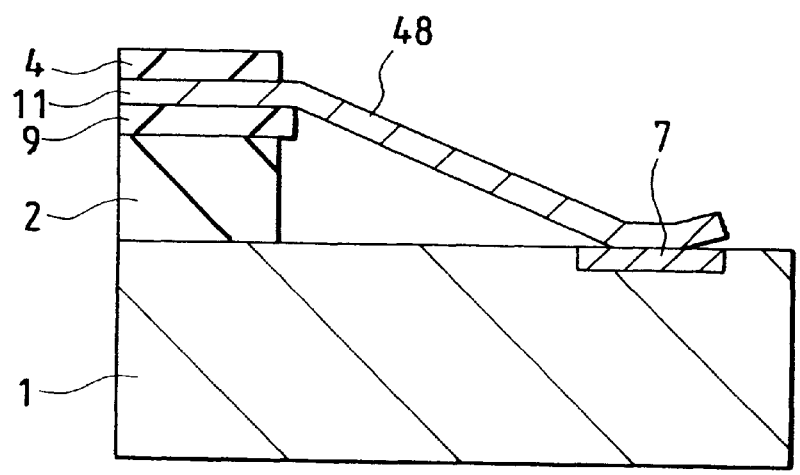
FIG. 77 is a cross sectional view illustrating the modified shape of the lead in accordance with the bending stress ratio, of the semiconductor integrated circuit device in the Embodiment 1 according to the present invention.

FIG. 76 to FIG. 80 show the deformed shape of the lead in accordance with the bending stress ratio α concretely. At first, when the bonding tool 18 is merely driven down vertically to contact the lead of initial shape before wiring shown in FIG. 76, since the bending stress is concentrated on the tape end 48 of the lead 11, for example, in the wiring operation at α<0.9, an extremely stiffened wiring state is formed as shown in FIG. 77. Accordingly, since high repeating stresses are exerted on the lead 11 during the temperature cycle after wiring, the fatigue life is extremely shortened.

Figure 78:
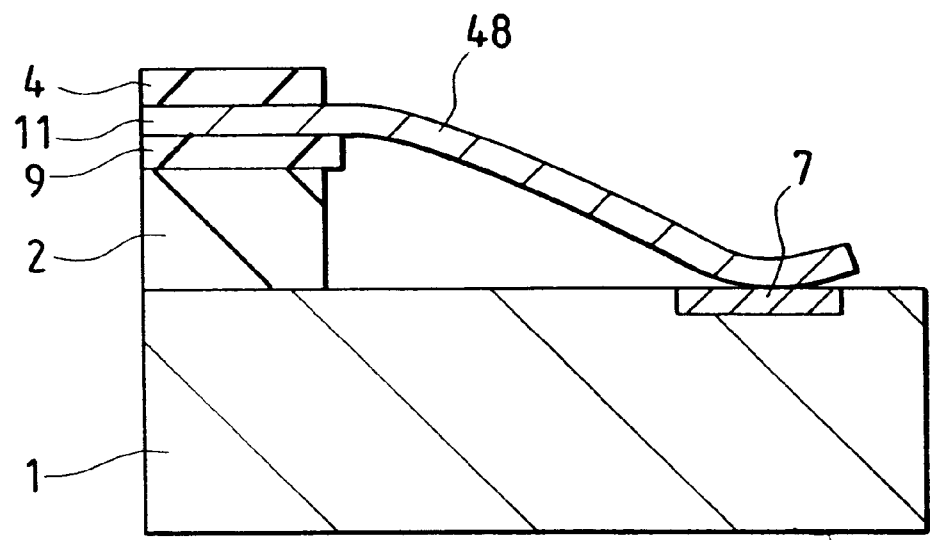
FIG. 78 is a cross sectional view illustrating the modified shape of the lead in accordance with the bending stress ratio, of the semiconductor integrated circuit device in the Embodiment 1 according to the present invention.

Further, since the bending stress is concentrated at the tape end 48 of the lead 11 in the wiring operation at 0.9≦α<1.2 as in the technique studied by the present inventor, a somewhat stiffened wiring state is formed as shown in FIG. 78. Accordingly, since high repeating stresses are exerted on the lead 11 during the temperature cycle after the wiring, fatigue life is shortened.

Figure 79:
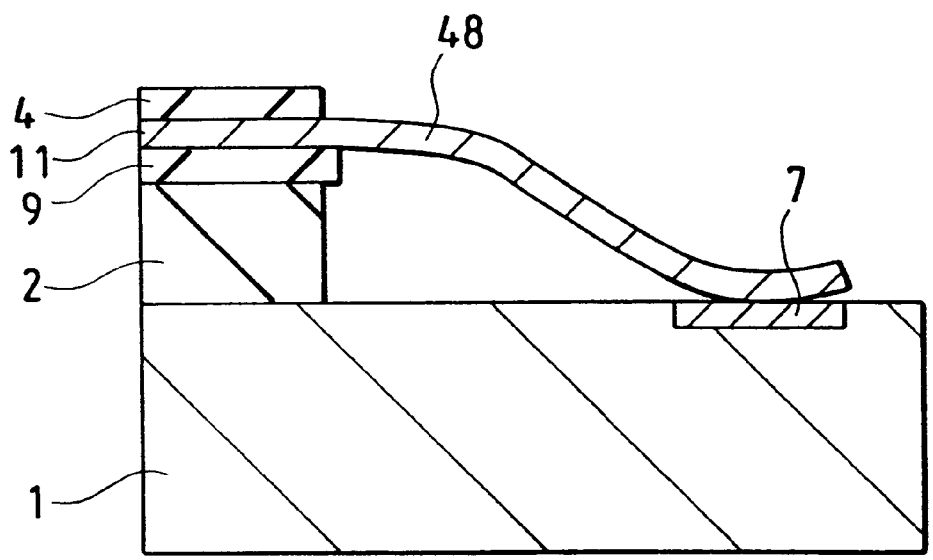
FIG. 79 is a cross sectional view illustrating the modified shape of the lead in accordance with the bending stress ratio, of the semiconductor integrated circuit device in the Embodiment 1 according to the present invention.

On the contrary, since the bending stress is concentrated at an intermediate portion of the lead 11 during the wiring operation at 1.2≦α≦1.5 as in the Embodiment 1, a moderately distorted wiring state as shown in FIG. 79 is formed. Accordingly, since no high repeating stresses are exerted on the lead 11 during the temperature cycle after the wiring, the fatigue life is increased.

Figure 80:
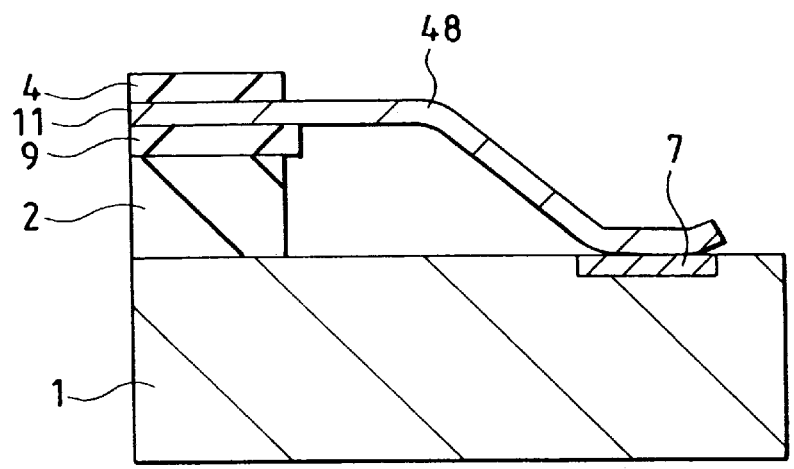
FIG. 80 is a cross sectional view illustrating the modified shape of the lead in accordance with the bending stress ratio, of the semiconductor integrated circuit device in the Embodiment 1 according to the present invention.

Further, during wiring operation at 1.5<α with an increased bending stress ratio, since the bending ratio is concentrated only at the intermediate portion of the lead 11, a wiring state with a small radius of curvature as shown in FIG. 80 is formed. Accordingly, since the initial strength of the bent portion is lowered, the fatigue life during the temperature cycle after wiring is shortened.

As a result, an optimal wiring state with only a moderately distorted wiring shape is formed when the bending stress ratio is set within a range: 1.2≦α≦1.5 as in the Embodiment 1, and the temperature cycle life of the lead 11 can be increased.

The bending stress ratio α is defined as a value formed by dividing the stress σ1 generated at the end 49 of the lead 11 on the side of the tape by a stress σ0 generated at the tape end 48 of the lead 11 upon conducting the operation of raising the lead 11 just above the bonding pad 7 with the bonding tool 18. That is, the bending stress ratio α can be represented by the following formula based on the size of the lead 11 having a feature in the tapered shape:

$$\alpha = \sigma 1/\sigma 0 = b1 \times (L2-L1)/(b2 \times L2)$$

As described above, when the size and the shape of the lead 11 are designed such that the bending stress ratio α is from 1.2 to 1.5, a stable and suitable S-shaped wiring state can be formed by a simple driving down movement of a wire bonder like that in the technique for the planar S-shaped lead 26 described previously. Accordingly, since no special soft-modified wire bonder is required and the bonding tool trace 25 can also be simplified, an effect of shortening the contact time upon bonding can also be expected.

12. Ni-Platingless Lead

Figure 54:
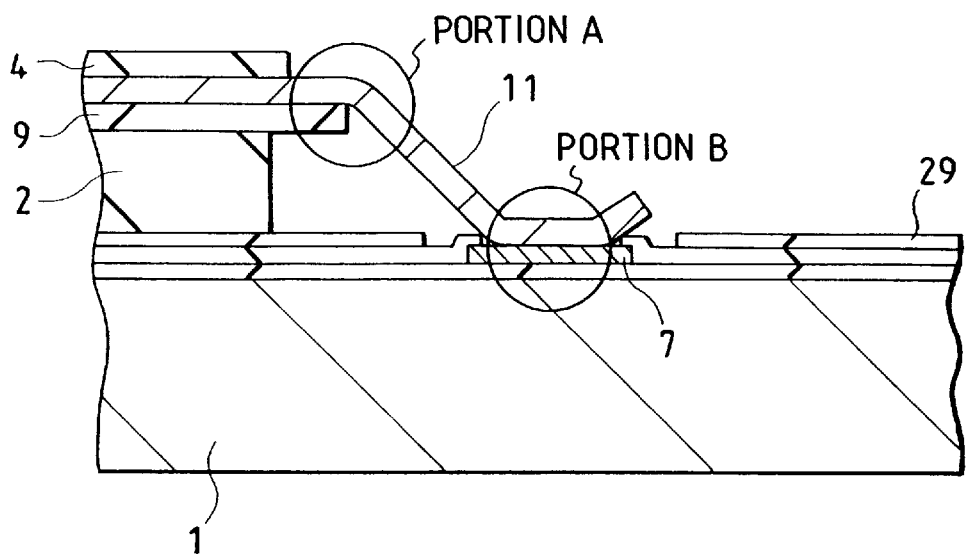
FIG. 54 is a cross sectional view illustrating a connection portion of lead connection, of a semiconductor integrated circuit device in the Embodiment 1 according to the present invention.
Figure 55:
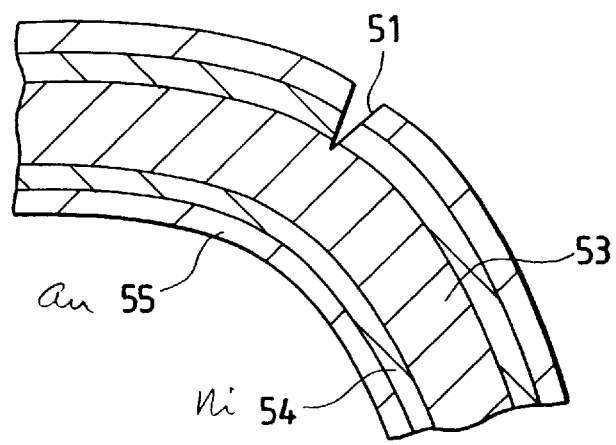
FIG. 55 is an enlarged cross sectional view illustrating a lead bent portion, of a semiconductor integrated circuit device in the Embodiment 1 according to the present invention.
Figure 56:
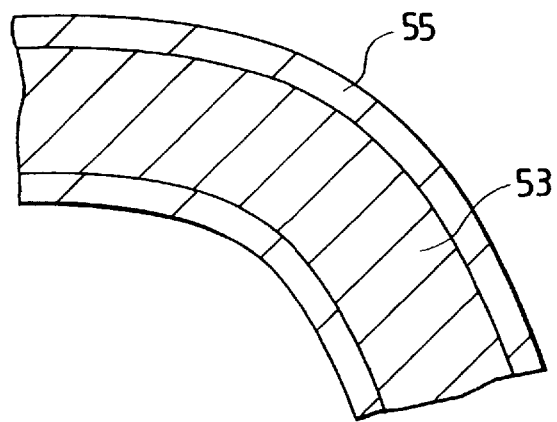
FIG. 56 is an enlarged cross sectional view illustrating a Ni-platingless lead bent portion, of a semiconductor integrated circuit device in the Embodiment 1 according to the present invention.
Figure 57:
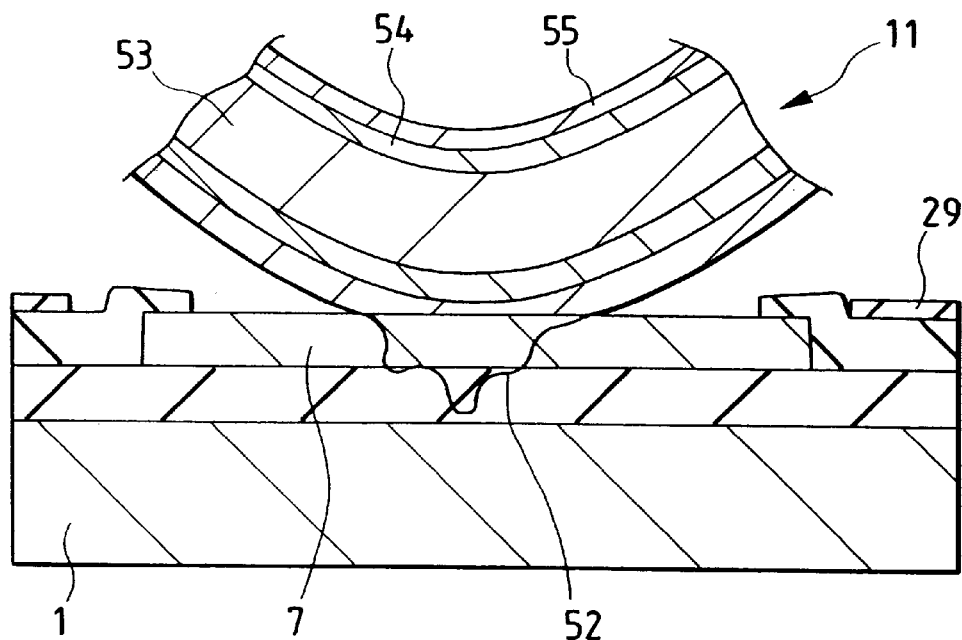
FIG. 57 is an enlarged cross sectional view illustrating a lead press contact portion, of a semiconductor integrated circuit device in the Embodiment 1 according to the present invention.
Figure 58:
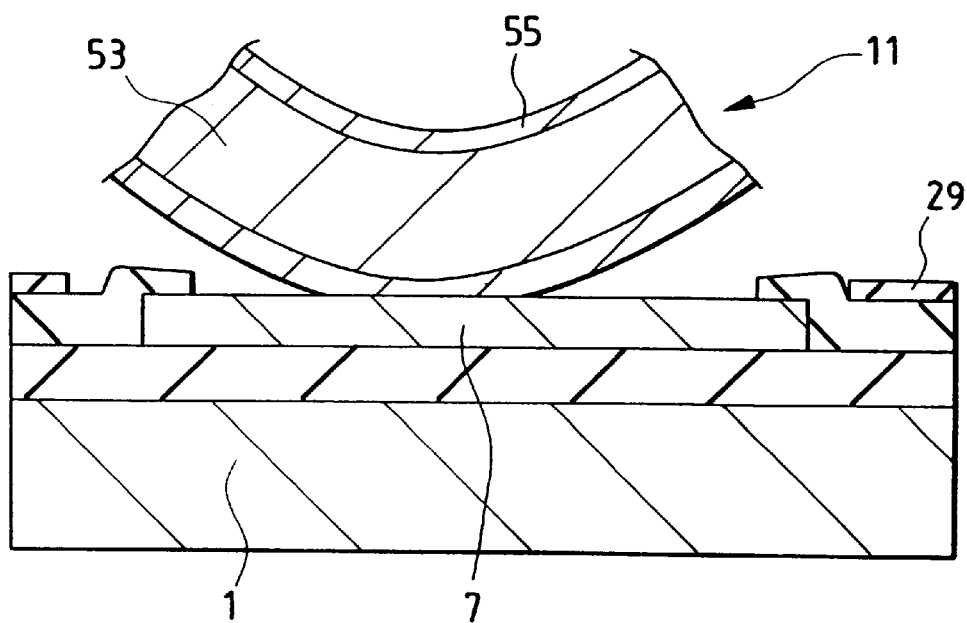
FIG. 58 is an enlarged cross sectional view illustrating a Ni-platingless lead press contact portion, of a semiconductor integrated circuit device in the Embodiment 1 according to the present invention.

To assist in providing a technical explanation of the Ni-platingless lead, FIG. 54 is a cross sectional view illustrating a connection portion of the lead, FIG. 55 is an enlarged cross sectional view illustrating a bent portion of a lead, FIG. 56 is an enlarged cross sectional view illustrating a bent portion of an Ni-platingless lead, FIG. 57 is an enlarged cross sectional view illustrating a press contact portion of a lead and FIG. 58 is an enlarged cross sectional view illustrating a press-contact portion of the Ni-platingless lead.

As an example, in the technique studied by the present inventor, in the case of a cross sectional structure of a lead 11 in which Ni-plating is applied to a surface of a Cu core and an Au plating is applied thereon, wherein a Cu core lead is employed instead of a pure Au lead, since the Ni-plating layer is hard and brittle, if it is intended to produce an S-shaped lead configuration, there is the possibility of causing a crack 51 to occur at the bent portion of the lead 11 as shown in FIG. 55, or the bonding pad 7 or a portion therebelow may be subjected to damage 52 as shown in FIG. 57. The Ni-plating is formed as a barrier layer for preventing Cu atoms from diffusing to the Au plating surface.

On the contrary, in the Embodiment 1, since both the hardness and the brittleness are reduced by using an Ni-platingless lead 11 in order to obtain the S-shaped configuration, the crack 51 is less likely to form the lead per se and, in addition, the damage 52 to the semiconductor chip 1 at the counter-bonding face can also be moderated.

That is, in the connection state of the lead 11 as shown in FIG. 54, in the lead having the constitution of a Cu core 53+Ni plating 54+Au plating 55, as shown in FIG. 55 as an enlargement of the portion A in FIG. 54, the crack 51 is liable to be caused as the radius of curvature in the bent portion is smaller. On the other hand, if the surface of the lead 11 is free from the Ni plating 54 and, for example, is formed only with the Au plating 55 as shown in FIG. 56, the crack 51 is less likely to form at the bent portion of the lead 11 even if the radius of curvature is identical with that in FIG. 55.

Further, also in a press-contact portion of the lead 11 in FIG. 57, illustrating an enlargement of the portion B in FIG. 54, the lead 11 has a constitution comprising: Cu core 53+Ni plating 54+Au plating 55, and so damage 52 is liable to be caused at the periphery of a bonding pad 7. On the other hand, if the surface of the lead 11 is free from the Ni plating 54 and, for example, is formed only with the Au plating 55 as shown in FIG. 58, the damage 52 is less likely even in a case of bonding under the same lead bonding condition.

As described above, it is possible to suppress the occurrence of a crack 51 in the lead 11 and moderate the damage 52 to the semiconductor chip 1 while obtaining the S-shaped configuration, by constituting the lead 11 such that only one plating layer, for example, an Au plating is formed on the core material of the Cu core 53.

Therefore, according to the semiconductor integrated circuit device in the Embodiment 1, excellent effects can be obtained as already explained by comparison with the package structure studied by the present inventor, in the CSP package technique of substantially the identical size with that of the semiconductor chip, in each of the technical items, namely: 1. Surface wiring structure, 2. Optimization of the tape edge position relative to the elastomer, 3. Optimization of outer size of the package, 4. Planar S-shaped lead, 5. Beam lead, 6. Peripheral PIQ size of bonding pad, 7. Improvement of anchor wiring, 8. Wide elastomer structure, 9. Elastomer groove-fillage technique, 10. Inner lead bonding technique, 11. Lead design technique capable of forming S-shaped configuration with no tool return and 12. NI-platingless lead.

In the Embodiment 1, although various explanations have been made with reference to the drawings and the contents of various techniques on the premise of a particular surface wiring structure, the technical items 2 to 12 are not limited to the described surface wiring structure, but the technique of this invention is applicable also to general package structures, such as a rear face wiring structure. Accordingly, it can be expected that the same effect as explained with reference to all of the items can be obtained when the invention is applied to a general package structure.

Figure 81:
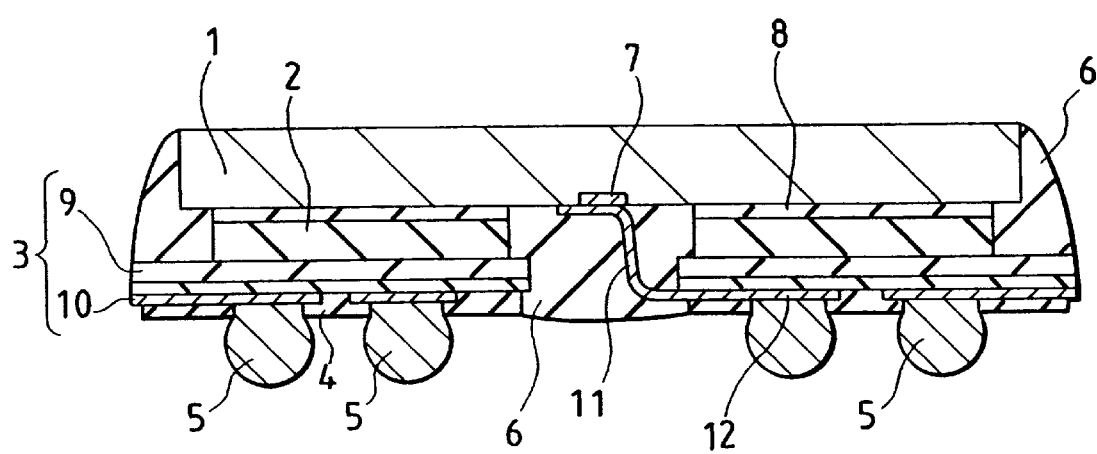
FIG. 81 is a cross sectional view illustrating a modified example of a package structure, of the semiconductor integrated circuit device in the Embodiment 1 according to the present invention.

The package structure of the Embodiment 1 (FIG. 1, FIG. 2) is shown for a case in which the elastomer 2 is larger than the outer shape of the semiconductor chip 1. In a case where the elastomer 2 is smaller than the outer shape of the semiconductor chip 1, as shown in FIG. 81, an improvement of the moisture proofness or the like can be obtained by forming a package structure in which the lateral sides of the semiconductor chip 1 and the elastomer 2 are covered with a sealant 6.

Embodiment 2

Figure 59:
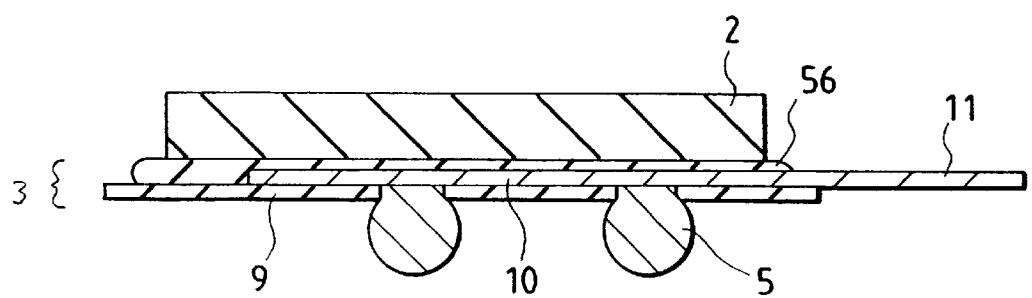
FIG. 59 is a cross sectional view illustrating a structure of a semiconductor integrated circuit device in an Embodiment 2 according to the present invention.
Figure 60:
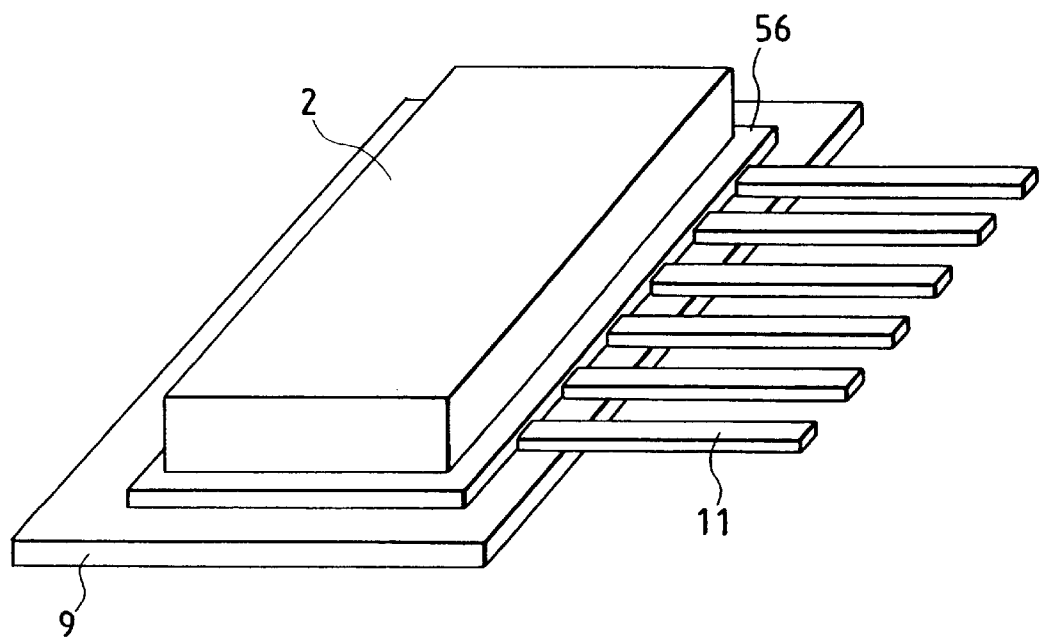
FIG. 60 is a perspective view illustrating a structure of a semiconductor integrated circuit device in the Embodiment 2 according to the present invention.

FIG. 59 and FIG. 60 are a cross sectional view and a perspective view, respectively, illustrating a rear face wiring solder resist structure in the semiconductor integrated circuit device of Embodiment 2 according to the present invention.

The semiconductor integrated circuit device of the Embodiment 2 is a ball grid array type semiconductor package like that of the Embodiment 1, but it is different from the Embodiment 1 in that it is not based on the surface wiring technique, but is based on and provided for improving a rear face wiring structure. For instance, as shown in FIG. 59 and FIG. 60, in a structure comprising an elastomer 2 (elastic structural material) bonded on a main surface of a semiconductor chip (not shown) and a flexible wiring substrate 3 (wiring substrate) bonded to a main surface of the elastomer 2, a solder resist 56 (insulation film) is formed on the rear face of the flexible wiring substrate 3.

That is, the flexible wiring substrate 3 comprises a tape 9 (substrate base material) serving as a base material for the flexible wiring substrate 3 and wirings 10 bonded to the rear face of the tape 9, in which the rear face of the wiring 10 is bonded by way of the solder resist 56 to the elastomer 2. The solder resist 56 is composed of an insulation material, such as a light sensitive epoxy resin like that in the Embodiment 1.

The feature of the package structure of the semiconductor integrated circuit device in the Embodiment 2 will be explained, including the structure and the process of manufacture in comparison with a package structure employing a technique studied by the present inventor.

For instance, in the rear face wiring structure shown in FIG. 7, in the Embodiment 1 as the technique studied by the present inventor, since the elastomer 2 is formed directly on the main surface of the wirings 10 of the flexible wiring substrate 3, low molecular weight ingredients of the elastomer 3 bleed directly to the lead 11 and if they bleed as far as the bonding point of the lead 11, there is a likelihood of extremely deteriorating the bondability (wire bonding stress) due to the contamination.

Further, compared with the direct plating surface of the lead 11, the surface of the tape 9 in which the wirings 10 are etched out between the leads 11 suffers from violent bleeding since the surface of the tape 9 is roughened also with an aim of improving the bondability between the tape 9 and the wirings 10, and bleeding tends to be most violent at the edge portion of the lead 11 together with the effect of the surface tension.

Further, in the rear face wiring structure in which the elastomer 2 is formed on an uneven surface of the wirings 10 caused by different levels between the portions with or without the wirings 10, voids are liable to be left, for example, in the gap between the wirings, which may cause a degrading of the reliability.

On the contrary, in the Embodiment 2, since the solder resist 56 is formed on the wirings 10 after forming the wirings 10 in the manufacturing step for the flexible wiring substrate 3, direct contact of the elastomer 2 with the wirings 10 can be prevented. In the same manner, contact of the elastomer 2 to the roughened surface of the tape 9 can also be prevented. This can suppress bleeding of the low molecular weight ingredients of the elastomer 2.

Further, by coating the solder resist 56 on the uneven surface of the wirings 10 of the flexible wiring substrate, the surface of the wirings 10 is flattened to avoid a disadvantage, such as the creation of voids upon forming the elastomer 2.

Accordingly, in the semiconductor integrated circuit device of the Embodiment 2, since the solder resist 56 is formed on the wirings 10 of the flexible wiring substrate 3 in the CSP semiconductor package technique based on the rear face wiring structure, it is possible to prevent the lowering of the bondability while preventing contamination to the lead 11, thereby providing a package structure of high reliability with no voids.

Embodiment 3

Figure 61:
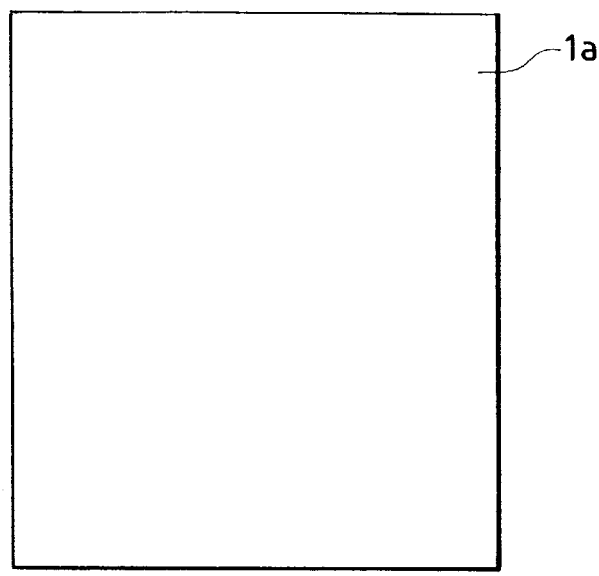
FIG. 61 is a plan view, as viewed from the rear face of a semiconductor chip, of a semiconductor integrated circuit device in the Embodiment 3 according to the present invention.
Figure 62:
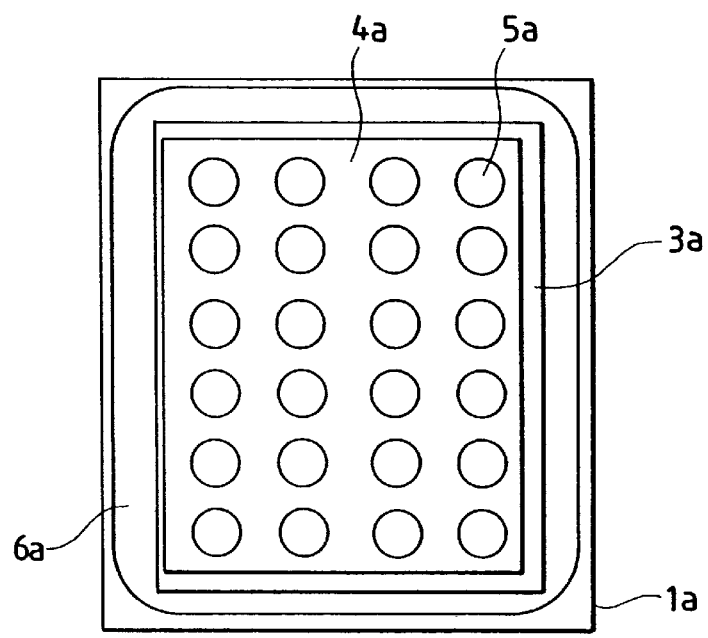
FIG. 62 is a plan view illustrating a semiconductor integrated circuit device in the Embodiment 3 according to the present invention.
Figure 63:
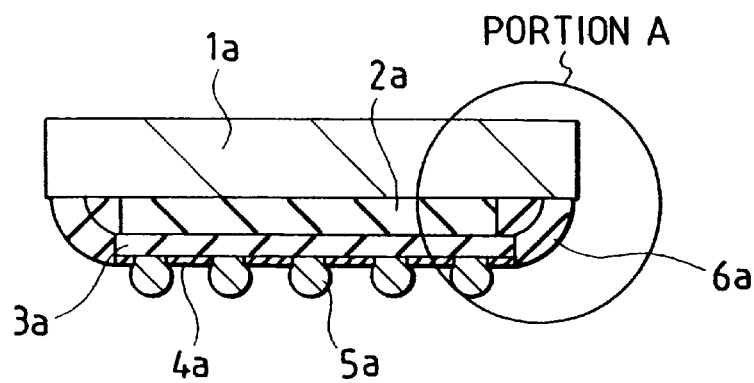
FIG. 63 is a cross sectional view illustrating a semiconductor integrated circuit device in the Embodiment 3 according to the present invention.
Figure 64:
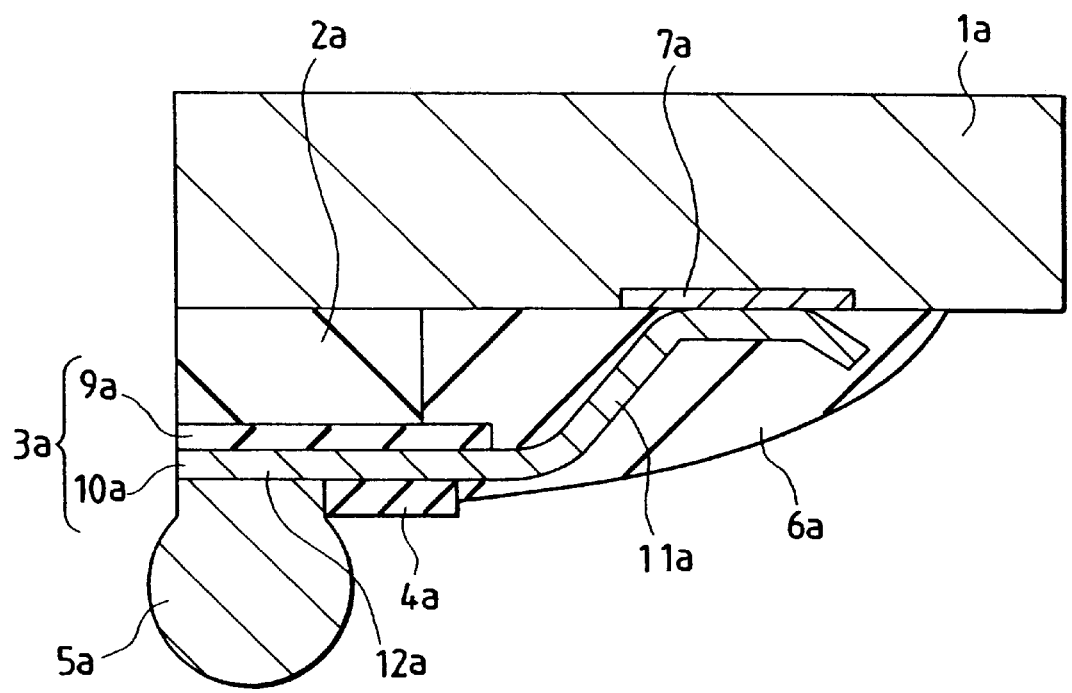
FIG. 64 is an enlarged cross sectional view illustrating a portion A in FIG. 63, of a semiconductor integrated circuit device in the Embodiment 3 according to the present invention.
Figure 65:
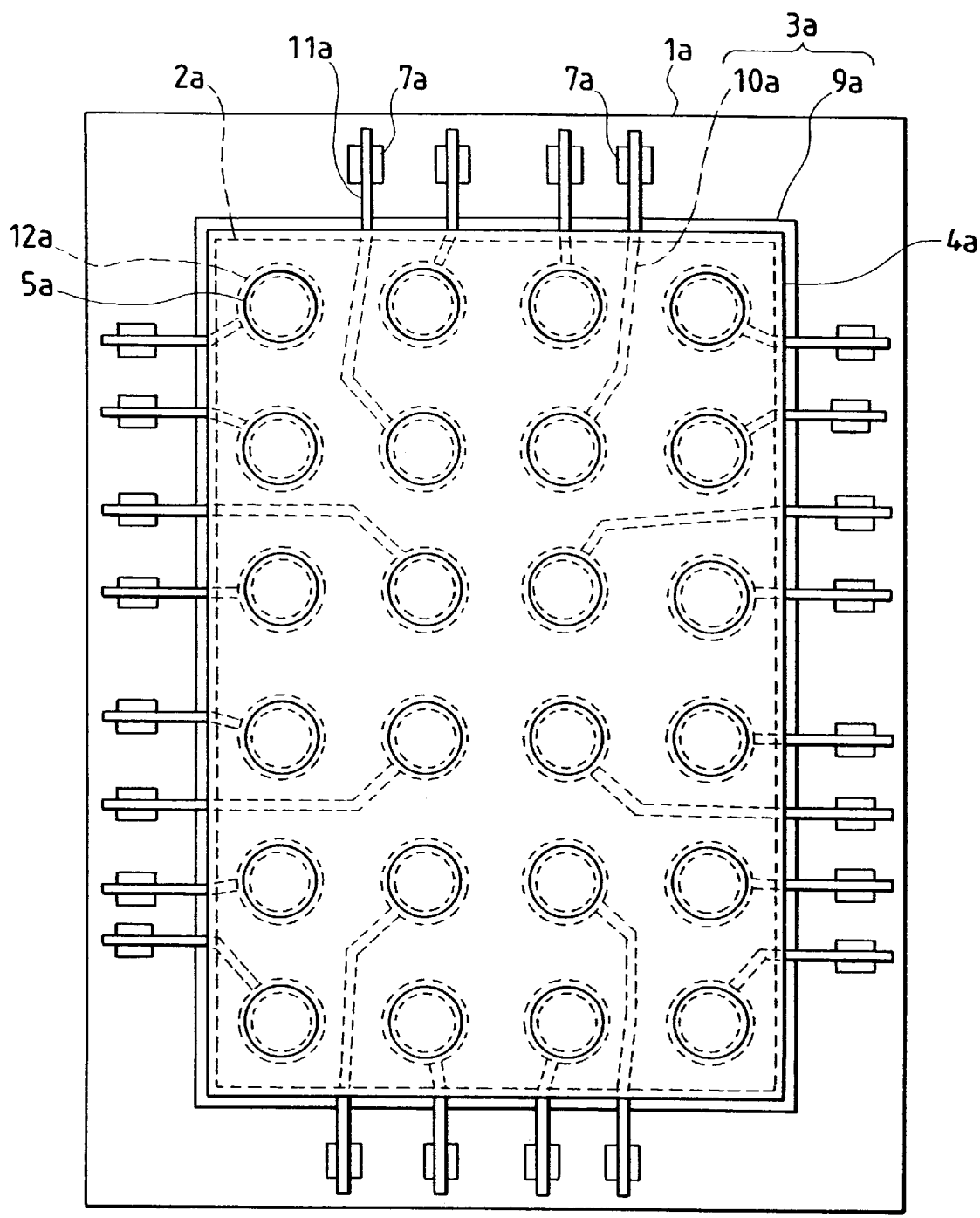
FIG. 65 is a plan view for explaining a wiring structure of a wiring substrate, of a semiconductor integrated circuit device in the Embodiment 3 according to the present invention.

FIG. 61 is a plan view of a semiconductor integrated circuit device forming an Embodiment 3 according to the present invention, as viewed from the rear face of a semiconductor chip, FIG. 62 is a plan view thereof, FIG. 63 is a cross sectional view thereof, FIG. 64 is an enlarged cross sectional view of a portion A in FIG. 63 and FIG. 65 is a plan view for explaining the wiring structure of the wiring substrate.

A semiconductor integrated circuit device in the Embodiment 3 adopts, instead of a semiconductor package having a structure in which the bonding pad is formed approximately at the center of the chip, as in the Embodiments 1 and 2 described above, a packaging structure using a semiconductor chip 1a in which a pad is formed to the periphery of the chip, as shown in FIG. 61 to FIG. 65, and in which bumps 5a connected to the bonding pads to the semiconductor chip 1a are disposed in a region inward of the outer circumference of the semiconductor chip 1a. The Embodiment 3 also has a structure which adopts the techniques from "1. Surface wiring structure" to "12. Ni-platingless lead" of Embodiment 1, as well as the technical features of each of the technical items for the rear face wiring solder resist structure as explained with reference to the Embodiment 2.

That is, the semiconductor integrated circuit device in the Embodiment 3 is, for example, a 24 pin ball grid array type semiconductor package structure, in which an elastomer 2a (elastic structural material), a flexible wiring substrate 3a (wiring substrate) having wirings 10a formed on a tape 9a and a solder resist 4a (insulation film) are disposed on a main surface of a semiconductor chip 1a formed with a plurality of bonding pads 7a (external terminals), solder bumps 5a (bump electrodes) are formed to an opening of the solder resist 4a, and a portion for forming the bonding pads 7a and lateral sides of the elastomer 2a and the flexible wiring substrate 3a are covered with a sealant 6a.

The semiconductor chip 1a has a peripheral pad structure, for example, as shown in FIG. 65, in which a plurality of bonding pads 7a are arranged in a square pattern along the outer circumference of the semiconductor chip 1a. Each bonding pad 7a of the semiconductor chip 1a is connected electrically with a solder bump 5a by way of the wiring 10a of the flexible wiring substrate 3a, which is connected at one end of the lead 11a to the pad 7a and joined at the bump land 12a at the other end of the wiring 10a to the bump 5a. The solder bumps 5a are arranged as a 6 row×4 column matrix in a region inward of the arrangement for the bonding pads 7a.

Accordingly, in the semiconductor integrated circuit device of the Embodiment 3, excellent effects can be obtained for each of the technical items as explained for the Embodiments 1 and 2, although there is a difference in the semiconductor package structure relating to the fan-in peripheral pads. Particularly, in the fan-in package structure, a CSP structure package about the same size as the semiconductor chin 1a can be attained similar to that in the Embodiments 1 and 2.

Embodiment 4

Figure 66:
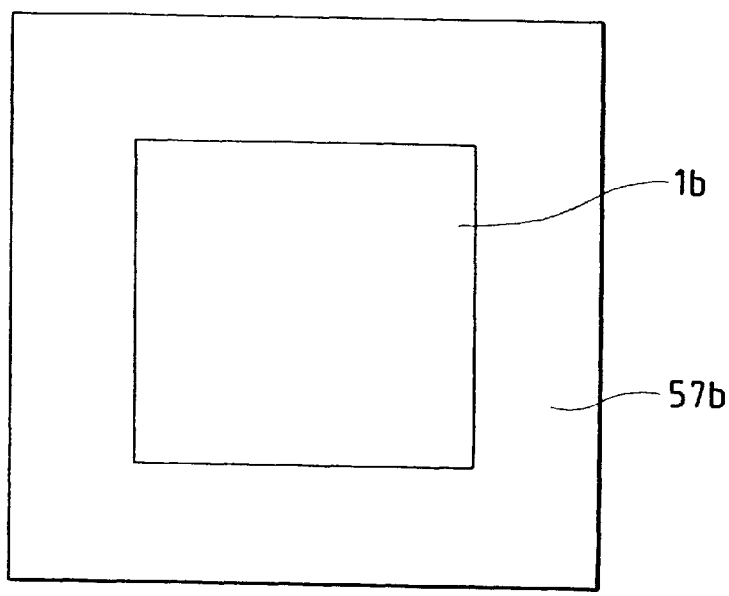
FIG. 66 is a plan view, as viewed from the rear face of a semiconductor chip, of a semiconductor integrated circuit device as an Embodiment 4 according to the present invention.
Figure 67:
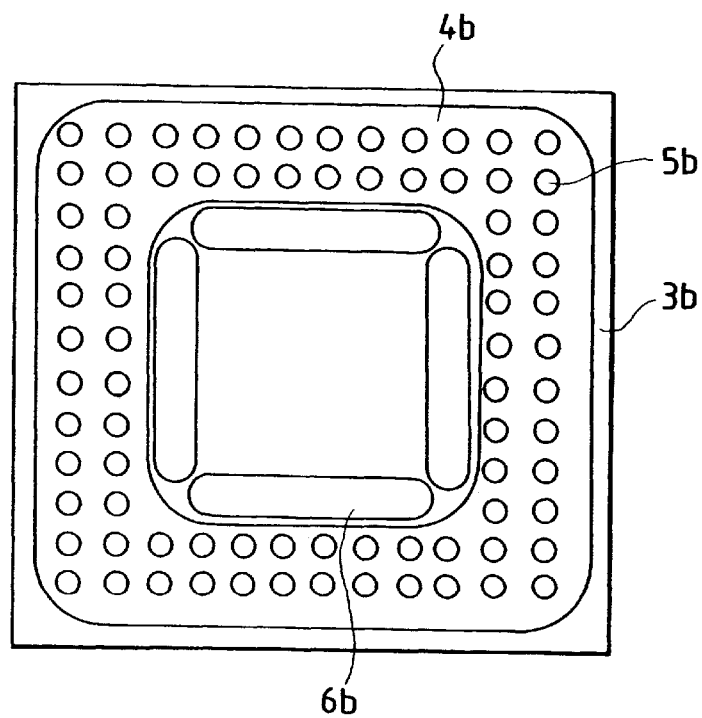
FIG. 67 is a plan view illustrating a semiconductor integrated circuit device in the Embodiment 4 according to the present invention.
Figure 68:
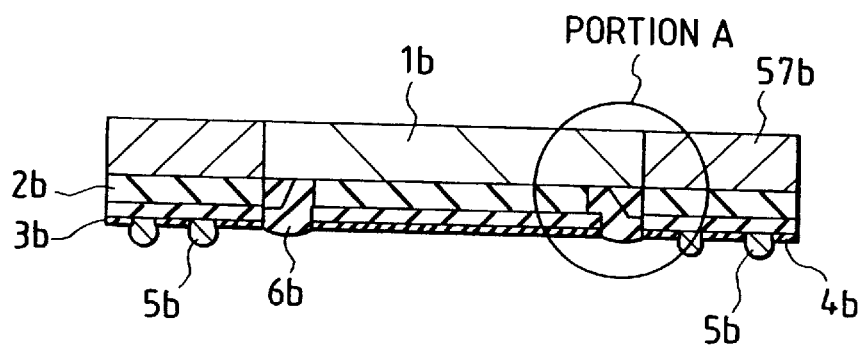
FIG. 68 is a cross sectional view illustrating a semiconductor integrated circuit device in the Embodiment 4 according to the present invention.
Figure 69:
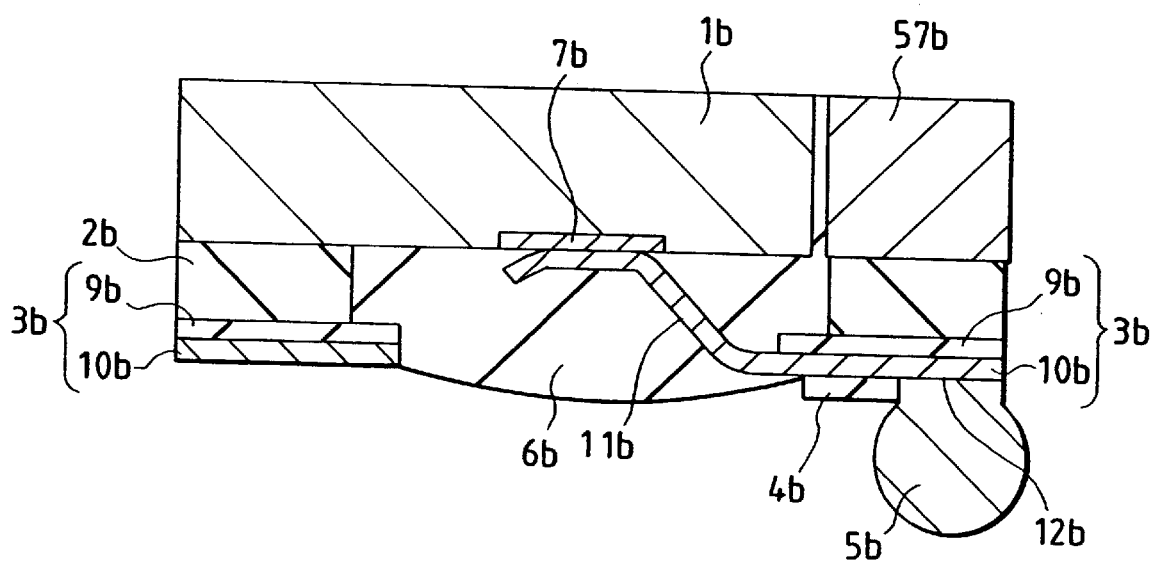
FIG. 69 is an enlarged cross sectional view illustrating a portion A in FIG. 68, of a semiconductor integrated circuit device in the Embodiment 4 according to the present invention.
Figure 70:
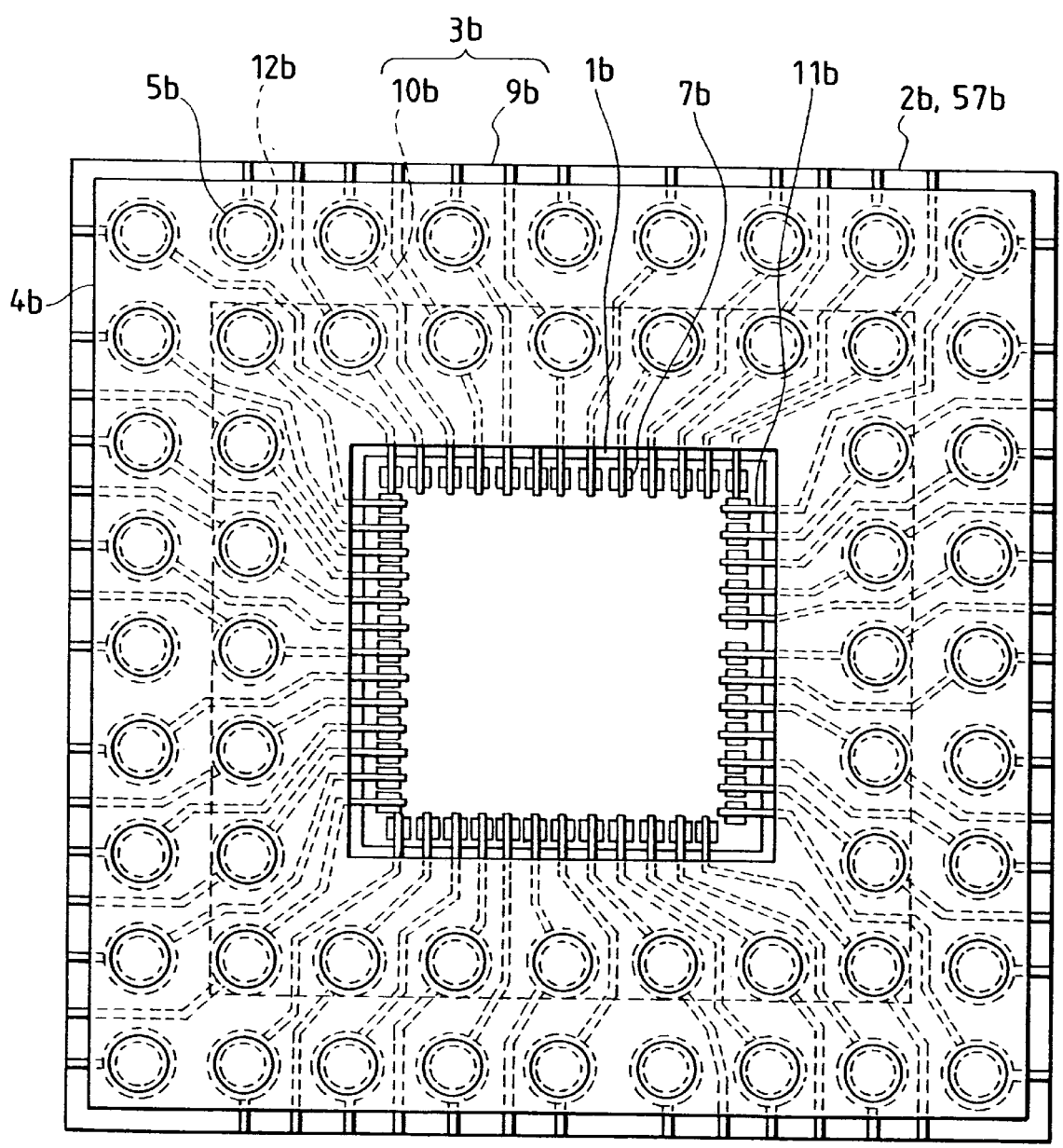
FIG. 70 is a plan view for explaining a wiring structure of a wiring substrate, of a semiconductor integrated circuit device in the Embodiment 4 according to the present invention.

FIG. 66 is a plan view of a semiconductor integrated circuit device forming an Embodiment 4 of the present invention as viewed from the rear face of the semiconductor chip, FIG. 67 is a plan view thereof, FIG. 68 is a cross sectional view thereof, FIG. 69 is an enlarged cross sectional view illustrating a portion A in FIG. 68 and FIG. 70 is a plan view for explaining the wiring structure of a wiring substrate.

The semiconductor integrated circuit device of the Embodiment 4 adopts, instead of a semiconductor package having a structure in which the bump electrodes are disposed in the chip area as in the Embodiments 1 and 2, a package structure using a semiconductor chip 1b of a peripheral pad structure as shown in FIG. 66 to FIG. 70, in which bumps 5b connected to the bonding pads of the semiconductor chip 1b are disposed to a region outward of the outer circumference of the semiconductor chip 1b. This Embodiment 4 also has a structure for adopting the technique from "1. Surface wiring structure" to "12. Ni-platingless lead", as explained for the Embodiment 1, as well as the features for each of the technical items of the rear face wiring solder resist structure explained for the Embodiment 2, respectively.

That is, the semiconductor integrated circuit device of the Embodiment 4 has, for example, a 80 pin ball grid array type semiconductor type package structure in which an elastomer 2b (elastic structural material), a flexible wiring substrate 3b (wiring substrate) having wirings 10b formed on a tape 9b, and a solder resist 4b (insulation film) are disposed on a main surface of a semiconductor chip 1b formed with a plurality of bonding pads 7b (external terminals), solder bumps 5b (bump electrodes) are formed to an opening portion of the solder resist 4b, portions for forming bonding pads 7b are covered with the sealant 6b, and a support ring 57b is disposed to the lateral side of the semiconductor chip 1b to constitute a package structure.

The semiconductor chip 1b has a peripheral pad structure, for example, as shown in FIG. 70, and a plurality of bonding pads 7b are arranged in a square pattern along the outer circumference of the semiconductor chip 1b. Each bonding pad 7b of the semiconductor chip 1b is connected electrically with a solder bump 5b by way of the wiring 10b of the flexible wiring substrate 3b, which is connected at one end of the lead 11b with the pad 7b and joined at the bump land 12b at the other end with the bump 5b. The solder bumps 5b are arranged in two rows in a square pattern concentric to the arrangement of the bonding pads 7b of the semiconductor chip 1b.

Accordingly, the semiconductor integrated circuit device of the embodiment 4 can also provide excellent effects for each of the technical items as explained for the Embodiments 1 and 2, although having a different semiconductor package structure of fan-out peripheral pad configuration. Particularly, the fan-out package structure can provide a package structure corresponding to multi-pin arrangements, although the size of the semiconductor package is increased compared with the Embodiments 1 and 2.

Embodiment 5

Figure 71:
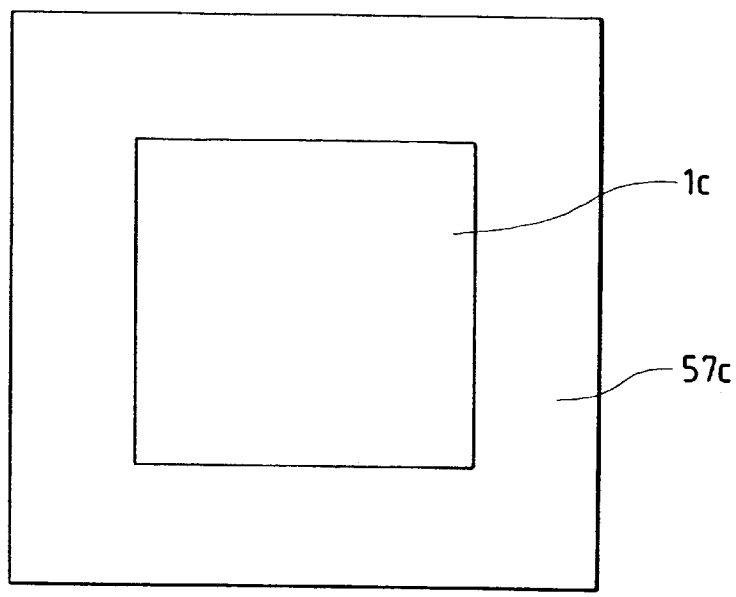
FIG. 71 is a plan view, as viewed from the rear face of a semiconductor chip, of a semiconductor integrated circuit device in the Embodiment 5 according to the present invention.
Figure 72:
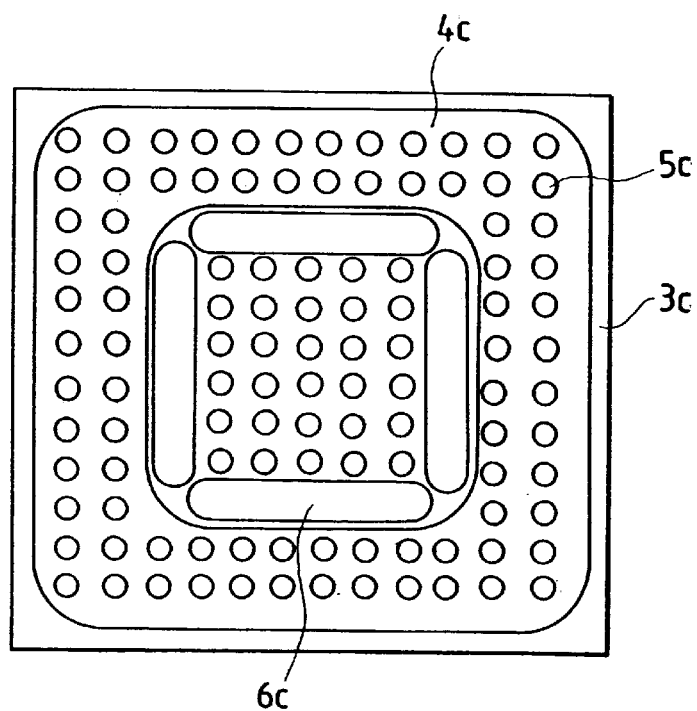
FIG. 72 is a plan view illustrating a semiconductor integrated circuit device in the Embodiment 5 according to the present invention.
Figure 73:
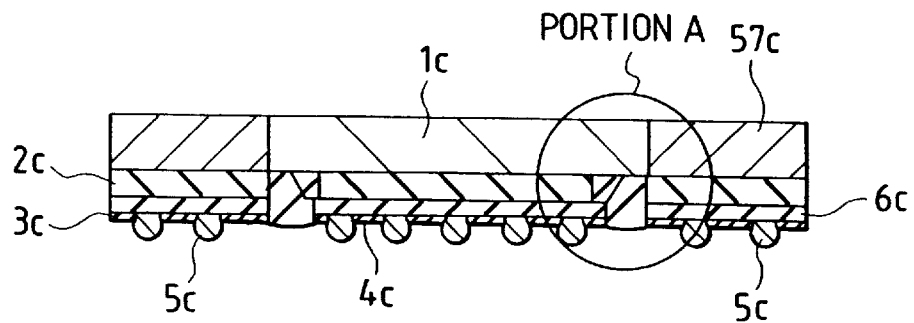
FIG. 73 is a cross sectional view illustrating a semiconductor integrated circuit device in the Embodiment 5 according to the present invention.
Figure 74:
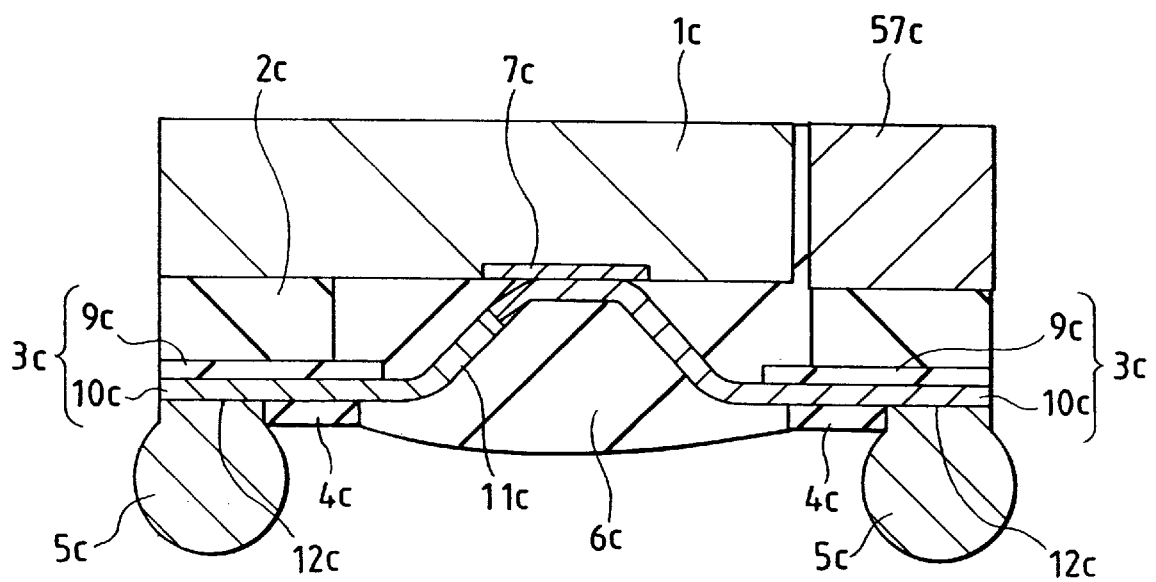
FIG. 74 is an enlarged cross sectional view illustrating a portion A in FIG. 73, of a semiconductor integrated circuit device in the Embodiment 5 according to the present invention.
Figure 75:
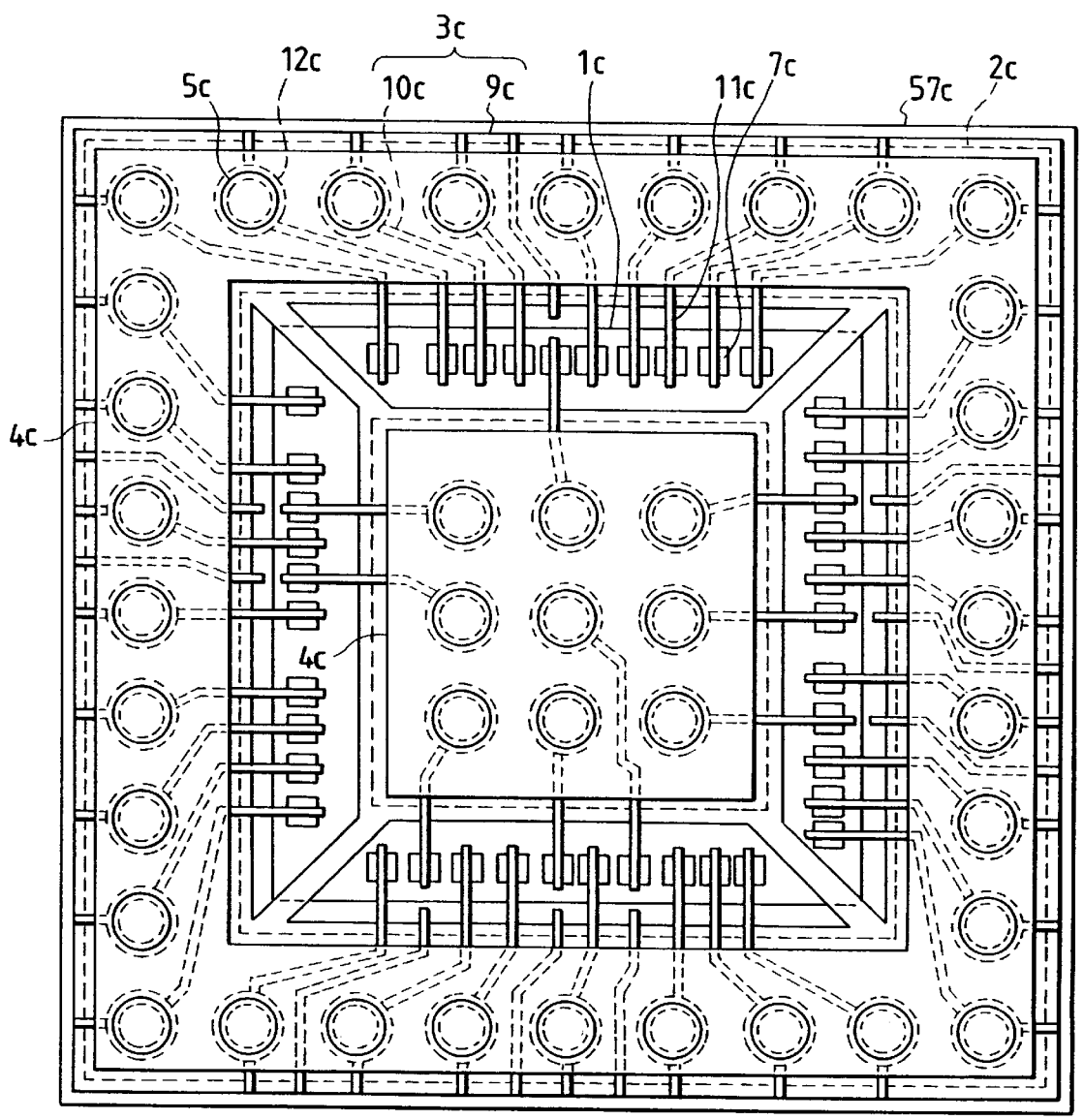
FIG. 75 is a plan view for explaining a wiring structure of a wiring substrate, of a semiconductor integrated circuit device in the Embodiment 5 according to the present invention.
Figure 76:
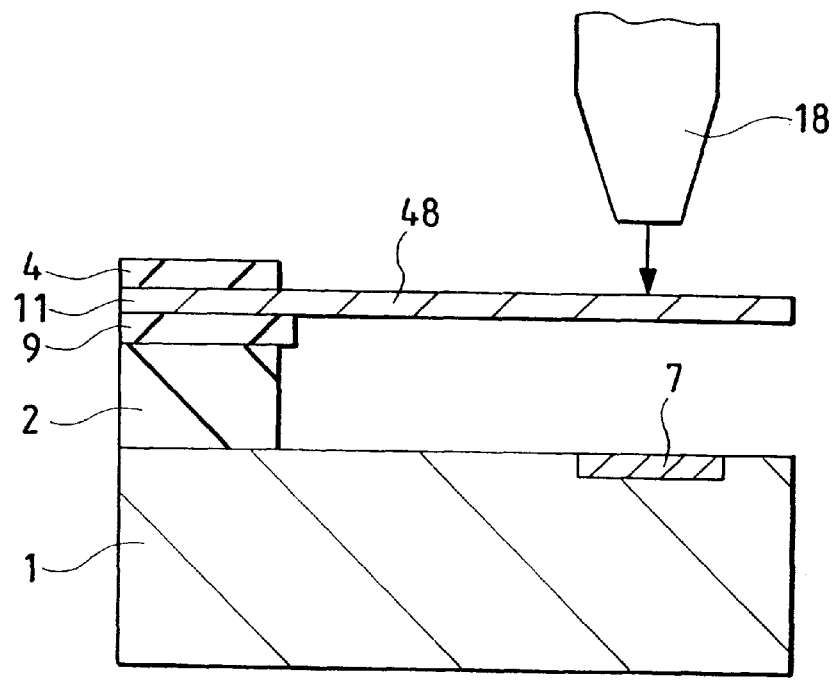
FIG. 76 is a cross sectional view illustrating the modified shape of the lead in accordance with the bending stress ratio in a comparative explanation between the semiconductor integrated circuit device in the Embodiment 1 according to the present invention and the semiconductor circuit device studied by the present inventors.

FIG. 71 is a plan view of a semiconductor integrated circuit device forming an Embodiment 5 of the present invention as viewed from the rear face of the semiconductor chip, FIG. 72 is a plan view thereof, FIG. 73 is a cross sectional view thereof, FIG. 74 is an enlarged cross sectional view illustrating a portion A in FIG. 73 and FIG. 75 is a plan view for explaining the wiring structure of a wiring substrate. In FIG. 75, a portion, such as a number of the bonding pads and solder bumps, is omitted for simplification in order to make the arrangement of the wirings clearer.

The semiconductor integrated circuit device of the Embodiment 5 adopts, instead of a semiconductor package having a structure in which bump electrodes are disposed in the area of the chip as in the Embodiments 1 and 2, a package structure using a peripheral pad structure semiconductor chip 1c as shown in FIG. 71 to FIG. 75, in which solder bumps 5c connected to the bonding pads of the semiconductor chip 1c are disposed both in inner and outer regions of the semiconductor chip 1c. This Embodiment 5 also has a structure adopting the technique from "1. Surface wiring structure" to "12. Ni-platingless lead" as explained for the Embodiment 1, as well as features for each of the technical items of the rear face wiring solder resist structure, as explained for the Embodiment 2.

That is, the semiconductor integrated circuit device in the Embodiment 5 is, for example, a 110 pin ball grid array type semiconductor package structure in which an elastomer $2c$ (elastic structural material), a flexible wiring substrate $3c$ (wiring substrate) having wirings $10c$ formed on a tape $9c$, and a solder resist $4c$ (insulation film) on a main surface of a semiconductor chip $1c$ formed with a plurality of bonding pads $7c$ (external terminals), solder bumps $5c$ (bump electrodes) are formed to an opening portion of the solder resist $4c$, a portion of forming the bonding pads $7c$ is covered with a sealant $6c$ and a support ring $57c$ is disposed to the lateral sides of the semiconductor chip $1c$.

The semiconductor chip $1c$ has a peripheral pad structure, for example, as shown in FIG. 75 (actual arrangement in FIG. 72) in which a plurality of bonding pads $7c$ are arranged in a square pattern along the outer circumference of the semiconductor chip $1c$. Each bonding pad $7c$ of the semiconductor chip $1c$ is electrically connected to a solder bump $5c$ by way of the wiring $10c$ of the flexible wiring substrate $3c$ that is connected by a lead $11c$ at one end to the pad $7c$ and joined to the bump $5c$ at the bump land $12c$ at the other end of the wiring $10c$. The solder bumps $5c$ are arranged as 6 row×5 column array in a region inward of the arrangement of the bonding pads $7c$ of the semiconductor chip $1c$, and are arranged in two rows in a square pattern also in the outer region.

Accordingly, the semiconductor integrated circuit device of the Embodiment 5 can also obtain the same excellent effect in each of the technical items as explained for the Embodiments 1 and 2, although there is a difference in the semiconductor package structure. Particularly, in the fan-in/out package structure, a package structure capable of coping with multi-pin arrangements can be adopted, although the size of the semiconductor package is enlarged compared with the Embodiments 1 and 2.

While the invention made by the present inventor has been explained with reference to the Embodiments 1–5 of the invention, the present invention is not restricted only to those embodiments, but it will be apparent that various modifications are possible within a range not departing from the gist thereof.

For example, the techniques in the Embodiments 1–5 can be combined as required.

The number of the solder bumps serving as external connection terminals of the semiconductor package and the bonding pads serving as external terminals of the semiconductor chip electrically connected with the solder bumps are not restricted only to those described in connection with the embodiments, but they may be properly modified depending on or in accordance with the specification of the packages, such as the integrated circuits formed on the semiconductor chip.

Further, regarding the materials, for example, for the elastomer forming the elastic structural material, the tape for the flexible wiring substrate, the wiring and lead plating, the solder resist serving as the insulation film and the solder bump serving as a bump electrode, the invention is also applicable in a case of using other materials having respective properties.

For example, as the solder resist, there can be mentioned a resin mixture comprising an acrylic resin and an epoxy resin, the resin mixture described above with addition of a filler, melamine, acryl, polystyrol and polyimide, as well as polyurethane and silicone; although, it is necessary that they have a property of withstanding the soldering temperature and have a resistance to the exposure of a flux and a cleaning solvent.

Advantageous effects obtained by typical examples among those disclosed in accordance with the present invention are briefly explained below.

(1) Since the elastic structural material is disposed on the flat surface on the rear face of the substrate base material by adopting a surface wiring structure in which the elastic structural material is disposed on the rear face of the substrate base material of the wiring substrate, and the insulation film is formed on the main surface of the wirings formed on the main surface of the substrate base material, the elastic structural material can be mounted with a higher accuracy and stably to the substrate base material in a voidless manner and, since the size and the shape of the elastic structural material are made stable, the bonding step for the semiconductor chip is also stable, thereby enabling assembling at a higher yield.

(2) Since the signal wiring layer and the power source ground wiring layer can be separated into different layers by making the wirings of the wiring substrate into a multi-wiring layer structure, an excellent electric characteristic in view of noise resistance can be attained.

(3) Since external terminals of the semiconductor chip can be disposed at the central portion or the peripheral portion, and the bump electrodes connected to the external terminals can be disposed to the inside, outside or both of the regions outward of the outer circumference of the semiconductor chip, the invention is applicable to package structures of various types and variations.

(4) Since the edge position of the substrate base material can be optimized relative to the elastic structural material by setting the distance between the end of the elastic structural material of the semiconductor chip on the side of the external terminals and the end of the substrate base material of the wirings substrate based on the ingredients of the elastic structural material, a variation in the height of the bump electrodes is not caused, thereby avoiding any difficulty in filling the sealant caused by an enlarged sealing region for the opening of the elastic structural material and it is possible to prevent contamination of wirings caused by the bleeding of ingredients or evaporative ingredients of the elastic structural material.

(5) Since the outer size of the package can be optimized by setting the relation for the distance M2 between the end of the substrate base material of the wiring substrate and the end of the elastic structural material and for the distance M1 between the end of the semiconductor chip and the end of the substrate base material at the outer circumference of the semiconductor integrated circuit device within a range: M1>M2>0, the outermost circumference of the package is not formed by the semiconductor chip, so that a possibility of inducing chip cracks is reduced during the assembling step, as well as during withdrawal and insertion of receptacles and tray transportation, and the circuit surface of the semiconductor chip is not exposed to the outside, thereby making it possible to improve the reliability. Further, since the peripheral protrusions of the elastic structural material after printing do not interfere with the bonding portion of the semiconductor chip, it is possible to prevent bonding failure upon appending the chip, worsening of the flatness of the wiring substrate and lowering of the reliability.

(6) Since the planar S-shaped wiring can be obtained by forming the wiring of the wiring substrate such that the fixed portion with the substrate base material and top end portion connected to the external terminal of the semiconductor chip are displaced at least by more than the width of the wiring, a stable and suitable S-shaped lead can be formed because a sag due to the original planar S-shaped configuration can be obtained by a simple driving down movement of a typical wire bonder, so that a stable S-shaped configuration can be formed for the lead with no requirement of a soft-modified special wire bonder, and further, the contact time upon bonding can also be shortened since the bonding tool trace can also be simplified.

(7) Since the beam wiring can be attained by forming the wiring of the wiring substrate as a cantilever structure which is fixed at one end to the substrate base material, it is possible to overcome such problems as occur in notched wirings wherein cutting is often impossible during bonding due to the variation of the size of the notches and, even if the wiring can be cut, it may be cut at a portion different from the desired notch, or it may be cut before the plating step for the wiring substrate because of the excessively narrowed portion, thereby failing to deposit plating.

(8) Since the end of the opening of the surface protection film on the semiconductor chip is set to a size within a range wherein the wiring does not interfere with the surface protection film when the bonding tool is driven down, it is possible to overcome the problem that the surface protection film or the semiconductor chip suffers from damages (on the semiconductor chip) by the driving down pressure of the tool, and the ingredients of the surface protection film are prevented from being deposited on the bonding portion at the lower surface of the lead to cause contamination and to worsen the bondability.

(9) Since the effective area of the wired portion can be enlarged by connecting the wiring on the notch terminal end of the wiring substrate to an opposing land portion of the wiring, longitudinally or laterally extending the wiring in the vacant regions of the wirings or connecting the adjacent wirings to each other, it is possible to increase the bonding strength between the wiring and the substrate base material and obtain a stable notch cutting performance.

(10) Since a wide elastic material structure can be attained by forming the elastic structural material in a larger range over the entire circumference at least by more than the width of the protrusions on the outer circumference formed in the elastic structural material as compared with the outer size of the semiconductor chip, protrusions on the periphery of the elastic structural member are located outside of the semiconductor chip after the appending of the semiconductor chip, and it can be bonded substantially on the flat portion of the elastic structural material, whereby the warping of the wiring substrate is suppressed. Further, since a large coating area of adhesive can be provided, a not bonded portion caused by insufficient adhesive is less likely to occur, and the adhesive tends to extrude out uniformly around the periphery of the semiconductor chip, so that a package of excellent moisture proofness and reliability can be constituted with out applying an additional peripheral sealing.

(11) In a case of forming the elastic structural material as divided portions which are spaced so as to be not bonded on the external terminals of the semiconductor chip, when each end of the spaces at which the divided elastic structural materials are opposed is formed as a grooved shape, the metal mask bridge portion can be restricted to narrow the groove of the elastic structural material in the groove-fillage technique of the elastic structural material, so that the groove-fillage of the elastic structural material can be improved.

(12) If a plurality of grooves are formed at each of the ends of the elastic structural material, the strength of the groove-forming metal mask can be improved.

(13) When a stopping dam for sealant flow is previously formed at the grooves at each of the ends of the spaces at which the divided structural materials are opposed, the groove-fillage in the sealing step can further be improved.

(14) By previously forming stud bumps on the external terminals of the semiconductor chip and connecting the external terminals of the semiconductor chip and the wirings of the wiring substrate by way of the stud bumps, problems in the bondability and the possibility of damage can be solved in the inner lead bonding technique, whereby the bondability is improved by the stud bumps and, further, the possibility of damage can be prevented.

(15) By supplying the solder so as to previously surround the wirings of the wiring substrate and connecting the external terminals of the semiconductor chip and the external terminals of the wiring substrate by way of the solder, bondability can be improved and damage can be suppressed in the bonding technique.

(16) By using the stud bumps, for example, made of solder or Au so as to surround the wirings of the wiring substrate, and by connecting the wirings of the wiring substrate and the external terminals of the semiconductor chip by way of the stud bumps, the bondability can be improved and the possibility of damage can be suppressed in the bonding technique.

(17) By connecting the wirings of the wiring substrate and the external terminals of the semiconductor chip by using an Al, solder or Au wire, the problem, for example, of bondability or damage can be solved, and it is possible to attain connection by the concept of a typical wire bonding, not by the inner lead bonding, such as a TAB.

(18) By forming the lateral size of the wiring of the wiring substrate such that the size is gradually narrowed from the end of the substrate base material of the wiring substrate to the top end of the wiring and the lateral size is made constant from a predetermined position, and setting the size and the shape of the wiring such that the bending stress ratio $\alpha$ is from 1.2 to 1.5, since a suitable S-shaped configuration can be formed by merely driving down the bonding tool vertically with no return of the bonding tool, a lead of a stably shaped configuration can be formed without requiring a special soft-modified wire bonder; and, further, the contact time upon bonding can also be shortened since the trace of the bonding tool can be simplified.

(19) By using the electroconductive material as a core material for the wiring structure of the wiring substrate and applying only Au plating to the surface, since both the hardness and the brittleness of the lead are lowered as compared with a case of applying Ni-plating between the core material of the conductive material, such as Cu, and Au plating, cracks are less likely in the lead itself, and damage to the semiconductor chip at the counter bonding face can also be moderated.

(20) By forming the wirings on the rear face of the substrate base material of the wiring substrate, forming the insulation film on the rear face of the wirings and disposing the elastic structure material on the rear face of the insulation film, since a rear face wiring insulation film structure can be obtained, direct contact of the elastic structural material with the wiring can be prevented and contact of the elastic structural material to the roughened surface of the substrate base material can also be prevented, so that bleeding of the low molecular weight ingredients of the elastic structure material can be suppressed and, further, the uneven wiring surface can be flattened by coating the insulation film making it possible to avoid disadvantages, such as the creation of voids upon forming the elastic structural material.

(21) In the surface wiring structure, since the opening of the insulation film is formed by defining the coating range of the insulation film material, the fabrication accuracy for the hole diameter can further be improved as compared with a case of forming the opening by machining the substrate base material of the wiring substrate of the rear face wiring structure.

(22) By setting the thickness of the insulation film by determining the coating condition for the insulation film material in the surface wiring structure, since the film can be coated stably at a further reduced thickness and the bump land disposed at a higher density with a small diameter can be formed as compared with the substrate base material, a smaller bump electrode can be joined more satisfactorily.

(23) In the surface wiring structure, since the pitch for the arrangement of the bump electrodes can be reduced as compared with the rear face wiring structure, it is possible to constitute a semiconductor package having output terminals at higher density.

What is claimed is:

1. A method of manufacturing a semiconductor device comprising the steps of:
    preparing a semiconductor chip having a plurality of semiconductor elements and a plurality of external terminals formed in a main surface thereof;
    bonding an elastic layer, at a side thereof, to the main surface of the semiconductor chip, the elastic layer having another, opposing side adhered to a wiring substrate, the wiring substrate including an insulating tape and a plurality of leads formed on the insulating tape, each of the plurality of leads being electrically connected to a corresponding one of the external terminals; and
    cutting the elastic material together with the insulating tape along an entire circumference of the semiconductor chip.

2. A method of manufacturing a semiconductor device according to claim 1, wherein the elastic material is cut so that an outer periphery thereof protrudes beyond an outer periphery of the semiconductor chip.

3. A method of manufacturing a semiconductor device comprising the steps of:
    preparing a wiring substrate having an insulating tape and a plurality of leads, each of the leads having a first portion formed on a surface at a first side of the insulating tape and a second portion protruding beyond an edge of the insulating tape;
    preparing a film-shaped elastic layer and bonding a first side of the elastic layer to the wiring substrate;
    preparing a semiconductor chip having a plurality of semiconductor elements and a plurality of external terminals formed in a main surface thereof;
    bonding the elastic layer, which is bonded to the wiring substrate, to the main surface of the semiconductor chip, the bonding of the elastic layer to the main surface of the chip is at a second side of the elastic layer, opposite the first side thereof;
    effecting an electrical connection between the second portion of the plurality of leads and corresponding ones of the external terminals, respectively;
    encapsulating the second portion of the leads and the external terminals by a resin; and
    forming a plurality of bump electrodes on the first portion of the plurality of leads, respectively.

4. A method of manufacturing a semiconductor device according to claim 3, wherein the bonding of the elastic layer to the wiring substrate includes bonding the surface of the first side of the elastic layer to a surface of a second side of the insulating tape, opposite to that of the first side thereof.

5. A method of manufacturing a semiconductor device according to claim 3, wherein the bonding of the film-shaped elastic layer to the wiring substrate is such that the elastic layer is formed at a side of the leads, and bump electrodes are formed at a second side of the elastic tape, opposite that of the first side thereof.

6. A method of manufacturing a semiconductor device comprising the steps of:
    (a) preparing a wiring substrate having an insulating tape, a plurality of leads and a film-shaped elastic layer;
    (b) preparing a semiconductor chip having a plurality of semiconductor elements and a plurality of external terminals formed in a main surface thereof;
    (c) mounting the main surface of the semiconductor chip to the wiring substrate through the film-shaped elastic layer;
    (d) after the step (c), electrically connecting each of the leads with individual ones of the external terminals, respectively;
    (e) after the step (d), encapsulating the external terminals by resin; and
    (f) forming a plurality of bump electrodes on each of the first portion of the leads.

7. A method of manufacturing a semiconductor device according to claim 6, wherein the step (c) comprises the step of appending the film-shaped elastic layer to the main surface of the semiconductor chip by adhesion.

8. A method of manufacturing a semiconductor device according to claim 6,
    wherein each of the plurality of leads has a protruding portion extending beyond an edge of the wiring substrate, and
    wherein the step (c) comprises the step of aligning the protruding portion of each of the leads with corresponding ones of the plurality of external terminals.

9. A method of manufacturing a semiconductor device according to claim 8, wherein the step (c) comprises the step of appending the film-shaped elastic layer to the main surface of the semiconductor chip by adhesion.

10. A method of manufacturing a semiconductor device according to claim 6,
    wherein each of the plurality of leads has a protruding portion extending beyond an edge of the wiring substrate, and
    wherein the step (d) comprises the step of connecting the protruding portion of each of the leads to individual ones of the external terminals of the semiconductor chip.

11. A method of manufacturing a semiconductor device according to claim 10, wherein the step (c) comprises the step of appending the film-shaped elastic layer to the main surface of the semiconductor chip by adhesion.

12. A method of manufacturing a semiconductor device comprising the steps of:
    (a) preparing a structure having a semiconductor chip, a wiring substrate and an elastic layer, the semiconductor chip having a plurality of semiconductor elements and a plurality of external terminals formed on a main surface thereof, the wiring substrate including a plurality of wirings, the wiring substrate and the elastic layer protruding beyond an outer edge of the main surface of the semiconductor chip, and the elastic layer being positioned between the wiring substrate and the main surface of the semiconductor chip in a thickness direction of the semiconductor chip;

(b) electrically connecting the plurality of wirings with the plurality of external terminals, respectively; and (c) after the step (b), cutting the wiring substrate together with the elastic layer to form peripheral edges thereof, respectively, outside of the outer periphery of the semiconductor chip.

13. A method of manufacturing a semiconductor device according to claim 12, wherein the wiring substrate has an opening over the plurality of external terminals, the plurality of wirings including a plurality of leads, and wherein the step (b) includes the step of connecting the leads with the plurality of external terminals through the opening, respectively.

14. A method of manufacturing a semiconductor device according to claim 13, wherein, in step (c), the wiring substrate and the elastic layer are cut along a same cutting line.

15. A method of manufacturing according to claim 12, wherein, in step (c), the wiring substrate and the elastic layer are cut along a same cutting line.

* * * * *